US012614522B2

(12) United States Patent
Feng et al.

(10) Patent No.: US 12,614,522 B2
(45) Date of Patent: Apr. 28, 2026

(54) SHIFT REGISTER UNIT, GATE DRIVING CIRCUIT, AND GATE DRIVING METHOD

(71) Applicants: Hefei BOE Joint Technology Co., Ltd., Hefei (CN); BOE TECHNOLOGY GROUP CO., LTD., Beijing (CN)

(72) Inventors: Xuehuan Feng, Beijing (CN); Jingbo Xu, Beijing (CN); Xing Yao, Beijing (CN); Miao Liu, Beijing (CN)

(73) Assignees: Hefei BOE Joint Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 66 days.

(21) Appl. No.: 18/277,375

(22) PCT Filed: Jul. 25, 2022

(86) PCT No.: PCT/CN2022/107637
§ 371 (c)(1),
(2) Date: Aug. 15, 2023

(87) PCT Pub. No.: WO2024/020727
PCT Pub. Date: Feb. 1, 2024

(65) Prior Publication Data
US 2025/0006134 A1 Jan. 2, 2025

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2310/0286* (2013.01); *G09G 2310/061* (2013.01); *G09G 2310/08* (2013.01)

(58) Field of Classification Search
CPC .......... G09G 3/3266; G09G 2310/061; G09G 2310/08; G09G 2310/0286; G11C 19/28
See application file for complete search history.

(56) References Cited

U.S. PATENT DOCUMENTS 12,183,409 B2 * 12/2024 Liu ..................... G09G 3/3266
2021/0065603 A1 * 3/2021 Feng ..................... G11C 19/28
(Continued)

FOREIGN PATENT DOCUMENTS

CN 1971937 B 12/2012
CN 108806611 A * 11/2018 ........... G09G 3/3266
(Continued)

OTHER PUBLICATIONS

Machine translation of CN-113053447-A (Year: 2021).*

*Primary Examiner* — Xuemei Zheng
(74) *Attorney, Agent, or Firm* — HOUTTEMAN LAW LLC

(57) ABSTRACT

There is provided a shift register unit, including: a sensing control circuit configured to write an active level signal provided by a sensing active level supply terminal to a first sensing control node in response to an active level signal provided by the random signal input terminal and an active level signal provided by a sensing signal input terminal; a first sensing input circuit configured to write an active level signal to a first pull-up node in response to an active level signal at the first sensing control node and an active level signal provided by a clock control signal input terminal; and a first driving output circuit configured to write a signal provided by a first driving clock signal input terminal to a first driving signal output terminal in response to an active level signal at the first pull-up node. Gate driving circuit and method are further disclosed.

17 Claims, 31 Drawing Sheets

(56)　　　　　　References Cited

U.S. PATENT DOCUMENTS

| | | | |
|---|---|---|---|
| 2021/0201805 A1 | 7/2021 | Feng et al. | |
| 2021/0335198 A1* | 10/2021 | Feng ................... | G09G 3/3266 |
| 2021/0358366 A1* | 11/2021 | Feng ................... | G09G 3/3266 |
| 2022/0013060 A1* | 1/2022 | Feng ................... | G09G 3/2092 |

FOREIGN PATENT DOCUMENTS

| | | | | |
|---|---|---|---|---|
| CN | 109166527 | A | 1/2019 | |
| CN | 109935184 | A | 6/2019 | |
| CN | 109935199 | A | 6/2019 | |
| CN | 109935200 | A * | 6/2019 | .............. G09G 3/20 |
| CN | 109935269 | A | 6/2019 | |
| CN | 110517637 | A | 11/2019 | |
| CN | 111971737 | A | 11/2020 | |
| CN | 113053447 | A * | 6/2021 | .......... G09G 3/2092 |
| CN | 114241992 | A | 3/2022 | |
| CN | 114255698 | A | 3/2022 | |
| CN | 114299878 | A | 4/2022 | |
| CN | 114596817 | A | 6/2022 | |
| CN | 114677965 | A | 6/2022 | |
| KR | 20150006724 | A | 1/2015 | |
| KR | 20160077315 | A | 7/2016 | |
| KR | 20200030422 | A | 3/2020 | |
| WO | WO-2021032166 | A1 * | 2/2021 | .............. G09G 3/20 |

* cited by examiner

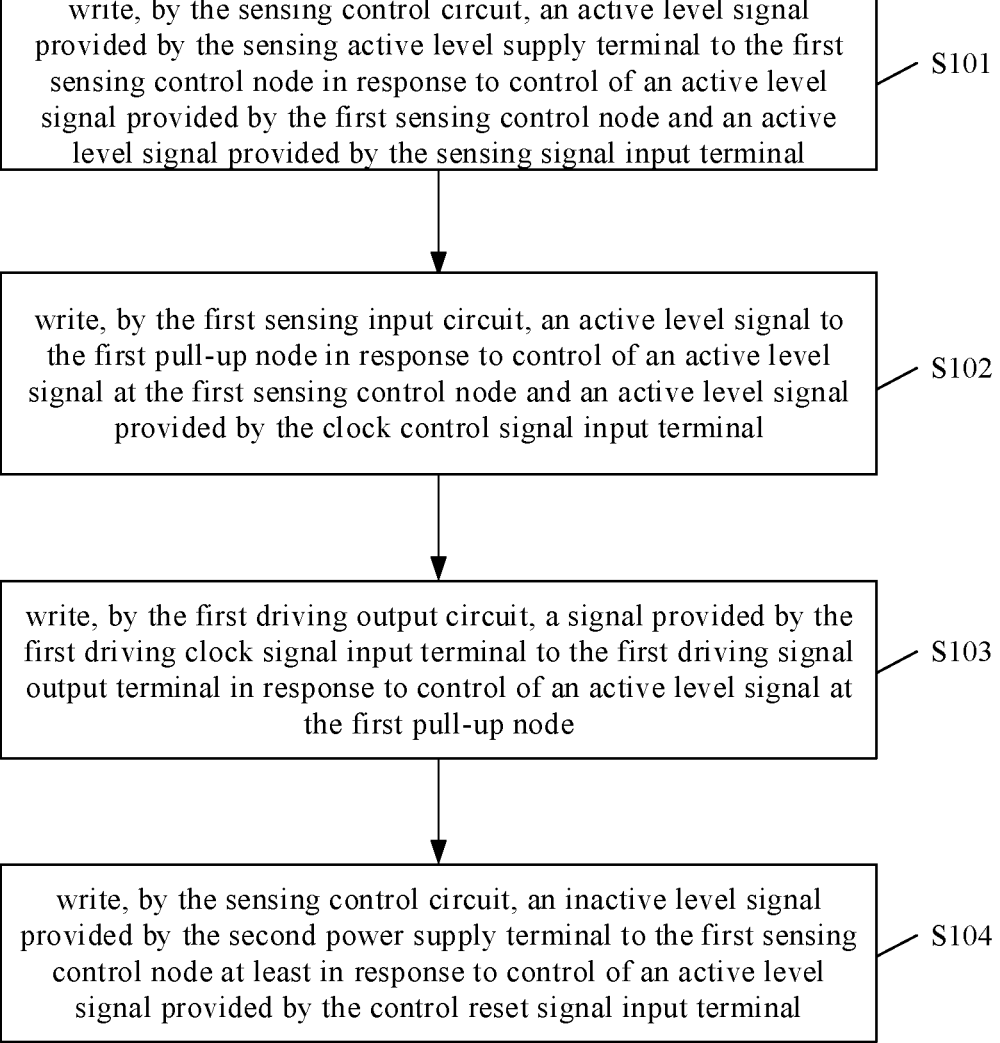

write, by the sensing control circuit, an active level signal provided by the sensing active level supply terminal to the first sensing control node in response to control of an active level signal provided by the first sensing control node and an active level signal provided by the sensing signal input terminal ⟋ S101 write, by the first sensing input circuit, an active level signal to the first pull-up node in response to control of an active level signal at the first sensing control node and an active level signal provided by the clock control signal input terminal ⟋ S102 write, by the first driving output circuit, a signal provided by the first driving clock signal input terminal to the first driving signal output terminal in response to control of an active level signal at the first pull-up node ⟋ S103 write, by the sensing control circuit, an inactive level signal provided by the second power supply terminal to the first sensing control node at least in response to control of an active level signal provided by the control reset signal input terminal ⟋ S104

FIG. 25

SHIFT REGISTER UNIT, GATE DRIVING CIRCUIT, AND GATE DRIVING METHOD

CROSS REFERENCE TO RELATED APPLICATION

This is a National Phase Application filed under 35 U.S.C. 371 as a national stage of PCT/CN2022/107637, filed on Jul. 25, 2022, the contents of which are hereby incorporated by reference in their entirety.

TECHNICAL FIELD

The present disclosure relates to the display field, and in particular, to a shift register unit, a gate driving circuit, and a gate driving method.

BACKGROUND

Active Matrix Organic Light Emitting Diode (AMOLED) panels have been applied more and more widely. A pixel display device in an AMOLED is an Organic Light-Emitting Diode (OLED), and the AMOLED can emit light by driving a thin film transistor to generate a driving current in a saturated state, and driving a light-emitting device by the driving current to emit light.

SUMMARY

In a first aspect, embodiments of the present disclosure provide a shift register unit, including:

a sensing control circuit connected to a first sensing control node, a sensing signal input terminal, a random signal input terminal, and a sensing active level supply terminal, and configured to write an active level signal provided by the sensing active level supply terminal to the first sensing control node in response to control of an active level signal provided by the first sensing control node and an active level signal provided by the sensing signal input terminal;

a first sensing input circuit connected to the first sensing control node, a clock control signal input terminal, and a first pull-up node, and configured to write an active level signal to the first pull-up node in response to control of an active level signal at the first sensing control node and an active level signal provided by the clock control signal input terminal; and a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node.

In some embodiments, the sensing control circuit includes:

a first control input circuit connected to the sensing active level supply terminal, a sensing control intermediate node, and a first control signal input terminal, and configured to write a signal provided by the sensing active level supply terminal to the sensing control intermediate node in response to control of an active level signal provided by the first control signal input terminal; and a second control input circuit connected to the sensing control intermediate node, the first sensing control node, and a second control signal input terminal, and configured to write a signal at the sensing control intermediate node to the first sensing control node in response to control of an active level signal provided by the second control signal input terminal; and one of the first control signal input terminal and the second control signal input terminal is the sensing signal input terminal, and the other is the random signal input terminal.

In some embodiments, the sensing control circuit is further connected to a control reset signal input terminal and a second power supply terminal, and is further configured to write an inactive level signal provided by the second power supply terminal to the first sensing control node at least in response to control of an active level signal provided by the control reset signal input terminal.

In some embodiments, the sensing control circuit further includes:

a control reset circuit connected to the second power supply terminal, the first sensing control node, and the control reset signal input terminal, and configured to write an inactive level signal provided by the second power supply terminal to the first sensing control node in response to control of an active level signal provided by the control reset signal input terminal.

In some embodiments, the control reset circuit includes: a sixth transistor; and a control electrode of the sixth transistor is connected to the control reset signal input terminal, a first electrode of the sixth transistor is connected to the first sensing control node, and a second electrode of the sixth transistor is connected to the second power supply terminal.

In some embodiments, the first control signal input terminal is the sensing signal input terminal, and the second control signal input terminal is the random signal input terminal;

the sensing control circuit is configured to write an inactive level signal provided by the second power supply terminal to the first sensing control node in response to control of an active level signal provided by the control reset signal input terminal and an active level signal provided by the random signal input terminal; and the sensing control circuit further includes:

a control reset circuit connected to the second power supply terminal, the sensing control intermediate node, and the control reset signal input terminal, and configured to write an inactive level signal provided by the second power supply terminal to the sensing control intermediate node in response to control of an active level signal provided by the control reset signal input terminal.

In some embodiments, the control reset circuit includes: a sixth transistor; and a control electrode of the sixth transistor is connected to the control reset signal input terminal, a first electrode of the sixth transistor is connected to the sensing control intermediate node, and a second electrode of the sixth transistor is connected to the second power supply terminal.

In some embodiments, the first control input circuit includes: a fourth transistor, and the second control input circuit includes: a first transistor;

a control electrode of the fourth transistor is connected to the first control signal input terminal, a first electrode of the fourth transistor is connected to the sensing active level supply terminal, and a second electrode of the fourth transistor is connected to the sensing control intermediate node; and a control electrode of the first transistor is connected to the second control signal input terminal, a first electrode of the first transistor is connected to the sensing control intermediate node, and a second electrode of the first transistor is connected to the first sensing control node.

In some embodiments, the shift register unit further includes:

a third voltage control circuit connected to the first sensing control node, the sensing control intermediate node, and a first power supply terminal, and configured to write an active level signal provided by the first power supply terminal to the sensing control intermediate node in response to control of an active level signal at the first sensing control node.

In some embodiments, the third voltage control circuit includes: a seventy-first transistor; and a control electrode of the seventy-first transistor is connected to the first sensing control node, a first electrode of the seventy-first transistor is connected to the first power supply terminal, and a second electrode of the seventy-first transistor is connected to the sensing control intermediate node.

In some embodiments, the sensing control circuit further includes: a control reset circuit connected to a second power supply terminal, the first sensing control node, and a control reset signal input terminal, and configured to write an inactive level signal provided by the second power supply terminal to the first sensing control node in response to control of an active level signal provided by the control reset signal input terminal;

the shift register unit further includes: a control reset anti-leakage circuit;

the control reset circuit is connected to the second power supply terminal through the control reset anti-leakage circuit, and is connected to the control reset anti-leakage circuit at a control reset anti-leakage node, and the control reset anti-leakage node is connected to the sensing control intermediate node; and the control reset anti-leakage circuit is further connected to the control reset signal input terminal, and is configured to form a path between the reset anti-leakage node and the second power supply terminal in response to control of an active level signal provided by the control reset signal input terminal, and cut off the path between the reset anti-leakage node and the second power supply terminal in response to control of an inactive level signal provided by the control reset signal input terminal.

In some embodiments, the control reset anti-leakage circuit includes: a seventy-second transistor; and a control electrode of the seventy-second transistor is connected to the control reset signal input terminal, a first electrode of the seventy-second transistor is connected to the reset anti-leakage node, and a second electrode of the seventy-second transistor is connected to the second power supply terminal.

In some embodiments, the shift register unit further includes:

a first voltage control circuit connected to a first power supply terminal, the first pull-up node, and a first voltage control node, and configured to write an active level signal provided by the first power supply terminal to the first voltage control node in response to control of an active level signal at the first pull-up node;

the shift register unit further includes: a first sensing input anti-leakage circuit; and the first sensing input circuit is connected to the first pull-up node through the first sensing input anti-leakage circuit, and is connected to the first sensing input anti-leakage circuit at a first sensing input anti-leakage node, the first sensing input anti-leakage node is connected to the first voltage control node, the first sensing input anti-leakage circuit is connected to the clock control signal input terminal, and the first sensing input anti-leakage circuit is configured to form a path between the first sensing input anti-leakage node and the first pull-up node in response to control of an active level signal at the clock control signal input terminal, and cut off the path between the first sensing input anti-leakage node and the first pull-up node in response to control of an inactive level signal at the clock control signal input terminal.

In some embodiments, the shift register unit further includes:

a first global reset circuit connected to a global reset signal input terminal, a second power supply terminal, and the first pull-up node, and configured to write an inactive level signal provided by the second power supply terminal to the first pull-up node in response to control of an active level signal provided by the global reset signal input terminal.

In some embodiments, in a case where the sensing control circuit is further connected to a control reset signal input terminal, the control reset signal input terminal and the global reset signal input terminal are a same signal terminal.

In some embodiments, the shift register unit further includes:

a first display input circuit connected to a display signal input terminal, a first power supply terminal, and the first pull-up node, and configured to write an active level signal provided by the first power supply terminal to the first pull-up node in response to control of an active level signal provided by the display signal input terminal;

a first display reset circuit connected to a display reset signal input terminal, the second power supply terminal, and the first pull-up node, and configured to write an inactive level signal provided by the second power supply terminal to the first pull-up node in response to control of an active level signal provided by the display reset signal input terminal; and a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node.

In some embodiments, the sensing signal input terminal and the first cascade signal output terminal are a same signal terminal.

In some embodiments, the shift register unit further includes:

a second driving output circuit connected to the first pull-up node, a second driving clock signal input terminal, and a second driving signal output terminal, and configured to write a signal provided by the second driving clock signal input terminal to the second driving signal output terminal in response to control of an active level signal at the first pull-up node.

In some embodiments, the shift register unit further includes:

a first pull-down control circuit connected to the second power supply terminal, a fifth power supply terminal, the first pull-up node, and a first pull-down node, and configured to write a voltage having a phase opposite to that of a voltage at the first pull-up node to the first pull-down node; and a first pull-up noise reduction circuit connected to the second power supply terminal, the first pull-up node, and the first pull-down node, and configured to write an inactive level signal provided by the second power supply terminal to the first pull-up node in response to control of an active level signal at the first pull-down node;

the first cascade output circuit is further connected to the first pull-down node and the second power supply terminal, and is further configured to write an inactive level signal provided by the second power supply terminal to the first cascade signal output terminal in response to control of an active level signal at the first pull-down node;

the first driving output circuit is further connected to the first pull-down node and a fourth power supply terminal, and is further configured to write an inactive level signal provided by the fourth power supply terminal to the first driving signal output terminal in response to control of an active level signal at the first pull-down node; and the second driving output circuit is further connected to the first pull-down node and the fourth power supply terminal, and is further configured to write an inactive level signal provided by the fourth power supply terminal to the second driving signal output terminal in response to control of an active level signal at the first pull-down node.

In some embodiments, the shift register unit further includes:

a first voltage control circuit connected to a first power supply terminal, the first pull-up node, and a first voltage control node, and configured to write an active level signal provided by the first power supply terminal to the first voltage control node in response to control of an active level signal at the first pull-up node;

the shift register unit further includes: at least one of a first anti-leakage circuit, a second anti-leakage circuit, and a third anti-leakage circuit;

the first global reset circuit is connected to the second power supply terminal through the first anti-leakage circuit, and is connected to the first anti-leakage circuit at a first anti-leakage node, the first anti-leakage node is connected to the first voltage control node, the first anti-leakage circuit is connected to the global reset signal input terminal, and the first anti-leakage circuit is configured to form a path between the first anti-leakage node and the second power supply terminal in response to control of an active level signal provided by the global reset signal input terminal, and cut off the path between the first anti-leakage node and the second power supply terminal in response to control of an inactive level signal provided by the global reset signal input terminal;

the first display reset circuit is connected to the second power supply terminal through the second anti-leakage circuit, and is connected to the second anti-leakage circuit at a second anti-leakage node, the second anti-leakage node is connected to the first voltage control node, the second anti-leakage circuit is connected to the display reset signal input terminal, and the second anti-leakage circuit is configured to form a path between the second anti-leakage node and the second power supply terminal in response to control of an active level signal provided by the display reset signal input terminal, and cut off the path between the second anti-leakage node and the second power supply terminal in response to control of an inactive level signal provided by the display reset signal input terminal; and the first pull-up noise reduction circuit is connected to the second power supply terminal through the third anti-leakage circuit, and is connected to the third anti-leakage circuit at a third anti-leakage node, the third anti-leakage node is connected to the first voltage control node, the third anti-leakage circuit is connected to the first pull-down node, and the third anti-leakage circuit is configured to form a path between the third anti-leakage node and the second power supply terminal in response to control of an active level signal at the first pull-down node, and cut off the path between the third anti-leakage node and the second power supply terminal in response to control of an inactive level signal at the first pull-down node.

In some embodiments, the shift register unit further includes: a first capacitor; and a first terminal of the first capacitor is connected to the first sensing control node, and a second terminal of the first capacitor is connected to a third power supply terminal.

In some embodiments, the first sensing input circuit includes:

a first input response circuit connected to an input active level supply terminal, the first sensing control node, and a sensing input intermediate node, and configured to write a signal provided by the input active level supply terminal to the sensing input intermediate node in response to control of an active level signal at the first sensing control node; and a second input response circuit connected to the sensing input intermediate node, the clock control signal input terminal, and the first pull-up node, and configured to write a voltage at the sensing input intermediate node to the first pull-up node in response to control of an active level signal provided by the clock control signal input terminal; the shift register unit further includes:

a second sensing input circuit connected to the sensing input intermediate node, the clock control signal input terminal, and a second pull-up node, and configured to write a voltage at the sensing input intermediate node to the second pull-up node in response to control of an active level signal provided by the clock control signal input terminal; and a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node.

In some embodiments, the second sensing input circuit includes: an eighty-first transistor; and a control electrode of the eighty-first transistor is connected to the clock control signal input terminal, a first electrode of the eighty-first transistor is connected to the sensing input intermediate node, and a second electrode of the eighty-first transistor is connected to the second pull-up node.

In some embodiments, the shift register unit further includes:

a second sensing input circuit connected to a second sensing control node, the clock control signal input terminal, and a second pull-up node, and configured to write an active level signal to the second pull-up node in response to control of an active level signal at the second sensing control node and an active level signal provided by the clock control signal input terminal, the second sensing control node being connected to the first sensing control node; and a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node.

In some embodiments, the second sensing input circuit includes: an eighty-first transistor and an eighty-second transistor;

a control electrode of the eighty-first transistor is connected to the clock control signal input terminal, a first electrode of the eighty-first transistor is connected to a second electrode of the eighty-second transistor, and a second electrode of the eighty-first transistor is connected to the second pull-up node; and a control electrode of the eighty-second transistor is connected to the second sensing control node, and a first electrode of the eighty-second transistor is connected to an input active level supply terminal.

In some embodiments, the sensing control circuit includes:

a first control input circuit connected to the sensing active level supply terminal, a sensing control intermediate node, and a first control signal input terminal, and configured to write a signal provided by the sensing active level supply terminal to the sensing control intermediate node in response to control of an active level signal provided by the first control signal input terminal; and a second control input circuit connected to the sensing control intermediate node, the first sensing control node, and a second control signal input terminal, and configured to write a signal at the sensing control intermediate node to the first sensing control node in response to control of an active level signal provided by the second control signal input terminal;

the first control signal input terminal is the sensing signal input terminal, and the second control signal input terminal is the random signal input terminal;

the shift register unit further includes:

a third control input circuit connected to the sensing control intermediate node, a second sensing control node, and the random signal input terminal, and configured to write a signal at the sensing control intermediate node to the second sensing control node in response to control of an active level signal provided by the random signal input terminal;

a second sensing input circuit connected to the second sensing control node, the clock control signal input terminal, and a second pull-up node, and configured to write an active level signal to the second pull-up node in response to control of an active level signal at the second sensing control node and an active level signal provided by the clock control signal input terminal, the second sensing control node being connected to the first sensing control node; and a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node;

the sensing control circuit further includes:

a control reset circuit connected to a second power supply terminal, a preset node, and a control reset signal input terminal, and configured to write an inactive level signal provided by the second power supply terminal to the preset node in response to the control of an active level signal provided by the control reset signal input terminal; and the preset node is one of the sensing control intermediate node, the first sensing control node, and the second sensing control node.

In some embodiments, the second sensing input circuit includes: an eighty-first transistor and an eighty-second transistor;

a control electrode of the eighty-first transistor is connected to the clock control signal input terminal, a first electrode of the eighty-first transistor is connected to a second electrode of the eighty-second transistor, and a second electrode of the eighty-first transistor is connected to the second pull-up node; and a control electrode of the eighty-second transistor is connected to the second sensing control node, and a first electrode of the eighty-second transistor is connected to an input active level supply terminal;

the third control input circuit includes: an eighty-third transistor; and a control electrode of the eighty-third transistor is connected to the random signal input terminal, a first electrode of the eighty-third transistor is connected to the sensing control intermediate node, and a second electrode of the eighty-third transistor is connected to the second sensing control node.

In some embodiments, the shift register unit further includes:

a second voltage control circuit connected to a first power supply terminal, the second pull-up node, and a second voltage control node, and configured to write an active level signal provided by the first power supply terminal to the second voltage control node in response to control of an active level signal at the second pull-up node;

the shift register unit further includes: a second sensing input anti-leakage circuit; and the second sensing input circuit is connected to the second pull-up node through the second sensing input anti-leakage circuit, and is connected to the second sensing input anti-leakage circuit at a second sensing input anti-leakage node, the second sensing input anti-leakage node is connected to the second voltage control node, the second sensing input anti-leakage circuit is connected to the clock control signal input terminal, and the second sensing input anti-leakage circuit is configured to form a path between the second sensing input anti-leakage node and the second pull-up node in response to control of an active level signal at the clock control signal input terminal, and cut off the path between the second sensing input anti-leakage node and the second pull-up node in response to control of an inactive level signal at the clock control signal input terminal.

In some embodiments, the shift register unit further includes:

a second display input circuit connected to a display signal input terminal and the second pull-up node, and configured to write an active level signal to the second pull-up node in response to control of an active level signal provided by the display signal input terminal;

a second display reset circuit connected to a display reset signal input terminal, a second power supply terminal, and the second pull-up node, and configured to write an inactive level signal provided by the second power supply terminal to the second pull-up node in response to control of an active level signal provided by the display reset signal input terminal; and a fourth driving output circuit connected to the second pull-up node, a fourth driving clock signal input terminal, and a fourth driving signal output terminal, and configured to write a signal provided by the fourth driving clock signal input terminal to the fourth driving signal output terminal in response to control of an active level signal at the second pull-up node.

In some embodiments, the shift register unit further includes:

a second global reset circuit connected to a global reset signal input terminal, the second power supply terminal, and the second pull-up node, and configured to write an inactive level signal provided by the second power supply terminal to the second pull-up node in response to control of an active level signal provided by the global reset signal input terminal;

a second pull-down control circuit connected to the second power supply terminal, a sixth power supply terminal, the second pull-up node, and a second pull-down node, and configured to write a voltage having a phase opposite to that of a voltage at the second pull-up node to the second pull-down node; and a second pull-up noise reduction circuit connected to the second power supply terminal, the second pull-up node, and the second pull-down node, and configured to write an inactive level signal provided by the second power supply terminal to the second pull-up node in response to control of an active level signal at the second pull-down node.

In some embodiments, the shift register unit further includes:

a second voltage control circuit connected to a third power supply terminal, the second pull-up node, and a second voltage control node, and configured to write an active level signal provided by the active level supply terminal to the second voltage control node in response to control of an active level signal at the second pull-up node;

the shift register unit further includes: at least one of a fourth anti-leakage circuit, a fifth anti-leakage circuit, and a sixth anti-leakage circuit;

the second global reset circuit is connected to the second power supply terminal through the fourth anti-leakage circuit, and is connected to the fourth anti-leakage circuit at a fourth anti-leakage node, the fourth anti-leakage node is connected to the second voltage control node, the fourth anti-leakage circuit is connected to the global reset signal input terminal, and the fourth anti-leakage circuit is configured to form a path between the fourth anti-leakage node and the second power supply terminal in response to control of an active level signal provided by the global reset signal input terminal, and cut off the path between the fourth anti-leakage node and the second power supply terminal in response to control of an inactive level signal provided by the global reset signal input terminal;

the second display reset circuit is connected to the second power supply terminal through the fifth anti-leakage circuit, and is connected to the fifth anti-leakage circuit at a fifth anti-leakage node, the fifth anti-leakage node is connected to the second voltage control node, the fifth anti-leakage circuit is connected to the display reset signal input terminal, and the fifth anti-leakage circuit is configured to form a path between the fifth anti-leakage node and the second power supply terminal in response to control of an active level signal provided by the display reset signal input terminal, and cut off the path between the fifth anti-leakage node and the second power supply terminal in response to control of an inactive level signal provided by the display reset signal input terminal; and the second pull-up noise reduction circuit is connected to the second power supply terminal through the sixth anti-leakage circuit, and is connected to the sixth anti-leakage circuit at a sixth anti-leakage node, the sixth anti-leakage node is connected to the second voltage control node, the sixth anti-leakage circuit is connected to the second pull-down node, and the sixth anti-leakage circuit is configured to form a path between the sixth anti-leakage node and the second power supply terminal in response to control of an active level signal at the second pull-down node, and cut off the path between the sixth anti-leakage node and the second power supply terminal in response to control of an inactive level signal at the second pull-down node.

In a second aspect, the embodiments of the present disclosure further provide a gate driving circuit, including: a plurality of shift register units that are cascaded, and each of the plurality of shift register units is the shift register unit provided in the first aspect.

In some embodiments, except shift register units in first a stages, the sensing active level supply terminal of any one shift register unit is connected to the first pull-up node in one shift register unit located a stages before the any one shift register unit: or except shift register units in last a stages, the sensing active level supply terminal of any one shift register unit is connected to the first pull-up node in one shift register unit located a stages after the any one shift register unit;

where a is a positive integer.

In a third aspect, the embodiments of the present disclosure further provide a gate driving method based on the shift register unit provided in the first aspect, including: writing, by the sensing control circuit, an active level signal provided by the sensing active level supply terminal to the first sensing control node in response to control of an active level signal provided by the first sensing control node and an active level signal provided by the sensing signal input terminal;

writing, by the first sensing input circuit, an active level signal to the first pull-up node in response to control of an active level signal at the first sensing control node and an active level signal provided by the clock control signal input terminal; and writing, by the first driving output circuit, a signal provided by the first driving clock signal input terminal to the first driving signal output terminal in response to control of an active level signal at the first pull-up node.

In some embodiments, after writing, by the first driving output circuit, the signal provided by the first driving clock signal input terminal to the first driving signal output terminal in response to control of the active level signal at the first pull-up node, the gate driving method further includes:

writing, by the sensing control circuit, an inactive level signal provided by the second power supply terminal to the first sensing control node at least in response to control of an active level signal provided by the control reset signal input terminal.

BRIEF DESCRIPTION OF DRAWINGS

FIG. 25 is a flowchart illustrating a gate driving method according to the embodiments of the present disclosure.

DETAIL DESCRIPTION OF EMBODIMENTS

Figure 1:
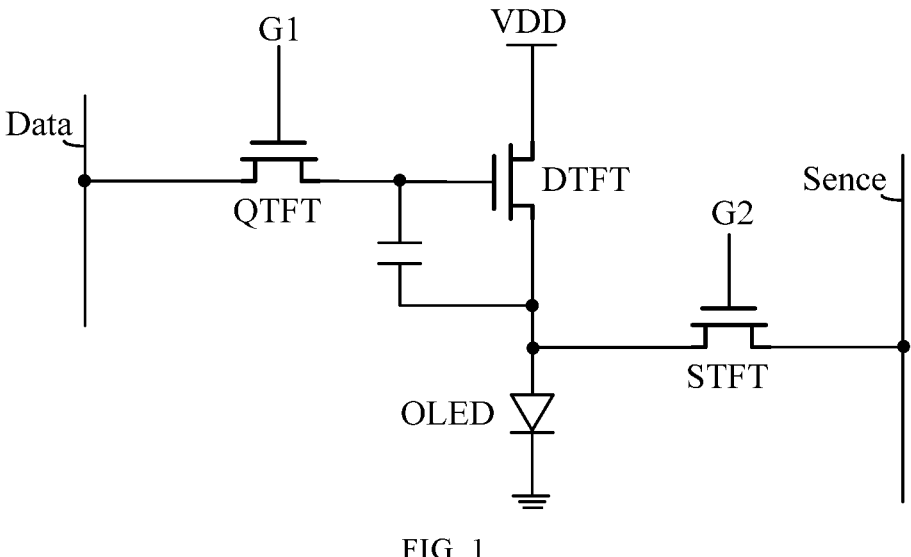
FIG. 1 is a schematic diagram showing a circuit structure of a pixel circuit in an OLED display panel.

In order to enable those of ordinary skill in the art to better understand the technical solutions of the present disclosure, a shift register unit, a gate driving circuit, and a gate driving method are described in detail below with reference to the drawings.

The words "first", "second" and the like used in the embodiments of the present disclosure do not denote any order, quantity or importance, but are just used to distinguish between different elements. Similarly, the words "include", "comprise" and the like indicate that an element or object before the words covers elements or objects listed after the words or the equivalents thereof, but do not exclude other elements or objects. The words "couple", "connect", and the like are not restricted to physical or mechanical connection, but may also include electrical connection, whether direct or indirect.

The transistors adopted in the embodiments of the present disclosure may all be thin film transistors or field effect transistors or other devices having the same characteristics. In the embodiments, a coupling mode of a drain electrode and a coupling mode of a source electrode of each transistor are interchangeable, thus there is actually no difference between the drain electrode and the source electrode of each transistor in the embodiments of the present disclosure. In the present disclosure, only for distinguishing between two electrodes other than a control electrode (i.e., a gate electrode) of a transistor, one of the two electrodes is referred to as a drain electrode, and the other is referred to as a source electrode. The thin film transistors adopted in the embodiments of the present disclosure may be N-type transistors or P-type transistors. In the embodiments of the present disclosure, when an N-type thin film transistor is adopted, the first electrode thereof may be a source electrode, and the second electrode thereof may be a drain electrode. A case where the thin film transistors are the N-type transistors is taken as an example for illustration in the following embodiments.

In the present disclosure, an "active level signal" refers to a signal capable of controlling a transistor to be turned on after being input to a control electrode of the transistor, and an "inactive level signal" refers to a signal capable of controlling the transistor to be turned off after being input to the control electrode thereof. For an N-type transistor, a high level signal is an active level signal, and a low level signal is an inactive level signal; and for a P-type transistor, a low level signal is an active level signal, and a high level signal is an inactive level signal.

The case where the transistors are N-type transistors is taken as an example for illustration in the following description. In such case, the active level signal refers to a high level signal, and the inactive level signal refers to a low level signal. It should be envisaged that timing of control signals needs to be adjusted accordingly when the P-type transistors are adopted. Specific details are not described herein, but should also fall within the scope of the present disclosure.

Figure 2:
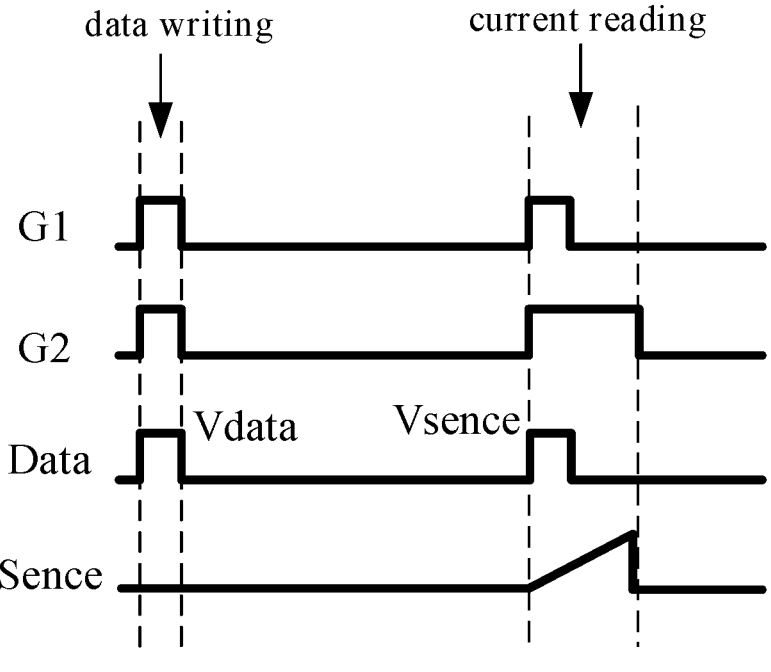
FIG. 2 is an operating timing diagram of the pixel circuit shown in FIG. 1.

FIG. 1 is a schematic diagram showing a circuit structure of a pixel circuit in an OLED display panel, and FIG. 2 is an operating timing diagram of the pixel circuit shown in FIG. 1. As shown in FIG. 1 and FIG. 2, for an OLED display panel with an external compensation function, one frame of image can be divided to two phases: a display driving phase and a sensing phase. In the display driving phase, each row of pixel units in the display panel completes display driving; and in the sensing phase, a certain row of pixel units in the display panel completes current extraction (i.e., sensing).

With reference to FIG. 1, the pixel circuit includes a display switching transistor QTFT (having a control electrode connected to a first gate line G1), a driving transistor DTFT, a sensing switching transistor STFT (having a control electrode connected to a second gate line G2), and a storage capacitor Cst. When external compensation needs to be performed on the pixel circuit, the pixel circuit includes at least the following two phases in an operating process: a pixel driving phase (including a data voltage writing process) and a pixel sensing phase (including a current reading process).

In the pixel driving phase, a data voltage Vdata in a data line Data needs to be written to a pixel unit; and in the pixel sensing phase, a test voltage Vsence needs to be written to the pixel unit through the data line Data, and an electrical signal at a drain electrode of the driving transistor needs to be read and input to a signal reading line Sence through the sensing switching transistor STFT. In the current reading process, an active level voltage needs to be written to a gate electrode of the sensing switching transistor STFT through the corresponding second gate line G2. It should be noted that a specific compensation process and principle of the external compensation performed on the pixel unit in the OLED display panel are not described in detail herein.

For the second gate line G2 configured to control the sensing switching transistor STFT, a corresponding gate driving circuit is disposed at a peripheral region of the display panel, and the gate driving circuit includes a plurality of shift register units that are cascaded, and a driving signal can be provided for a corresponding second gate line G2 through a shift register unit.

Figure 3:
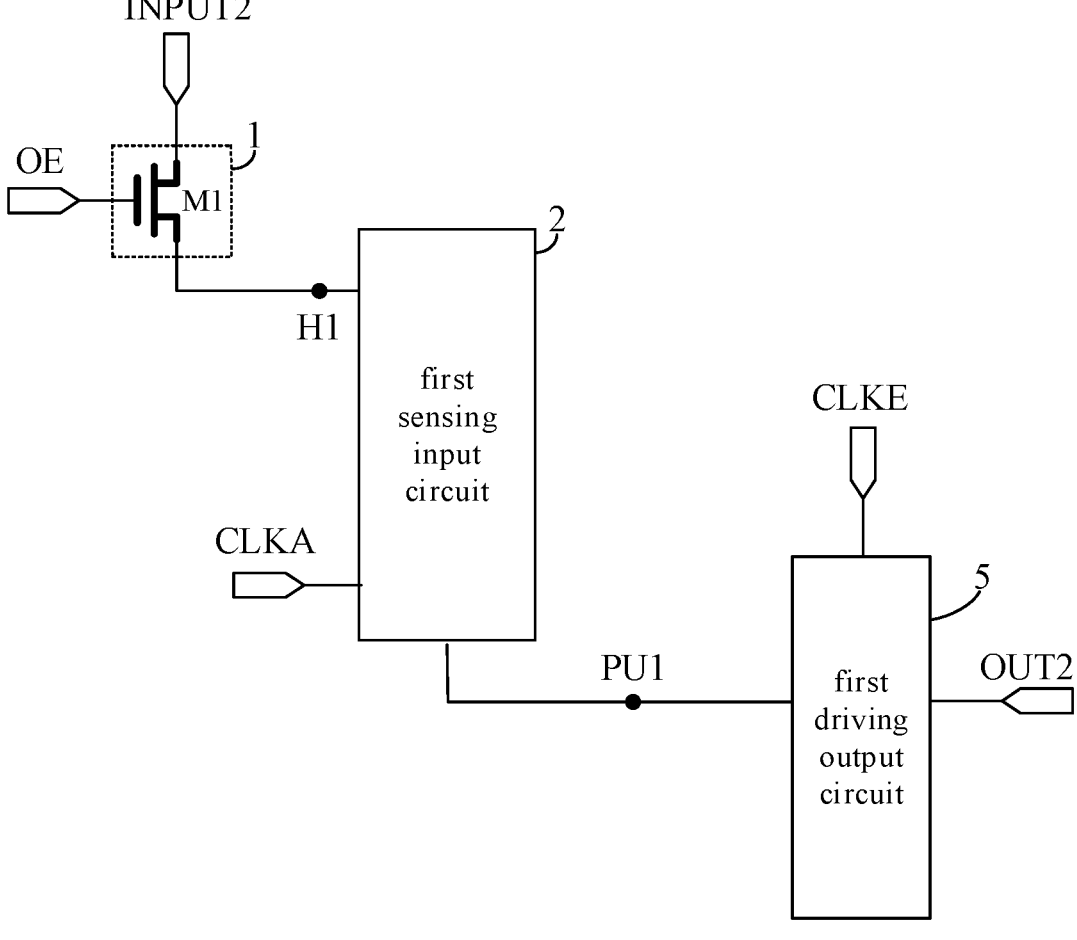
FIG. 3 is a schematic diagram showing a circuit structure of a shift register unit in the related art.

FIG. 3 is a schematic diagram showing a circuit structure of a shift register unit in the related art. As shown in FIG. 3, the shift register unit includes: a sensing control circuit 1, a first sensing input circuit 2, and a first driving output circuit 5. The sensing control circuit 1 is configured to control a voltage at a first sensing control node H1: the first sensing input circuit 2 writes an active level signal to a first pull-up node PU1 in response to control of an active level signal at the first sensing control node H1 and an active level signal provided by a clock control signal terminal CLKA; and the first driving output circuit 5 writes a signal provided by a first driving clock signal input terminal CLKE to a first driving signal output terminal OUT2 in response to control of an active level signal at the first pull-up node.

The sensing control circuit 1 includes a first transistor M1, a control electrode of the first transistor M1 is connected to a random signal input terminal OE, a first electrode of the first transistor M1 is connected to a sensing signal input terminal INPUT2, and a second electrode of the first transistor M1 is connected to the first sensing control node H1.

An operating process of the shift register unit includes a process of writing an active level signal to the first sensing control node H1 to charge the first sensing control node H1, and a process of writing an inactive level signal to the first sensing control node to reset the first sensing control node. In a very long time interval after writing the active level signal to the first sensing control node H1 and before resetting the first sensing control node H1, the first sensing control node H1 is in an active level state and in a floating state, at this time, due to a simple internal structure of the sensing control circuit 1 (only including the first transistor), a voltage at the first sensing control node H1 is very likely to leak through the sensing control circuit 1 and the sensing signal input terminal INPUT2, so that the voltage at the first sensing control node H1 is shifted toward an inactive level state. Once the leakage is too serious, the voltage at the first sensing control node H1 is shifted to the inactive level state, which causes abnormal operation of the shift register unit.

Thus, how to effectively alleviate the problem that the voltage at the first sensing control node H1 leaks through the sensing control circuit 1 is an urgent technical problem to be solved in the art.

In order to effectively solve the technical problem of electric leakage of the first sensing control node through the sensing control circuit, the present disclosure provides a new shift register unit. The technical solutions of the present disclosure will be exemplarily described below with reference to the drawings and embodiments.

Figure 4:
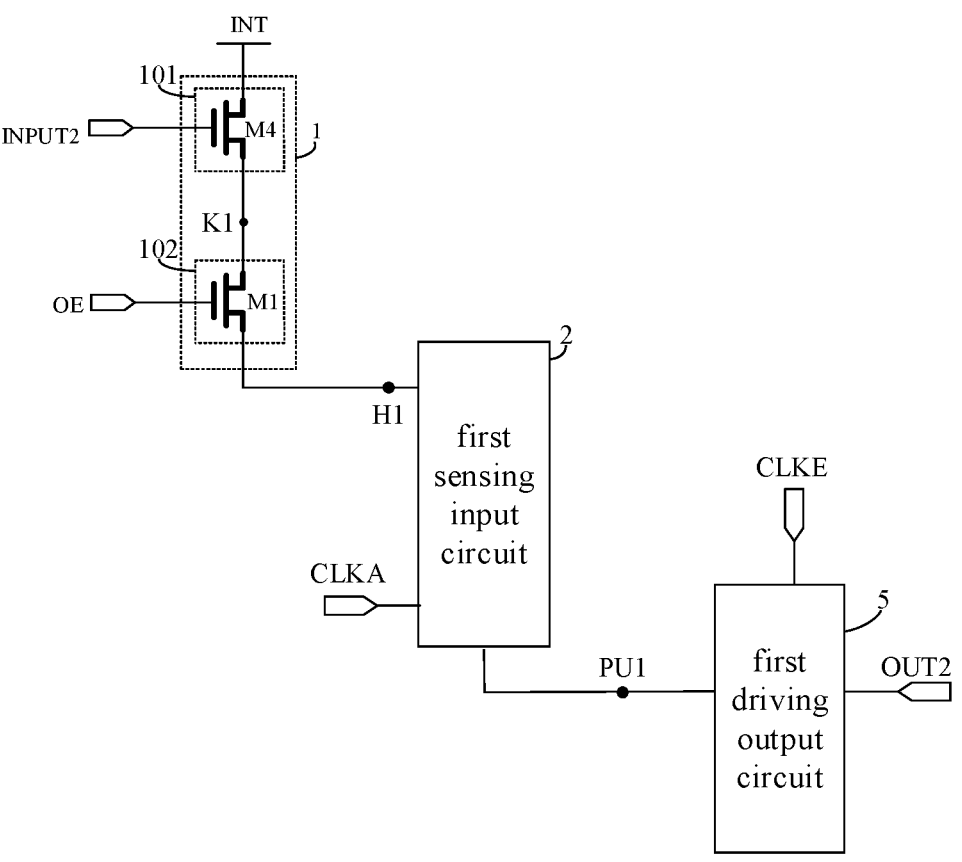
FIG. 4 is a schematic diagram showing a circuit structure of a shift register unit according to the embodiments of the present disclosure.

FIG. 4 is a schematic diagram showing a circuit structure of a shift register unit according to the embodiments of the present disclosure. As shown in FIG. 4, the shift register unit includes: a sensing control circuit 1, a first sensing input circuit 2, and a first driving output circuit 5.

The sensing control circuit 1 is connected to a first sensing control node H1, a sensing signal input terminal INPUT2, a random signal input terminal OE, and a sensing active level supply terminal INT, and is configured to write an active level signal provided by the sensing active level supply terminal INT to the first sensing control node H1 in response to control of an active level signal provided by the first sensing control node H1 and an active level signal provided by the sensing signal input terminal INPUT2.

The first sensing input circuit 2 is connected to the first sensing control node H1, a clock control signal input terminal CLKA, and a first pull-up node PU1, and is configured to write an active level signal to the first pull-up node PU1 in response to control of an active level signal at the first sensing control node H1 and an active level signal provided by the clock control signal input terminal.

The first driving output circuit 5 is connected to the first pull-up node PU1, a first driving clock signal input terminal CLKE, and a first driving signal output terminal OUT2, and is configured to write a signal provided by the first driving clock signal input terminal CLKE to the first driving signal output terminal OUT2 in response to control of an active level signal at the first pull-up node PU1.

Unlike the case in the related art where the sensing control circuit 1 is controlled only by the random signal input terminal OE, in the embodiments of the present disclosure, the sensing control circuit 1 is controlled by the sensing signal input terminal INPUT2 and the random signal input terminal OE at the same time. Thus, the number of transistors in the sensing control circuit 1 and connected in series between the sensing active level supply terminal INT and the first sensing control node H1 in the present disclosure is necessarily greater than the number of transistors connected in series between the sensing signal input terminal INPUT2 and the first sensing control node H1 in the related art, and a risk of an electric leakage of the first sensing control node through the sensing control circuit in the present disclosure is less than that of the electric leakage of the first sensing control node through the sensing control circuit in the related art. Moreover, in the present disclosure, even if the electric leakage of the first sensing control node occurs through the sensing control circuit, a leakage current such generated is smaller than that generated in the related art.

Thus, the technical solutions of the present disclosure can effectively alleviate the problem that the electric leakage of the first sensing control node occurs through the sensing control circuit.

In some embodiments, the sensing control circuit 1 includes: a first control input circuit 101 and a second control input circuit 102.

The first control input circuit 101 is connected to the sensing active level supply terminal INT, a sensing control intermediate node K1, and a first control signal input terminal, and is configured to write a signal provided by the sensing active level supply terminal INT to the sensing control intermediate node K1 in response to control of an active level signal provided by the first control signal input terminal.

The second control input circuit 102 is connected to the sensing control intermediate node K1, the first sensing control node H1, and a second control signal input terminal, and is configured to write a signal at the sensing control intermediate node K1 to the first sensing control node H1 in response to control of an active level signal provided by the second control signal input terminal.

One of the first control signal input terminal and the second control signal input terminal is the sensing signal input terminal INPUT2, and the other is the random signal input terminal OE.

In some embodiments, the sensing control circuit 1 is further connected to a control reset signal input terminal H-RST and a second power supply terminal, and is further configured to write an inactive level signal provided by the second power supply terminal to the first sensing control node H1 at least in response to control of an active level signal provided by the control reset signal input terminal H-RST.

That is, the sensing control circuit 1 can charge and reset the first sensing control node H1 through two different branches respectively in the present disclosure. One branch charges the first sensing control node H1 in response to control of the sensing signal input terminal INPUT2 and the random signal input terminal OE, and the other branch resets the first sensing control node H1 at least in response to control of the control reset signal input terminal H-RST.

Still with reference to FIG. 3, in the sensing control circuit 1 provided in the related art, when the first sensing control node H1 needs to be charged, the first transistor M1 may be controlled to be turned on and the sensing signal input terminal INPUT2 may be caused to provide an active level signal; and when the first sensing control node H1 needs to be reset, the first transistor M1 may be controlled to be turned on and the sensing signal input terminal INPUT2 may be caused to provide an inactive level signal. As can be seen, both the charging and the reset of the first sensing control node H1 by the sensing control circuit 1 in the shift register unit in the related art depend on the signal provided by the sensing signal input terminal INPUT2, which proposes a relatively high timing requirement for the sensing signal input terminal INPUT2. According to the timing requirement of the sensing signal input terminal INPUT2, a cascade signal output terminal of a certain shift register unit located c (c is a positive integer) stage(s) before or after a shift register unit in a current stage is generally selected as the sensing signal input terminal of the shift register unit in the current stage in the related art. However, it is found in practical applications that, due to a poor output capability of the cascade signal output terminal of the shift register unit, a problem of a relatively slow charging/discharging speed may occur in the solution of the related art when a signal output from the cascade signal output terminal of the shift register unit located a stage(s) before or after the shift register unit in the current stage is used to charge or reset the first sensing control node H1 of the shift register unit in the current stage.

Unlike the case in the related art where the first sensing control node H1 is charged or reset using the signal provided by the sensing signal input terminal INPUT2, in the embodiments of the present disclosure, the sensing control circuit 1 charges the first sensing control node H1 using the signal provided by the sensing active level supply terminal INT in response to the control of the sensing signal input terminal INPUT2 and the random signal input terminal OE, and moreover, the sensing control circuit 1 resets the first sensing control node H1 using a voltage provided by the second power supply terminal in response to the control of the signal provided by the control reset signal input terminal H-RST. That is, the sensing control circuit 1 uses the sensing active level supply terminal INT and the second power supply terminal to charge and reset the first sensing control node H1, respectively.

In the embodiments of the present disclosure, since the signal provided by the sensing active level supply terminal INT is only used for the charging of the first sensing control node H1, but not for the reset of the first sensing control node H1, a timing requirement for the sensing active level supply terminal INT is relatively low. In this case, a terminal with a relatively strong output capability may be selected as the sensing active level supply terminal INT, for example, the sensing active level supply terminal INT may be a power supply terminal which continuously provides an active level voltage, or a first pull-up node PU1 in a shift register unit in another stage (e.g., the shift register unit in the previous stage or the next stage), so that the sensing control circuit 1 can quickly charge the first sensing control node H1. In the embodiments of the present disclosure, it only needs to be ensured that the sensing active level supply terminal INT can supply an active level signal when both the sensing signal input terminal INPUT2 and the random signal input terminal OE supply the active level signals.

In addition, in the embodiments of the present disclosure, the first sensing control node H1 is reset using an inactive level signal provided by the second power supply terminal. Since the second power supply terminal has a relatively strong output capability, the sensing control circuit 1 can quickly reset the first sensing control node H1.

Thus, compared to the sensing control circuit 1 in the shift register unit in the related art, the sensing control circuit 1 in the shift register unit provided by the embodiments of the present disclosure can quickly charge and reset the first sensing control node H1. That is, the sensing control circuit 1 in the shift register unit provided by the embodiments of the present disclosure has a strong capability of inputting a signal to the first sensing control node H1, which is beneficial to improving operation stability of the shift register unit.

Figure 5A:
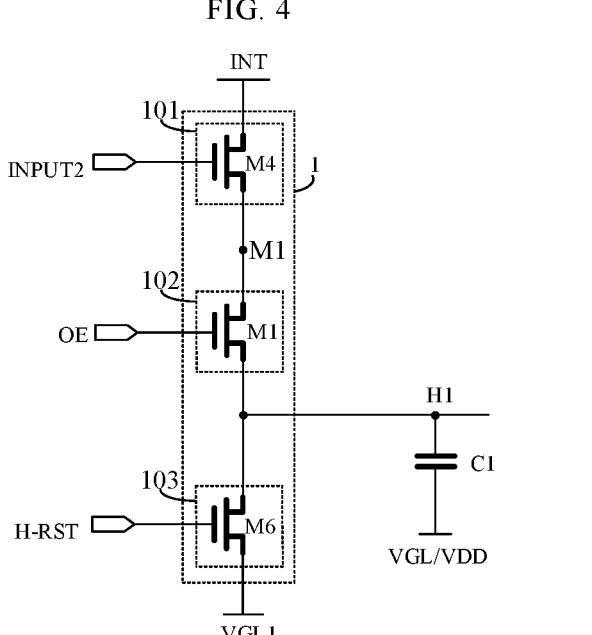
FIG. 5A is a schematic diagram showing a circuit structure of a sensing control circuit according to the embodiments of the present disclosure.
Figure 5B:
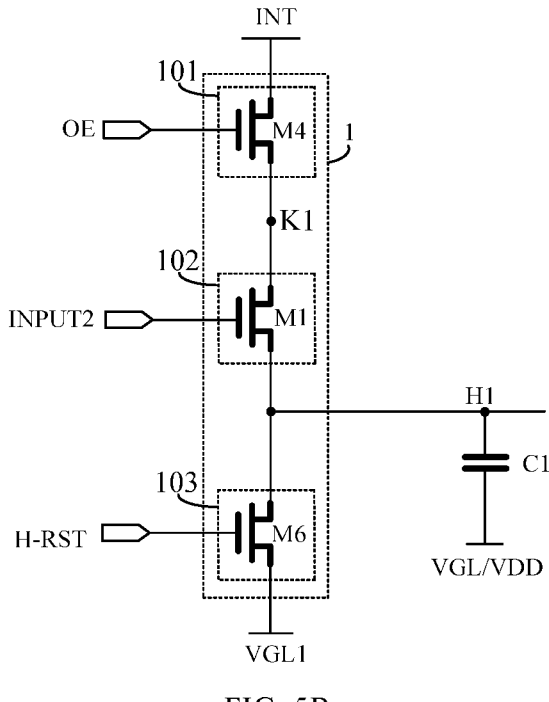
FIG. 5B is a schematic diagram showing another circuit structure of the sensing control circuit according to the embodiments of the present disclosure.

FIG. 5A is a schematic diagram showing a circuit structure of a sensing control circuit according to the embodiments of the present disclosure, and FIG. 5B is a schematic diagram showing another circuit structure of the sensing control circuit 1 according to the embodiments of the present disclosure. As shown in FIG. 5A and FIG. 5B, in some embodiments, the sensing control circuit 1 includes: a first control input circuit 101, a second control input circuit 102, and a control reset circuit 103.

The first control input circuit 101 is connected to the sensing active level supply terminal INT, a sensing control intermediate node K1, and a first control signal input terminal, and is configured to write a signal provided by the sensing active level supply terminal INT to the sensing control intermediate node K1 in response to control of an active level signal provided by the first control signal input terminal.

The second control input circuit 102 is connected to the sensing control intermediate node K1, the first sensing control node H1, and a second control signal input terminal, and is configured to write a signal at the sensing control intermediate node K1 to the first sensing control node H1 in response to control of an active level signal provided by the second control signal input terminal.

The control reset circuit 103 is connected to a second power supply terminal, the first sensing control node H1, and a control reset signal input terminal H-RST, and is configured to write an inactive level signal provided by the second power supply terminal to the first sensing control node H1 in response to control of an active level signal provided by the control reset signal input terminal H-RST.

One of the first control signal input terminal and the second control signal input terminal is the sensing signal input terminal INPUT2, and the other is the random signal input terminal OE.

In some embodiments, the second power supply terminal provides a low level voltage VGL1.

It should be noted that FIG. 5A illustrates a case where the first control signal input terminal is the sensing signal input terminal INPUT2, and the second control signal input terminal is the random signal input terminal OE; and FIG. 5B illustrates a case where the first control signal input terminal is the random signal input terminal OE, and the second control signal input terminal is the sensing signal input terminal INPUT2.

In some embodiments, the control reset circuit 103 includes: a sixth transistor M6; and a control electrode of the sixth transistor M6 is connected to the control reset signal input terminal H-RST, a first electrode of the sixth transistor M6 is connected to the first sensing control node H1, and a second electrode of the sixth transistor M6 is connected to the second power supply terminal.

Figure 5C:
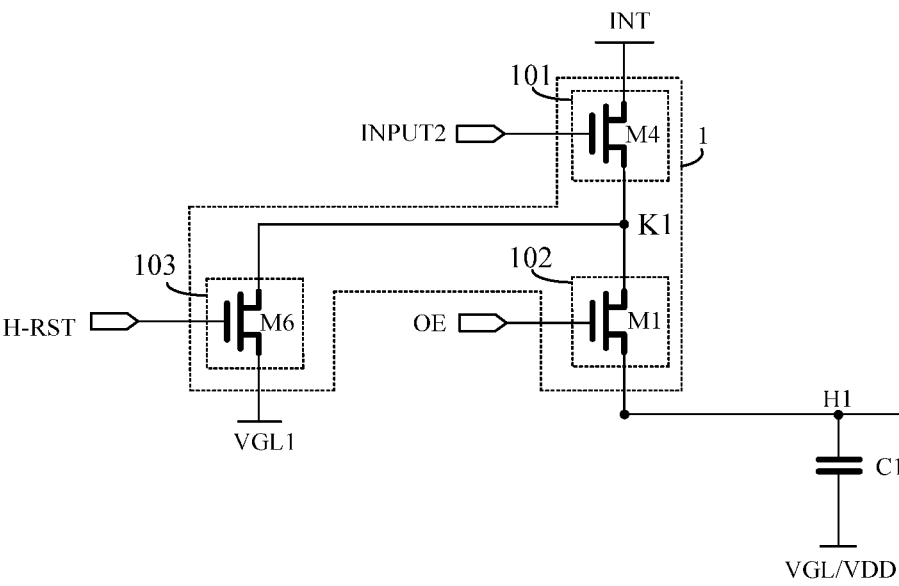
FIG. 5C is a schematic diagram showing a circuit structure of the sensing control circuit according to the embodiments of the present disclosure.

FIG. 5C is a schematic diagram showing a circuit structure of the sensing control circuit according to the embodiments of the present disclosure. As shown in FIG. 5C, unlike the cases where the control reset circuit 103 is connected to the first sensing control node H1 illustrated in FIG. 5A and FIG. 5B, in the embodiment of the present disclosure, the first control signal input terminal is the sensing signal input terminal INPUT2, the second control signal input terminal is the random signal input terminal OE, and the control reset circuit 103 is connected to the sensing control intermediate node K1.

Specifically, the control reset circuit 103 is connected to the second power supply terminal, the sensing control intermediate node K1, and the control reset signal input terminal H-RST, and is configured to write an inactive level signal provided by the second power supply terminal to the sensing control intermediate node K1 in response to control of an active level signal provided by the control reset signal input terminal H-RST.

In some embodiments, the control reset circuit 103 includes: a sixth transistor M6; and a control electrode of the sixth transistor M6 is connected to the control reset signal input terminal H-RST, a first electrode of the sixth transistor M6 is connected to the sensing control intermediate node, and a second electrode of the sixth transistor M6 is connected to the second power supply terminal.

Still with reference to FIGS. 4, and 5A to 5C, in some embodiments, the first control input circuit 101 includes: a fourth transistor M4, and the second control input circuit 102 includes: a first transistor M1.

A control electrode of the fourth transistor M4 is connected to the first control signal input terminal, a first electrode of the fourth transistor M4 is connected to the sensing active level supply terminal INT, and a second electrode of the fourth transistor M4 is connected to the sensing control intermediate node K1.

A control electrode of the first transistor M1 is connected to the second control signal input terminal, a first electrode of the first transistor M1 is connected to the sensing control intermediate node K1, and a second electrode of the first transistor M1 is connected to the first sensing control node H1.

In some embodiments, the shift register unit further includes: a first capacitor; and a first terminal of the first capacitor is connected to the first sensing control node H1, a second terminal of the first capacitor is connected to a third power supply terminal, and the first capacitor can play a role of stabilizing a voltage at the first sensing control node H1. The third power supply terminal may supply a constant high level voltage VDD or a constant low level voltage VGL.

In order to facilitate a better understanding of the technical solutions of the present disclosure by those of ordinary skill in the art, a detailed description is given below with reference to specific exemplary embodiments.

Figure 6:
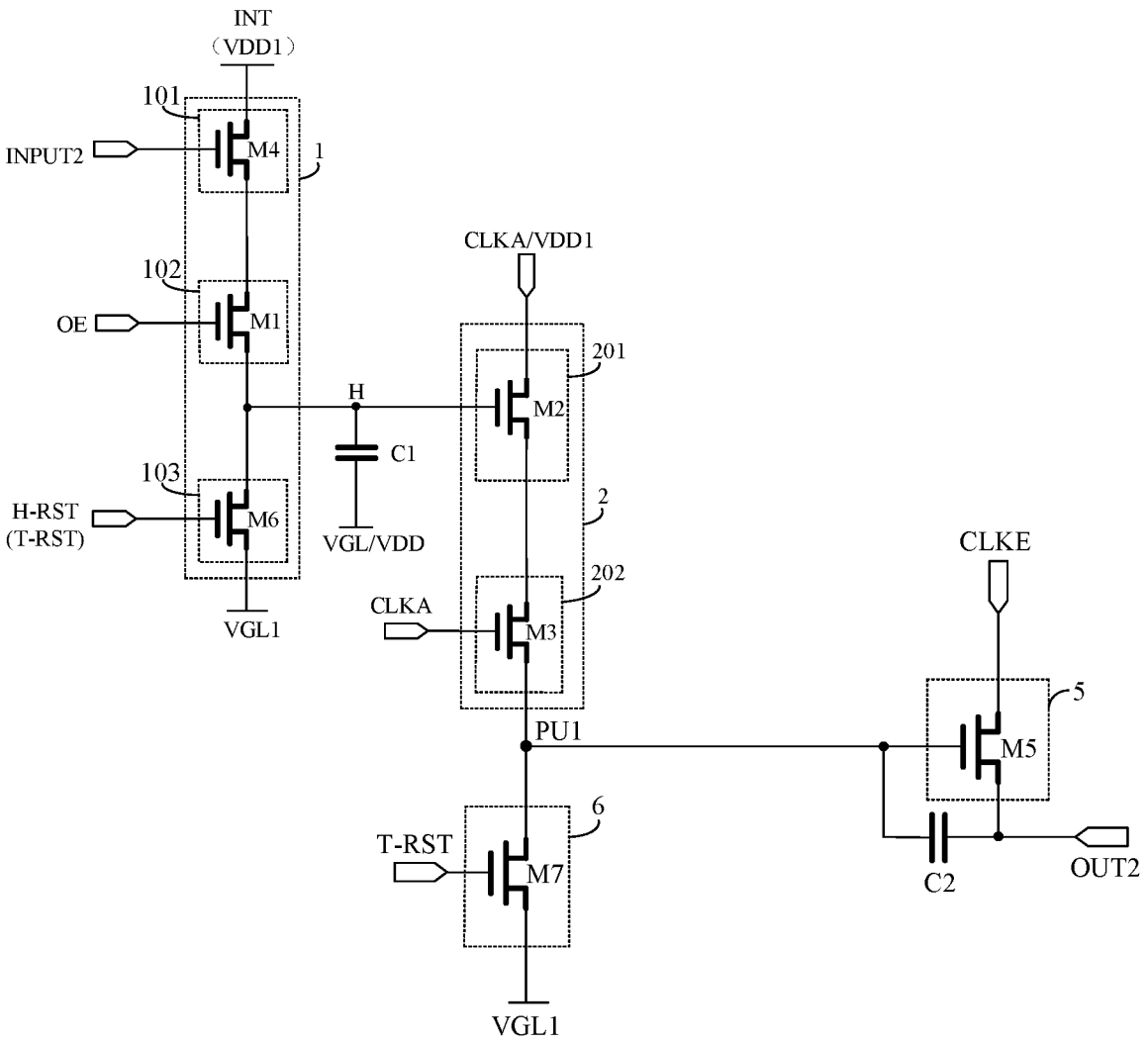
FIG. 6 is a schematic diagram showing another circuit structure of the shift register unit according to the embodiments of the present disclosure.

FIG. 6 is a schematic diagram showing another circuit structure of the shift register unit according to the embodiments of the present disclosure. As shown in FIG. 6, in some embodiments, the shift register unit further includes: a first global reset circuit 6. The first global reset circuit 6 is connected to a global reset signal input terminal T-RST, the second power supply terminal, and the first pull-up node PU1, and is configured to write an inactive level signal provided by the second power supply terminal to the first pull-up node PU1 in response to control of an active level signal provided by the global reset signal input terminal T-RST.

In some embodiments, the control reset signal input terminal H-RST and the global reset signal input terminal T-RST are the same signal terminal. That is, the global reset signal input terminal T-RST may be used as the control reset signal input terminal H-RST. With such design, the number of types of signal input terminals required to be configured in the shift register unit can be reduced.

In a case illustrated by FIG. 6, the sensing control circuit 1 in the shift register unit adopts the structure shown in FIG. 5A, and the sensing control circuit 1 includes the first transistor M1, the fourth transistor M4, and the sixth transistor M6. Apparently, the sensing control circuit 1 in FIG. 6 may also adopt the structure shown in FIG. 5B or FIG. 5C.

In some embodiments, the first sensing input circuit 2 includes: a first input response circuit 201 and a second input response circuit 202.

The first input response circuit 201 is connected to an input active level supply terminal, the first sensing control node H1, and a sensing input intermediate node K2, and is configured to write a signal provided by the input active level supply terminal to the sensing input intermediate node K2 in response to control of an active level signal at the first sensing control node H1.

The second input response circuit 202 is connected to the sensing input intermediate node K2, the clock control signal input terminal CLKA, and the first pull-up node PU1, and is configured to write a voltage at the sensing input intermediate node K2 to the first pull-up node PU1 in response to control of an active level signal provided by the clock control signal input terminal CLKA.

In some embodiments, the first sensing input circuit 2 includes: a second transistor M2 and a third transistor M3.

A control electrode of the second transistor M2 is connected to the first sensing control node H1, a first electrode of the second transistor M2 is connected to the input active level supply terminal, and a second electrode of the second transistor M2 is connected to the sensing input intermediate node K2. The input active level supply terminal may be the clock control signal input terminal CLKA or a first power supply terminal (which provides a high level voltage VDD1).

A control electrode of the third transistor M3 is connected to the clock control signal input terminal CLKA, a first electrode of the third transistor M3 is connected to the sensing input intermediate node K2, and a second electrode of the third transistor M3 is connected to the first pull-up node PU1.

In some embodiments, the first driving output circuit 5 includes: a fifth transistor M5; and a control electrode of the fifth transistor M5 is connected to the first pull-up node PU1, a first electrode of the fifth transistor M5 is connected to the first driving clock signal input terminal CLKE, and a second electrode of the fifth transistor M5 is connected to the first driving signal output terminal OUT2.

In some embodiments, the first global reset circuit 6 includes: a seventh transistor M7; and a control electrode of the seventh transistor M7 is connected to the global reset signal input terminal T-RST, a first electrode of the seventh transistor M7 is connected to the first pull-up node PU1, and a second electrode of the seventh transistor M7 is connected to the second power supply terminal.

In some embodiments, a first capacitor capable of stabilizing a voltage at the first sensing control node H1 is disposed at the first sensing control node H1. A second capacitor capable of enabling stable outputting of the first driving signal output terminal OUT2 is disposed at the first driving signal output terminal OUT2.

Figure 7A:
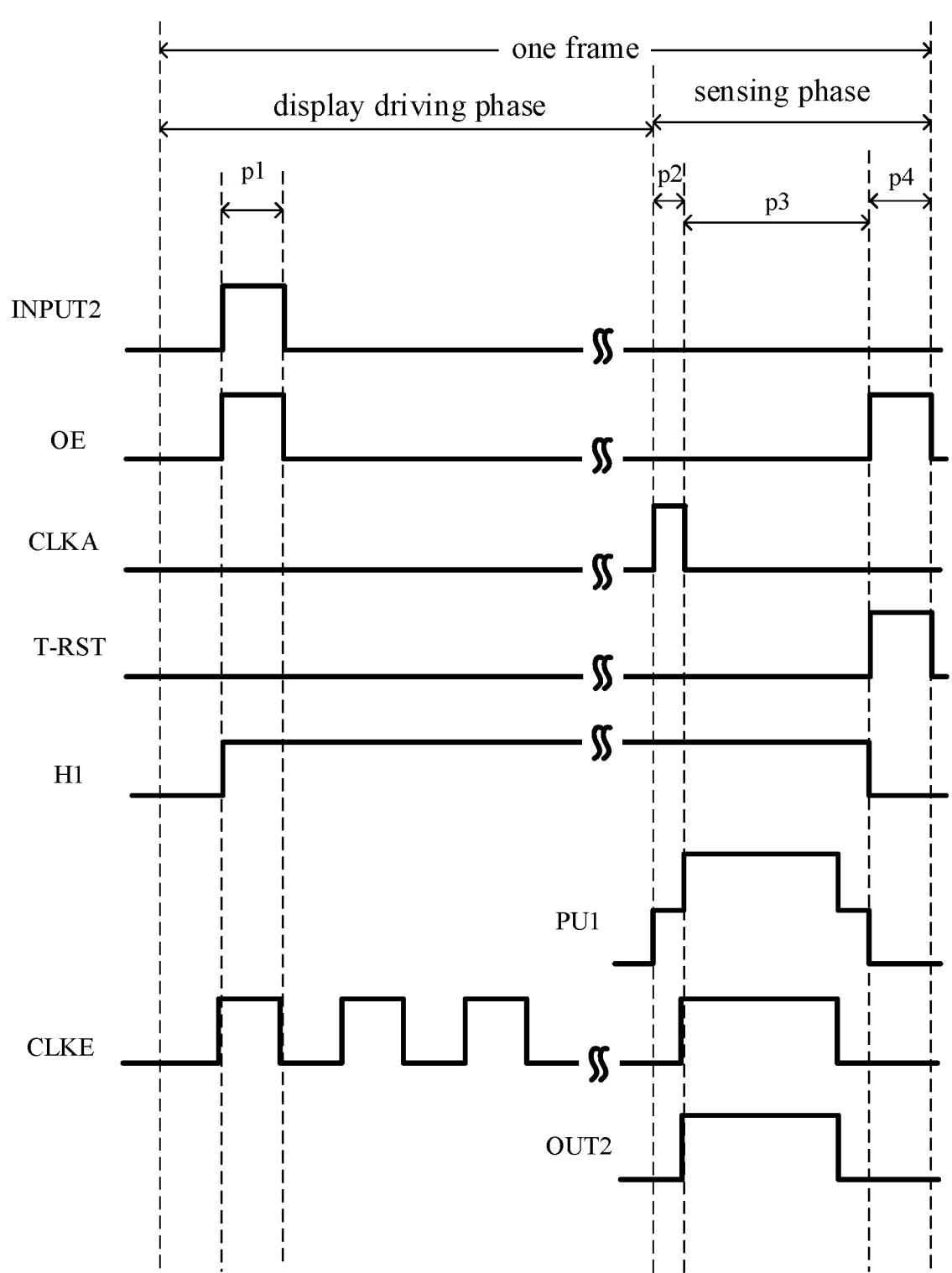
FIG. 7A is an operating timing diagram of the shift register unit shown in FIG. 6.

FIG. 7A is an operating timing diagram of the shift register unit shown in FIG. 6. As shown in FIG. 7A, in some embodiments, an operating process of the shift register unit includes the following phases.

In a phase p1, the sensing signal input terminal INPUT2 provides a high level signal, the random signal input terminal OE provides a high level signal, the clock control signal input terminal CLKA provides a low level signal, and the global reset signal input terminal T-RST (the control reset signal input terminal H-RST) provides a low level signal.

At this time, the first transistor M1 and the fourth transistor M4 are both turned on, a high level signal provided by the sensing active level supply terminal INT is written to the first sensing control node H1 through the fourth transistor M4 and the first transistor M1, and a voltage at the first sensing control node H1 is in a high level state. Accordingly, the second transistor M2 is turned on.

Since the clock control signal input terminal CLKA provides the low level signal, the third transistor M3 is turned off. Since the global reset signal input terminal T-RST (the control reset signal input terminal H-RST) provides the low level signal, the sixth transistor M6 and the seventh transistor M7 are both turned off.

It should be noted that the phase p1 is in a display driving phase of one frame, and reference may be made to the following description of the embodiments for voltages applied to the first pull-up node PU1 and the first driving signal output terminal OUT2 in the display driving phase.

In a phase p2, the sensing signal input terminal INPUT2 provides a low level signal, the random signal input terminal OE provides a low level signal, the clock control signal input terminal CLKA provides a high level signal, and the global reset signal input terminal T-RST (the control reset signal input terminal H-RST) provides a low level signal.

Since the voltage at the first sensing control node H1 maintains the high level state as in the previous phase, the second transistor M2 remains an on state, and the high level signal provided by the clock control signal input terminal CLKA or the first power supply terminal is written to the sensing input intermediate node K2 through the second transistor M2, and a voltage at the sensing input intermediate node K2 is in a high level state. Meanwhile, since the third transistor M3 is turned on due to the high level signal provided by the clock signal input terminal CLKA, the high level signal at the sensing input intermediate node K2 is written to the first pull-up node PU1, and the first pull-up node PU1 is in a high level state. Accordingly, the fifth transistor M5 is turned on, and a low level signal provided by the first driving clock signal input terminal CLKE is written to the first driving signal output terminal OUT2 through the fifth transistor M5.

Since the first driving clock signal input terminal CLKE provides the low level signal in the phase p2, the first driving signal output terminal OUT2 outputs a low level signal at this time.

It should be noted that a time interval exists between the phase p1 and the phase p2, and in order to ensure that the voltage at the sensing control node remains stable in the time interval, the first capacitor may be additionally disposed at the first sensing control node H1.

In a phase p3, the sensing signal input terminal INPUT2 provides a low level signal, the random signal input terminal OE provides a low level signal, the clock control signal input terminal CLKA provides a low level signal, and the global reset signal input terminal T-RST (the control reset signal input terminal H-RST) provides a low level signal.

The first driving clock signal input terminal CLKE first provides a high level signal and then provides a low level signal (a length of time for providing the high level signal may be preset according to actual needs), the signal provided by the first driving clock signal input terminal CLKE is written to the first driving signal output terminal OUT2 through the fifth transistor M5, and the first driving signal output terminal OUT2 first outputs a high level signal and then outputs a low level signal.

It should be noted that, in a switching process of the first driving signal output terminal OUT2 from outputting the low level signal to outputting the high level signal, a voltage at the first pull-up node PU1 is pulled up to a higher level under a bootstrap action of the second capacitor; and in a switching process of the first driving signal output terminal OUT2 from outputting the high level signal to outputting the low level signal, the voltage at the first pull-up node PU1 is pulled down to an initial high level state under the bootstrap action of the second capacitor.

In a phase p4, the sensing signal input terminal INPUT2 provides a low level signal, the random signal input terminal OE provides a high level signal, the clock control signal input terminal CLKA provides a low level signal, and the global reset signal input terminal T-RST (the control reset signal input terminal H-RST) provides a high level signal.

Since the random signal input terminal OE provides the high level signal, the first transistor M1 is turned on. However, since the fourth transistor M4 is turned off due to the low level signa provided by the sensing signal input terminal INPUT2, a path between the sensing active level supply terminal INT and the first sensing control node H1 is cut off.

Meanwhile, since the global reset signal input terminal T-RST provides the high level signal, the sixth transistor M6 and the seventh transistor M7 are both turned on. A low level voltage VGL1 provided by the second power supply terminal is written to the first sensing control node H1 through the sixth transistor M6 to reset the first sensing control node H1, the voltage at the first sensing control node H1 is in a low level state, and accordingly, the second transistor M2 is turned off. The low level voltage VGL1 provided by the second power supply terminal is written to the first pull-up node PU1 through the seventh transistor M7 to reset the first pull-up node PU1, the voltage at the first pull-up node PU1 is in a low level state, and accordingly, the fifth transistor M5 is turned off.

Based on the above, the sensing control circuit 1 in the shift register unit provided by the embodiments of the present disclosure can use the sensing active level supply terminal INT and the second power supply terminal to quickly charge and reset the first sensing control node H1, respectively. That is, the sensing control circuit 1 in the shift register unit provided by the embodiments of the present disclosure has the strong capability of inputting a signal to the first sensing control node H1, which is beneficial to improving the operation stability of the shift register unit.

Figure 7B:
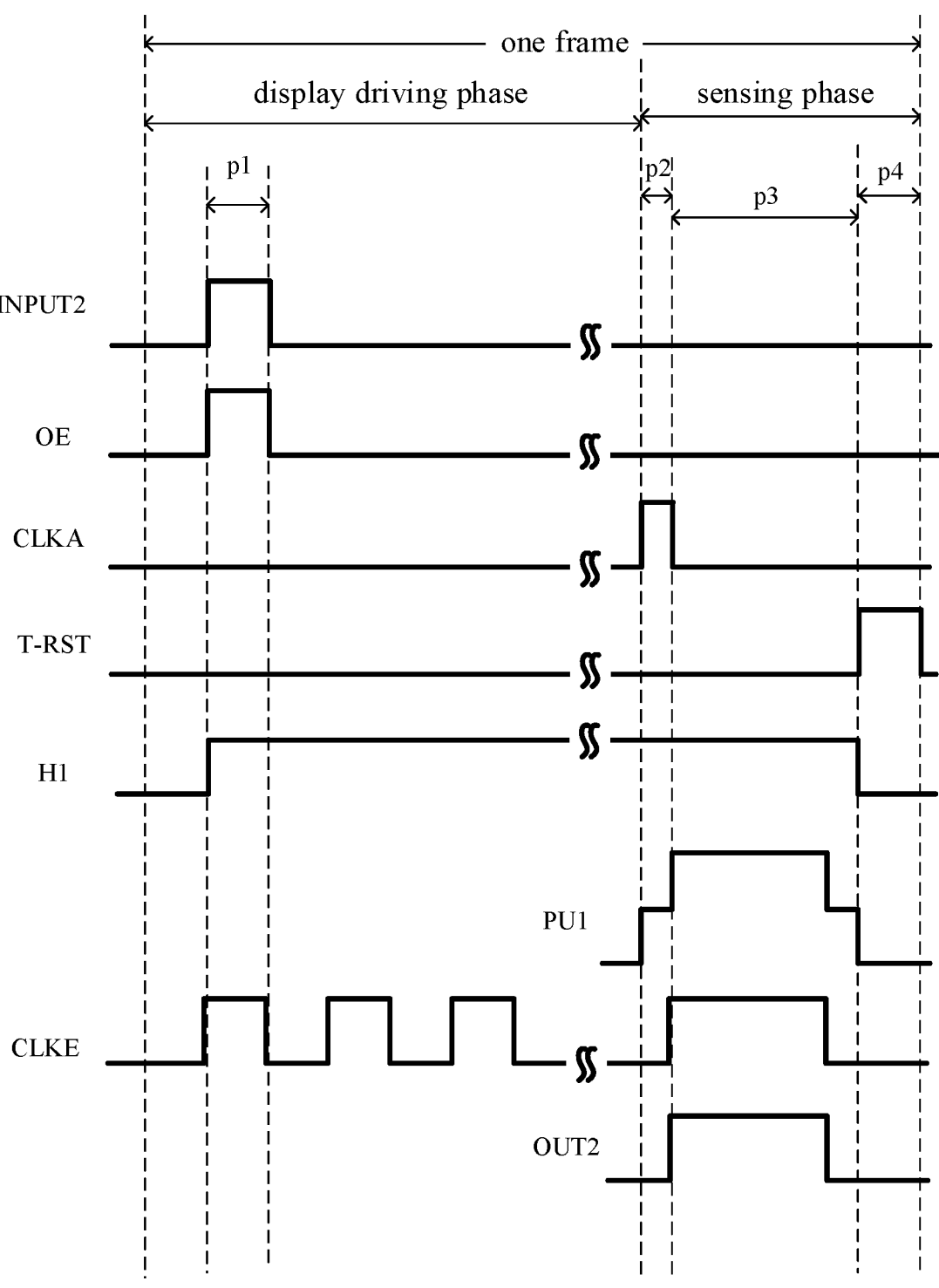
FIG. 7B is an operating timing diagram of the shift register unit shown in FIG. 6.

FIG. 7B is an operating timing diagram of the shift register unit shown in FIG. 6. As shown in FIG. 7B, the operating timing diagram shown in FIG. 7B differs from that shown in FIG. 7A in that the random signal input terminal OE shown in FIG. 7B provides a low level signal in the phase p4, that is, the first transistor M1 shown in FIG. 6 may be in an off state in the phase p4.

It should be noted that, in the case where the sensing control circuit 1 in the shift register unit adopts the structure shown in FIG. 5A or FIG. 5B, the shift register unit may adopt the operating timing shown in FIG. 7A or FIG. 7B, that is, the first transistor M1 may be in an on state or an off state in the phase p4.

In a case where the sensing control circuit 1 in the shift register unit adopts the structure shown in FIG. 5C, in order to ensure that the low level voltage VGL1 provided by the second power supply terminal can be written to the first sensing control node H1 to reset the first sensing control node H1 in the phase p4, a path needs to be formed between the sensing control intermediate node K1 and the first sensing control node H1, that is, the first transistor M1 needs to be in the on state in the phase p4, that is, the random signal input terminal OE needs to provide a high level signal in the phase p4. In this case, the shift register may adopt the operating timing shown in FIG. 7A.

In the embodiments of the present disclosure, the reset of the first sensing control node H1 can be realized only through the control of the control reset signal input terminal H-RST. In this case, the control reset circuit 103 is directly connected to the first sensing control node H1 (the cases illustrated in FIGS. 5A and 5B), and the control reset circuit 103 can directly write an inactive level signal provided by the second power supply terminal to the first sensing control node H1.

In the embodiments of the present disclosure, the reset of the first sensing control node H1 can also be realized through the control of the control reset signal input terminal H-RST and the random signal input terminal OE. In this case, the control reset circuit 103 is connected to the sensing control intermediate node K1 (the case illustrated in FIG. 5C), the control reset circuit 103 writes an inactive level signal provided by the second power supply terminal to the sensing control intermediate node K1, and then the random signal input terminal OE controls the second control input circuit 102 to write the inactive level signal at the sensing control intermediate node K1 to the first sensing control node H1.

In addition, the above case where the control reset signal input terminal H-RST and the global reset signal input terminal T-RST are the same signal terminal and the reset process of the first sensing control node H1 is performed simultaneously with the reset process of the first pull-up node PU1 is only an exemplary implementation in the embodiments of the present disclosure, and does not limit the technical solutions of the present disclosure. In the embodiments of the present disclosure, the control reset signal input terminal H-RST and the global reset signal input terminal T-RST may be two different signal terminals, and the reset process of the first sensing control node H1 may be performed before or after the reset process of the first pull-up node PU1, or may be performed simultaneously with the reset process of the first pull-up node PU1. In the embodiments of the present disclosure, it only needs to be ensured that the reset process of the first sensing control node H1 is performed after the phase p2, and the reset process of the first pull-up node PU1 is performed after the phase p3.

Figure 8A:
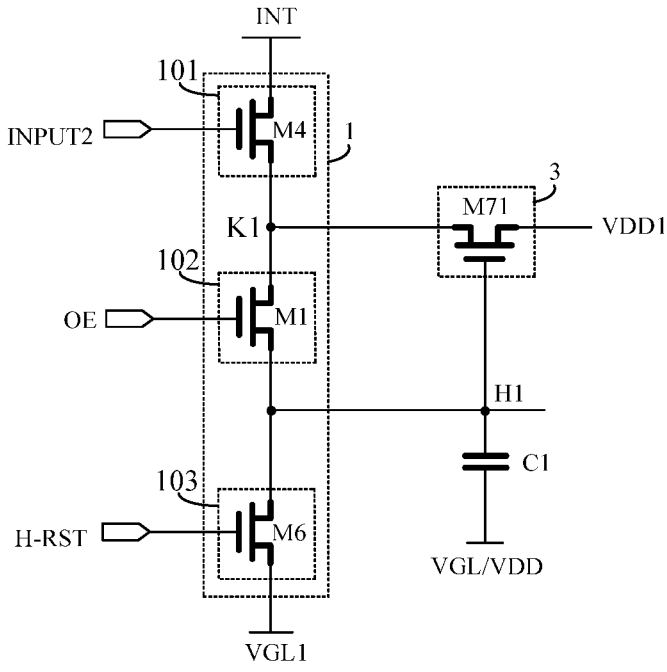
FIGS. 8A to 8C are schematic diagrams illustrating cases where the sensing control circuits shown in FIG. 5A and FIG. 5B are provided with a third voltage control circuit.
Figure 8B:
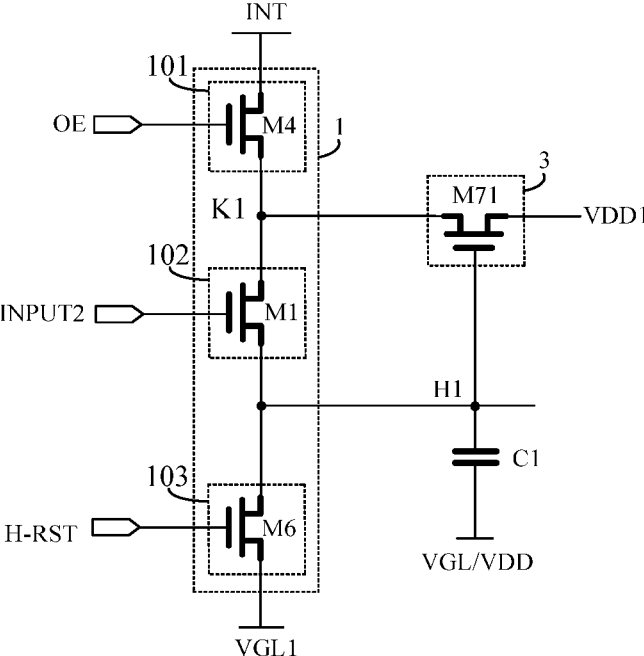
Figure 8C:
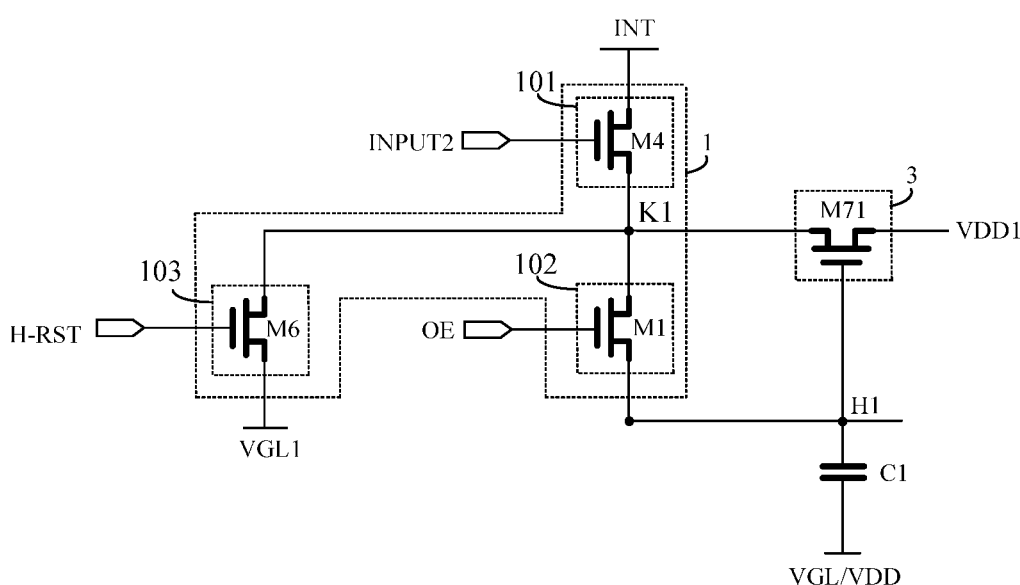

FIGS. 8A to 8C are schematic diagrams illustrating cases where the sensing control circuits 1 shown in FIGS. 5A to 5C are provided with a third voltage control circuit. As shown in FIGS. 8A to 8C, in some embodiments, the shift register unit further includes: a third voltage control circuit connected to the first sensing control node H1, the sensing control intermediate node K1, and the first power supply terminal, and configured to write an active level signal provided by the first power supply terminal to the sensing control intermediate node K1 in response to control of an active level signal at the first sensing control node H1.

As can be seen from the above timing, the first sensing control node H1 is in a floating state in the time interval between the phase p1 and the phase p2, at this time, a risk that the first sensing control node H1 generates an electric leakage through the second control input circuit 102 exists. When the problem of the electric leakage is too serious, the voltage at the first sensing control node H1 may drop too low, which causes abnormal operation of the shift register unit. In view of the above problem, the third voltage control circuit is provided in the embodiments of the present disclosure. The third voltage control circuit can write an active level signal provided by the first power supply terminal to the sensing control intermediate node K1 when the voltage at the first sensing control node H1 is in an active level state, so that voltages at two ends (at the sensing control intermediate node K1 and the first sensing control node H1) of the second control input circuit 102 are substantially consistent, thereby effectively preventing the first sensing control node H1 from generating the electric leakage through the second control input circuit 102, and facilitating stabilization of the voltage at the first sensing control node H1.

In some embodiments, the third voltage control circuit includes: a seventy-first transistor M71; and a control electrode of the seventy-first transistor M71 is connected to the first sensing control node H1, a first electrode of the seventy-first transistor M71 is connected to the first power supply terminal, and a second electrode of the seventy-first transistor M71 is connected to the sensing control intermediate node K1.

Figure 8D:
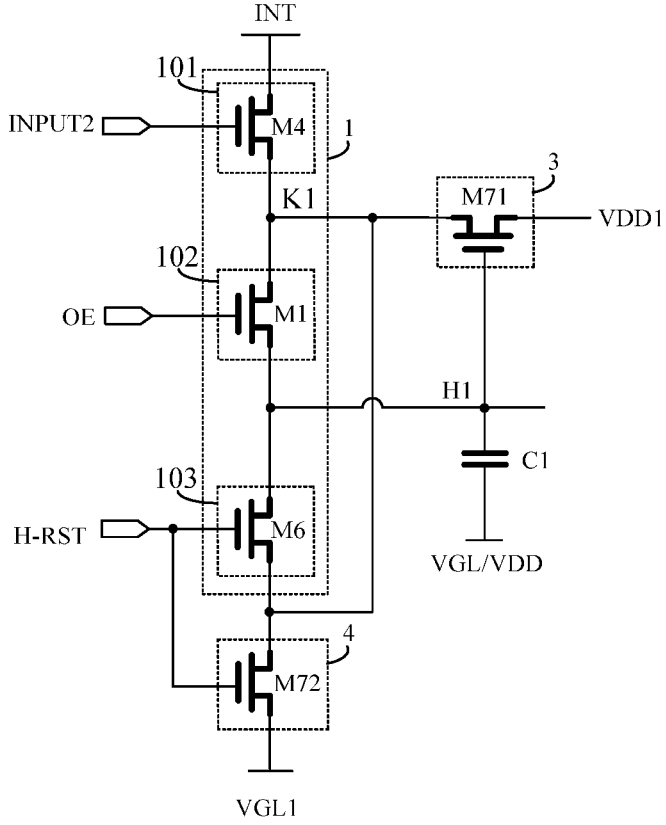
FIG. 8D and FIG. 8E are schematic diagrams illustrating cases where the sensing control circuits and the third control voltage circuits shown in FIG. 8A to 8B are provided with a control reset anti-leakage circuit.
Figure 8E:
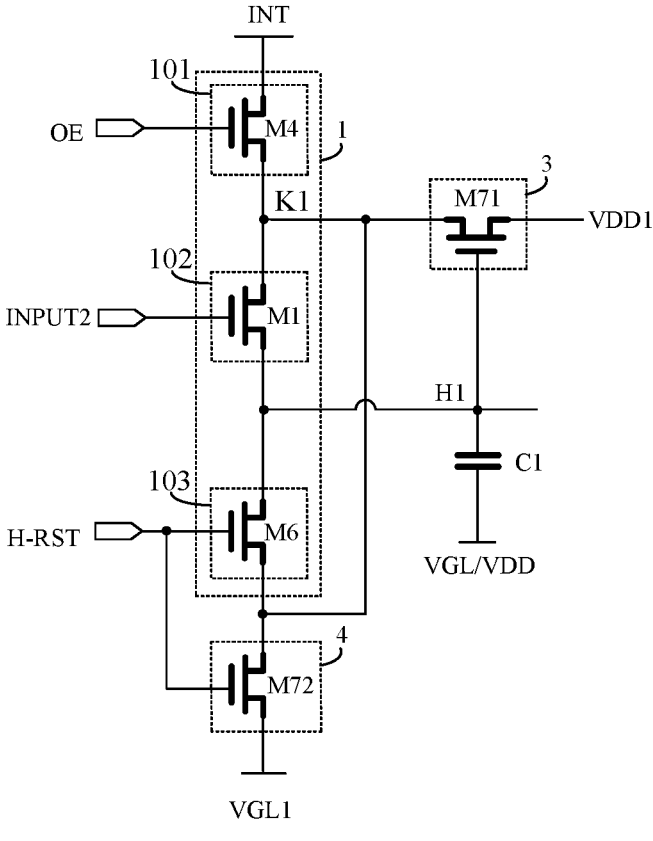

FIG. 8D and FIG. 8E are schematic diagrams illustrating cases where the sensing control circuits 1 and the third control voltage circuits shown in FIG. 8A to 8B are provided with a control reset anti-leakage circuit. As shown in FIG. 8D and FIG. 8E, the shift register unit further includes: a control reset anti-leakage circuit 4; the control reset circuit 103 is connected to the second power supply terminal through the control reset anti-leakage circuit 4, and is connected to the control reset anti-leakage circuit 4 at a control reset anti-leakage node, and the control reset anti-leakage node is connected to the sensing control intermediate node K1: the control reset anti-leakage circuit is further connected to the control reset signal input terminal H-RST, and is configured to form a path between the reset anti-leakage node and the second power supply terminal in response to control of an active level signal provided by the control reset signal input terminal H-RST, and cut off the path between the reset anti-leakage node and the second power supply terminal in response to control of an inactive level signal provided by the control reset signal input terminal H-RST.

In a case where the control reset circuit 103 is connected to the first sensing control node H1 (the cases shown in FIGS. 5A, 5B, 7A, and 7B), during the time interval between the phase p1 and the phase p2, a risk that the first sensing control node H1 in the floating state generates an electric leakage through the control reset circuit 103 and the second power supply terminal also exists.

In view of the above problem, the control reset anti-leakage circuit 4 is provided in the embodiments of the present disclosure. When the signal at the control reset signal input terminal H-RST is in an active level state, the path between the reset anti-leakage node and the second power supply terminal can be formed, so as to ensure that an inactive level signal provided by the second power supply terminal can be written to the first sensing control node H1 through the control reset anti-leakage circuit 4 and the control reset circuit 103; and when the signal at the control reset signal input terminal H-RST is in an inactive level state, the path between the reset anti-leakage node and the second power supply terminal can be cut off, and an active level signal at the sensing control intermediate node K1 can be written to the reset anti-leakage node, so that the voltages at the two ends (at the reset anti-leakage node and the first sensing control node H1) of the control reset circuit 103 are substantially consistent, thereby effectively preventing the first sensing control node H1 from generating the electric leakage through the control reset circuit 103, and facilitating the stabilization of the voltage at the first sensing control node H1.

In some embodiments, the control reset anti-leakage circuit 4 includes: a seventy-second transistor M72; and a control electrode of the seventy-second transistor M72 is connected to the control reset signal input terminal H-RST, a first electrode of the seventy-second transistor M72 is connected to the reset anti-leakage node, and a second electrode of the seventy-second transistor M72 is connected to the second power supply terminal.

Figure 9:
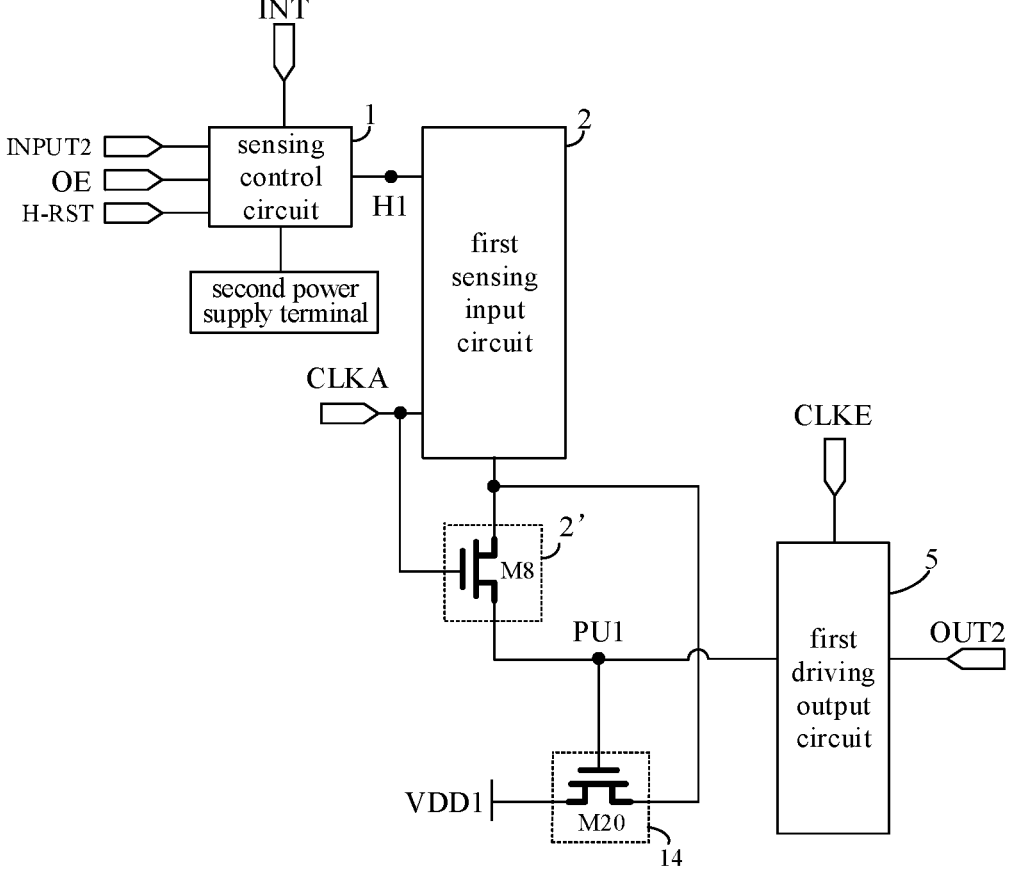
FIG. 9 is a schematic diagram showing still another circuit structure of the shift register unit according to the embodiments of the present disclosure.

FIG. 9 is a schematic diagram showing still another circuit structure of the shift register unit according to the embodiments of the present disclosure. As shown in FIG. 9, in some embodiments, the shift register unit further includes: a first voltage control circuit 14 connected to a first power supply terminal, the first pull-up node PU1, and a first voltage control node OFF1, and configured to write an active level signal provided by the first power supply terminal to the first voltage control node in response to control of an active level signal at the first pull-up node PU1.

The shift register unit further includes: a first sensing input anti-leakage circuit 2'; and the first sensing input circuit 2 is connected to the first pull-up node PU1 through the first sensing input anti-leakage circuit 2', and is connected to the first sensing input anti-leakage circuit 2' at a first sensing input anti-leakage node, the first sensing input anti-leakage node is connected to the first voltage control node OFF1, and the first sensing input anti-leakage circuit 2' is connected to the clock control signal input terminal CLKA, and is configured to form a path between the first sensing input anti-leakage node and the first pull-up node PU1 in response to control of an active level signal at the clock control signal input terminal CLKA, and cut off the path between the first sensing input anti-leakage node and the first pull-up node PU1 in response to control of an inactive level signal at the clock control signal input terminal CLKA.

With the above design of the first voltage control circuit 14 and the first sensing input anti-leakage circuit 2', the first pull-up node PU1 can be effectively prevented from generating an electric leakage through the first sensing input circuit 2 when the voltage at the first pull-up node PU1 is an active level voltage and the first pull-up node PU1 is in the floating state.

In some embodiments, the first voltage control circuit 14 includes: a twentieth transistor M20; and a control electrode of the twentieth transistor M20 is connected to the first pull-up node PU1, a first electrode of the twentieth transistor M20 is connected to the first power supply terminal, and a second electrode of the twentieth transistor M20 is connected to the first voltage control node OFF1.

In some embodiments, the first sensing input anti-leakage circuit 2' includes: an eighth transistor M8; and a control electrode of the eighth transistor M8 is connected to the clock control signal input terminal CLKA, a first electrode of the eighth transistor M8 is connected to the first sensing input circuit 2, and a second electrode of the eighth transistor M8 is connected to the first pull-up node PU1.

It should be noted that specific circuit structures of the sensing control circuit 1, the first sensing input circuit 2, and the first driving output circuit 5 shown in FIG. 9 may adopt those in the above embodiments. In addition, the shift register unit shown in FIG. 9 may also optionally include the first global reset circuit and the third voltage control circuit described in the above embodiments, or may include both the third voltage control circuit and the control reset anti-leakage circuit described in the above embodiment. Technical solutions obtained by combining different embodiments also belong to the protection scope of the present disclosure.

Figure 10:
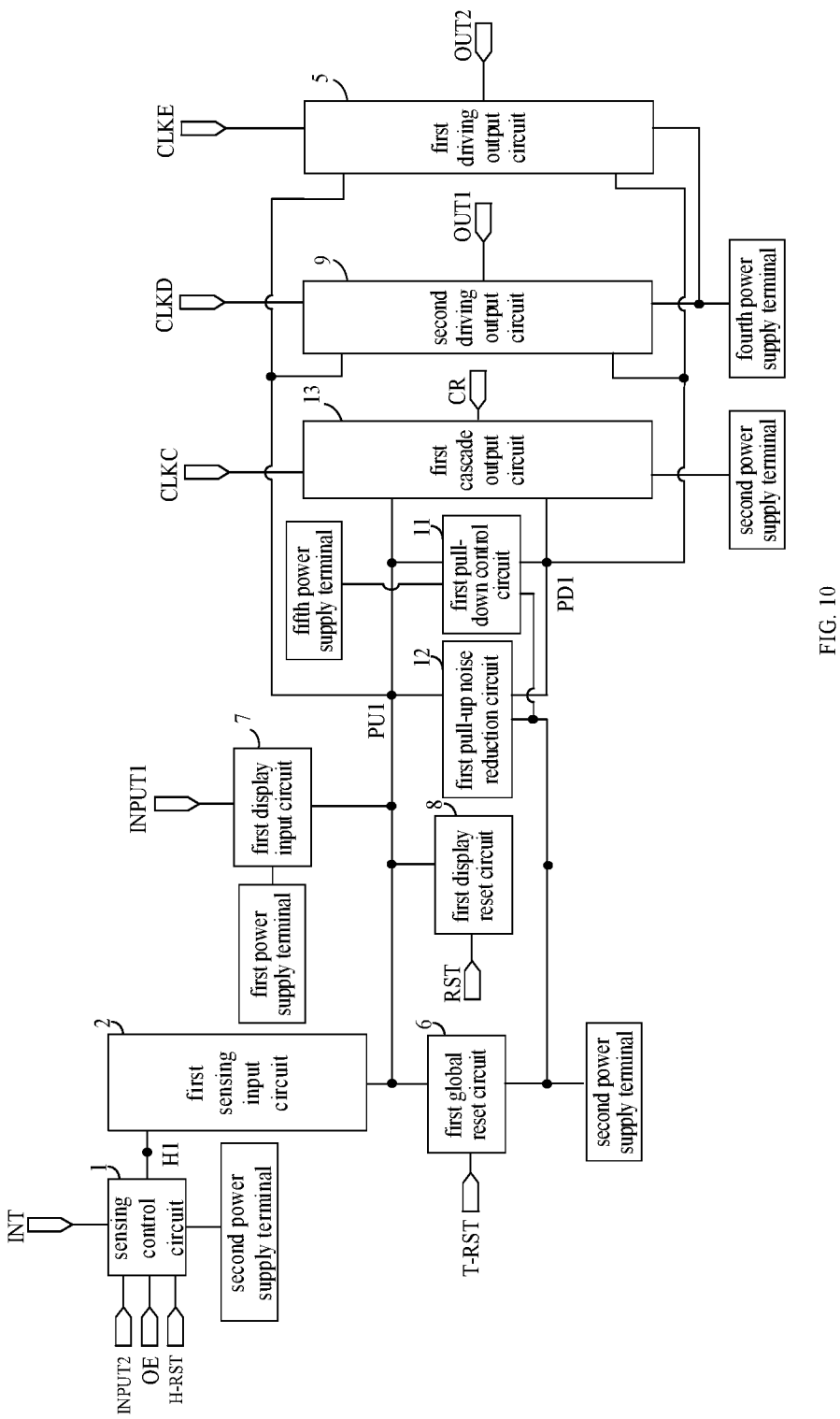
FIG. 10 is a schematic diagram showing yet another circuit structure of the shift register unit according to the embodiments of the present disclosure.

FIG. 10 is a schematic diagram showing yet another circuit structure of the shift register unit according to the embodiments of the present disclosure. As shown in FIG. 10, in some embodiments, the shift register unit further includes: a first display input circuit 7, a first display reset circuit 8, and a first cascade output circuit 13.

The first display input circuit 7 is connected to a display signal input terminal INPUT1, the first power supply terminal, and the first pull-up node PU1, and is configured to write an active level signal provided by the first power supply terminal to the first pull-up node PU1 in response to control of an active level signal provided by the display signal input terminal INPUT1.

The first display reset circuit 8 is connected to a display reset signal input terminal RST, the second power supply terminal, and the first pull-up node PU1, and is configured to write an inactive level signal provided by the second power supply terminal to the first pull-up node PU1 in response to control of an active level signal provided by the display reset signal input terminal RST.

The first cascade output circuit 13 is connected to the first pull-up node PU1, a first cascade clock signal input terminal CLKC, and a first cascade signal output terminal CR, and is configured to write a signal provided by the first cascade clock signal input terminal CLKC to the first cascade signal output terminal CR in response to control of an active level signal at the first pull-up node PU1.

In some embodiments, the sensing signal input terminal INPUT2 and the first cascade signal output terminal CR are the same signal terminal. With such design, the number of the types of the signal input terminals required to be configured in the shift register unit can be reduced.

It should be noted that, although a cascade signal output terminal has a relatively poor output capability, the sensing signal input terminal INPUT2 is only configured to control the sensing control circuit 1, but not configured to charge or reset a certain node, and therefore, the cascade signal output terminal CR can be used as the sensing signal input terminal INPUT2.

In some embodiments, the shift register unit further includes: a second driving output circuit 9 connected to the first pull-up node PU1, a second driving clock signal input terminal CLKD, and a second driving signal output terminal OUT1 and configured to write a signal provided by the second driving clock signal input terminal CLKD to the second driving signal output terminal OUT1 in response to control of an active level signal at the first pull-up node PU1.

The shift register unit shown in FIG. 10 is not only provided with a sensing driving function, i.e., to provide a driving signal to the second gate line G2 shown in FIG. 1, but is also provided with a display driving function, i.e., to provide a driving signal to the first gate line G1 shown in FIG. 1. That is, the first gate line G1 and the second gate line G2 in the display panel can be driven by a same gate driving circuit, which can effectively reduce the number of gate driving circuits configured in the display panel, and facilitate a narrow frame design of a product.

In some embodiments, the shift register unit further includes: a first pull-down control circuit 11 and a first pull-up noise reduction circuit 12.

The first pull-down control circuit 11 is connected to the second power supply terminal, a fifth power supply terminal, the first pull-up node PU1, and a first pull-down node PD1, and is configured to write a voltage having a phase opposite to that of a voltage at the first pull-up node PU1 to the first pull-down node PD1.

The first pull-up noise reduction circuit 12 is connected to the second power supply terminal, the first pull-up node PU1, and the first pull-down node PD1, and is configured to write an inactive level signal provided by the second power supply terminal to the first pull-up node PU1 in response to control of an active level signal at the first pull-down node PD1.

In this case, the first cascade output circuit 13 is further connected to the first pull-down node PD1 and the second power supply terminal, and is further configured to write an inactive level signal provided by the second power supply terminal to the first cascade signal output terminal CR in response to control of an active level signal at the first pull-down node PD1.

The first driving output circuit 5 is further connected to the first pull-down node PD1 and a fourth power supply terminal, and is further configured to write an inactive level signal provided by the fourth power supply terminal to the first driving signal output terminal OUT2 in response to control of an active level signal at the first pull-down node PD1.

The second driving output circuit 9 is further connected to the first pull-down node PD1 and the fourth power supply terminal, and is further configured to write an inactive level signal provided by the fourth power supply terminal to the second driving signal output terminal OUT1 in response to control of an active level signal at the first pull-down node PD1.

Figure 11:
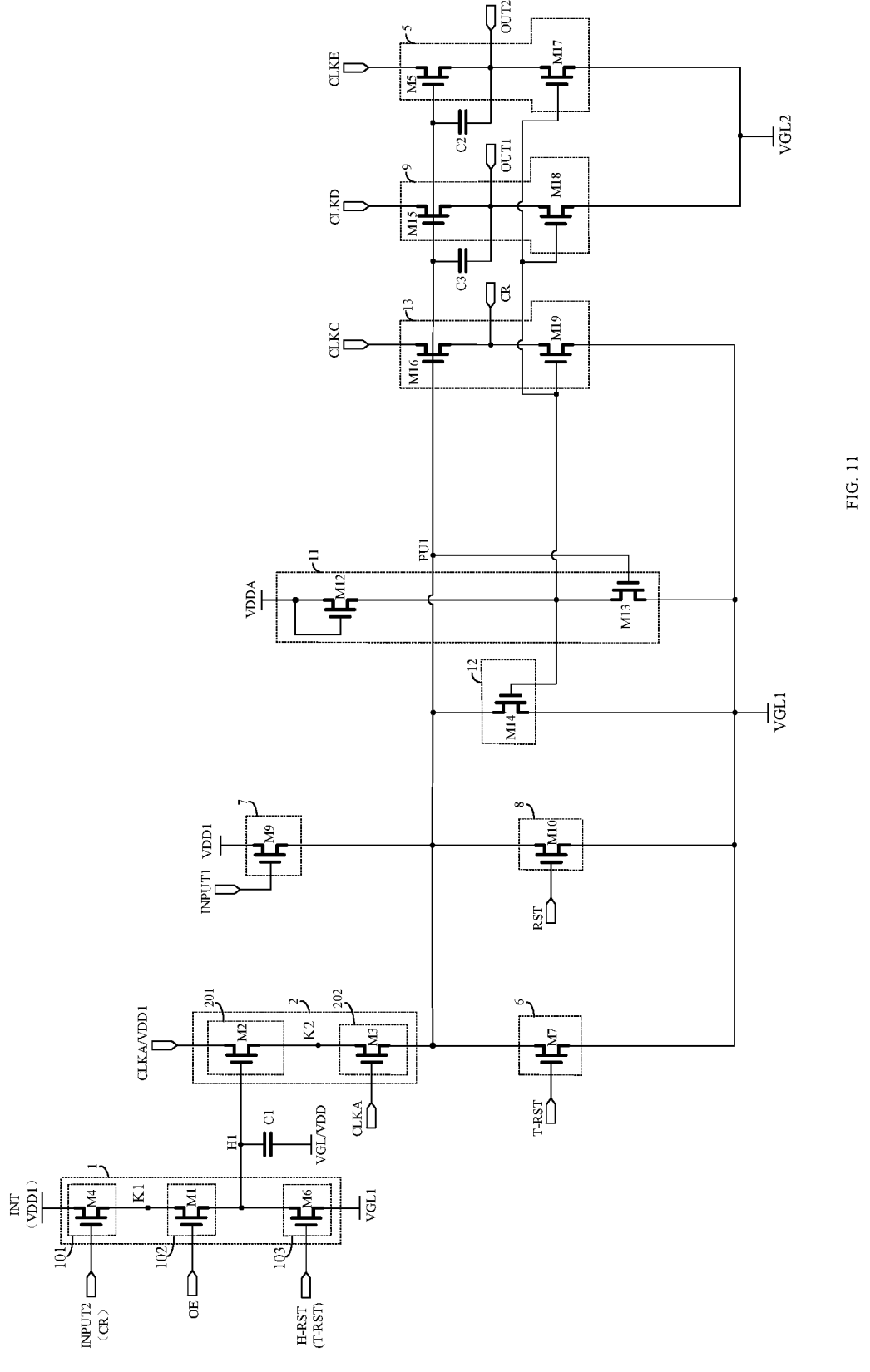
FIG. 11 is a schematic diagram showing yet another circuit structure of the shift register unit according to the embodiments of the present disclosure.

FIG. 11 is a schematic diagram showing yet another circuit structure of the shift register unit according to the embodiments of the present disclosure. As shown in FIG. 11, the shift register unit shown in FIG. 11 is an exemplary implementation of the shift register unit shown in FIG. 9, the sensing control circuit 1 in the shift register unit shown in FIG. 10 may adopt the structure shown in any one of FIGS. 5A to 5C according to the above embodiments, and the first sensing input circuit 2 and the first global reset circuit in the shift register unit shown in FIG. 10 may adopt the structures shown in FIG. 6. A case where the sensing control circuit 1, the first sensing input circuit 2, and the first global reset circuit 6 in the shift register unit shown in FIG. 10 adopt the structures shown in FIG. 6 is taken as an example.

In some embodiments, the first display input circuit 7 includes a ninth transistor M9, the first display reset circuit 8 includes a tenth transistor M10, the first pull-down control circuit 11 includes a twelfth transistor M12 and a thirteenth transistor M13, the first pull-up noise reduction circuit 12 includes a fourteenth transistor M14, the first driving output circuit 5 includes a fifth transistor M5 and a seventeenth transistor M17, the second driving output circuit 9 includes a fifteenth transistor M15 and an eighteenth transistor M18, and the first cascade output circuit 13 includes a sixteenth transistor M16 and a nineteenth transistor M19.

A control electrode of the ninth transistor M9 is connected to the display signal input terminal INPUT1, a first electrode of the ninth transistor M9 is connected to the first power supply terminal, and a second electrode of the ninth transistor M9 is connected to the first pull-up node PU1.

A control electrode of the tenth transistor M10 is connected to the display reset signal input terminal RST, a first electrode of the tenth transistor M10 is connected to the first pull-up node PU1, and a second electrode of the tenth transistor M10 is connected to the second power supply terminal.

A control electrode of the twelfth transistor M12 is connected to the fifth power supply terminal, a first electrode of the twelfth transistor M12 is connected to the fifth power supply terminal, and a second electrode of the twelfth transistor M12 is connected to the first pull-down node PD1.

A control electrode of the thirteenth transistor M13 is connected to the first pull-up node PU1, a first electrode of the thirteenth transistor M13 is connected to the first pull-down node PD1, and a second electrode of the thirteenth transistor M13 is connected to the second power supply terminal.

A control electrode of the fourteenth transistor M14 is connected to the first pull-down node PD1, a first electrode of the fourteenth transistor M14 is connected to the first pull-up node PU1, and a second electrode of the fourteenth transistor M14 is connected to the second power supply terminal.

A control electrode of the fifth transistor M5 is connected to the first pull-up node PU1, a first electrode of the fifth transistor M5 is connected to the first driving clock signal input terminal CLKE, and a second electrode of the fifth transistor M5 is connected to the first driving signal output terminal OUT2.

A control electrode of the seventeenth transistor M17 is connected to the first pull-down node PD1, a first electrode of the seventeenth transistor M17 is connected to the first driving signal output terminal OUT2, and a second electrode of the seventeenth transistor M17 is connected to the fourth power supply terminal.

A control electrode of the fifteenth transistor M15 is connected to the first pull-up node PU1, a first electrode of the fifteenth transistor M15 is connected to the second driving clock signal input terminal CLKD, and a second electrode of the fifteenth transistor M15 is connected to the second driving signal output terminal OUT1.

A control electrode of the eighteenth transistor M18 is connected to the first pull-down node PD1, a first electrode of the eighteenth transistor M18 is connected to the second driving signal output terminal OUT1, and a second electrode of the eighteenth transistor M18 is connected to the fourth power supply terminal.

A control electrode of the sixteenth transistor M16 is connected to the first pull-up node PU1, a first electrode of the sixteenth transistor M16 is connected to the cascade clock signal input terminal CLKC, and a second electrode of the sixteenth transistor M16 is connected to the first cascade signal output terminal CR.

A control electrode of the nineteenth transistor M19 is connected to the first pull-down node PD1, a first electrode of the nineteenth transistor M19 is connected to the first cascade signal output terminal CR, and a second electrode of the nineteenth transistor M19 is connected to the fourth power supply terminal.

In some embodiments, the first power supply terminal provides a high level voltage VDD1, the second power supply terminal provides a low level voltage VGL1, the third power supply terminal provides a high level voltage VDD or a low level voltage VGL, the fourth power supply terminal provides a low level voltage VGL2, and the fifth power supply terminal provides a high level voltage VDDA.

In some embodiments, the third power supply terminal may be the first power supply terminal or the second power supply terminal.

Figure 12:
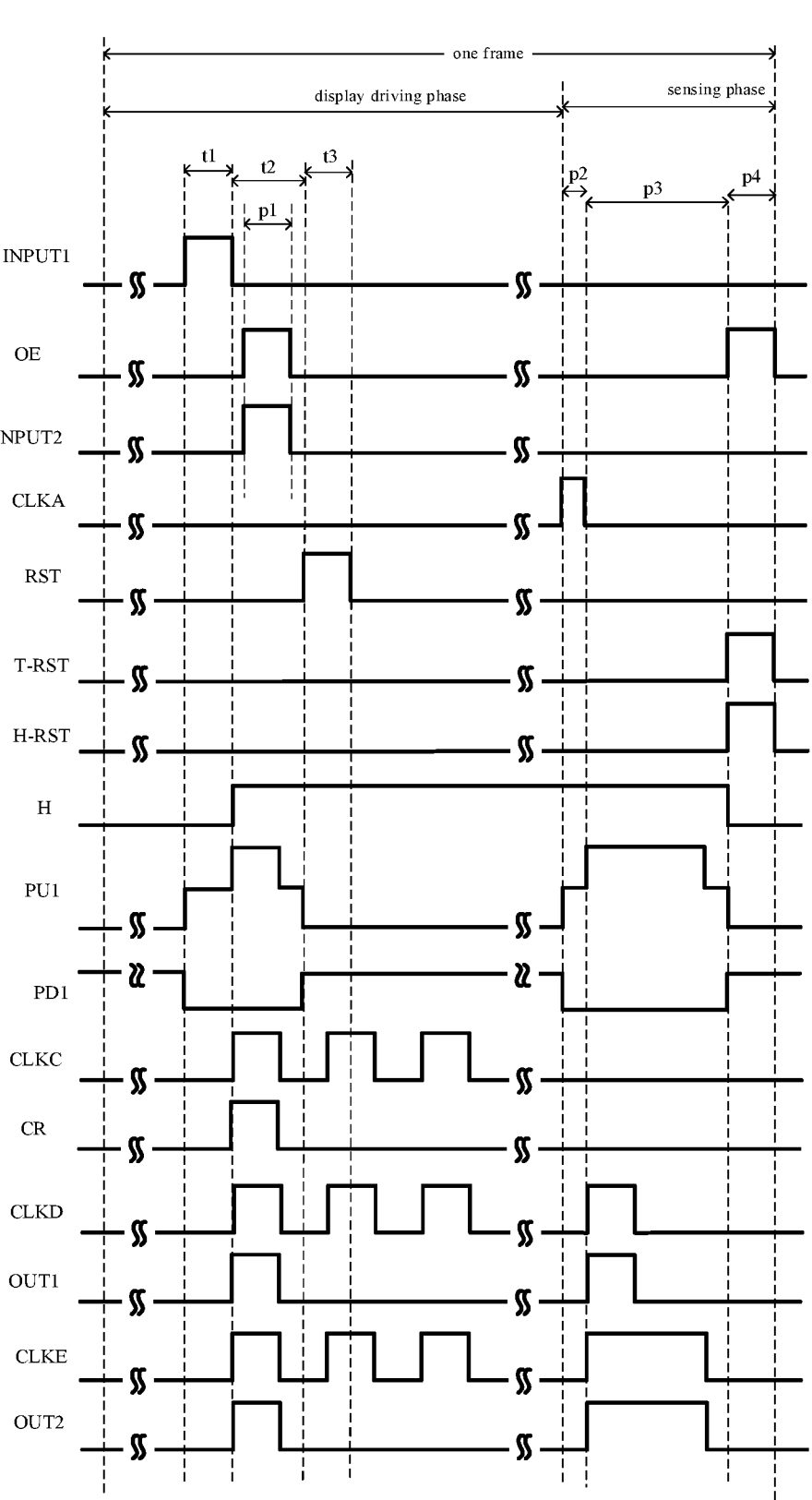
FIG. 12 is an operating timing diagram of the shift register unit shown in FIG. 11.

FIG. 12 is an operating timing diagram of the shift register unit shown in FIG. 11. As shown in FIG. 12, an operating process of the shift register unit includes: a display driving process, a sensing driving process, and a global reset process s1.

The display driving process includes: a display input phase t1, a display output phase t2, and a display reset phase t3; and the sensing driving process includes: a sensing preparation phase p1, a sensing input phase p2, a sensing output phase p3, and a sensing control reset phase p4.

In the display input phase t1, the display signal input terminal INPUT1 provides a high level signal, the ninth transistor M9 is turned on, the high level voltage VDD1 provided by the first power supply terminal is written to the first pull-up node PU1 through the ninth transistor M9, and the first pull-up node PU1 is in a high level state. Accordingly, the fifth transistor M5, the fifteenth transistor M15, and the sixteenth transistor M16 are all turned on.

When the first pull-up node PU1 is in the high level state, the thirteenth transistor M13 is turned on, the low level voltage VGL1 provided by the second power supply terminal is written to the first pull-down node PD1 through the thirteenth transistor M13, the first pull-down node PD1 is in a low level state, and the seventeenth transistor M17, the eighteenth transistor M18, and the nineteenth transistor M19 are all in an off state.

At this time, the first driving clock signal input terminal CLKE writes a low level signal to the first driving signal output terminal OUT2 through the fifth transistor M5; the second driving clock signal input terminal CLKD writes a low level signal to the second driving signal output terminal OUT1 through the fifteenth transistor M15; and the first cascade clock signal input terminal CLKC writes a low level signal to the first cascade signal output terminal CR through the sixteenth transistor M16. That is, the first driving signal output terminal OUT2, the second driving signal output terminal OUT1, and the first cascade signal output terminal CR all output low level signals.

In the display output phase t2, the display signal input terminal INPUT1 provides a low level signal, the ninth transistor M9 is turned off, and the first pull-up node PU1 is in a floating state and maintains the high level state as in the previous phase; and the fifth transistor M5, the fifteenth transistor M15, and the sixteenth transistor M16 all remain an on state.

At the beginning of the display output phase t2, the signal provided by the first driving clock signal input terminal CLKE changes from the low level signal to a high level signal, a voltage at the first pull-up node PU1 is pulled up to a higher level under a bootstrap action of the second capacitor C2, and the first driving signal output terminal OUT2 outputs a high level signal. After the display output phase t2 begins and continues for a period of time, the signal provided by the first driving clock signal input terminal CLKE changes from the high level signal to a low level signal, and the voltage at the first pull-up node PU1 is pulled down to the initial high level state under the bootstrap action of the second capacitor, the fifth transistor M5 remains an on state, and the first driving signal output terminal OUT2 outputs a low level signal.

Similarly, in the whole display output phase t2, both the second driving signal output terminal OUT1 and the first cascade signal output terminal CR first output high level signals and then output low level signals.

In the display reset phase t3, the display reset signal input terminal RST provides a high level signal, the tenth transistor M10 is turned on, a low level signal provided by the second power supply terminal is written to the first pull-up node PU1 through the tenth transistor M10, the first pull-up node PU1 is in a low level state, and the fifth transistor M5, the fifteenth transistor M15 and the sixteenth transistor M16 are all turned off.

At this time, the thirteenth transistor M13 is also turned off, the high level voltage VDDA provided by the fifth power supply terminal is written to the first pull-down node PD1 through the twelfth transistor M12, the first pull-down node PD1 is in a high level state, and the seventeenth transistor M17, the eighteenth transistor M18, and the nineteenth transistor M19 are all in an on state.

At this time, the fourth power supply terminal writes a low level signal to the first driving signal output terminal OUT2 through the seventeenth transistor M17: the fourth power supply terminal writes a low level signal to the second driving signal output terminal OUT1 through the eighteenth transistor M18; and the second power supply terminal writes a low level signal to the first cascade signal output terminal CR through the nineteenth transistor M19. That is, the first driving signal output terminal OUT2, the second driving signal output terminal OUT1, and the first cascade signal output terminal CR all output low level signals.

In addition, since the first pull-down node PD1 is in the high level state, the fourteenth transistor M14 is also turned on, and the low level voltage VGL1 provided by the second power supply terminal is written to the first pull-up node PU1 through the fourteenth transistor M14 to perform noise reduction on the first pull-up node PU1.

In the sensing preparation phase p1, the sensing signal input terminal INPUT2 and the random signal input terminal OE both provide high level signals, and at this time, the first transistor M1 and the fourth transistor M4 are both turned on; and the sensing active level supply terminal INT also provides a high level signal, so that the high level signal provided by the sensing active level supply terminal INT is written to the first sensing control node H1 through the first transistor M1 and the fourth transistor M4 to charge the first sensing control node H1, and the voltage at the first sensing control node H1 is in a high level state. Accordingly, the second transistor M2 is turned on. However, since the first clock control signal input terminal CLKA provides a low level signal, the third transistor M3 is turned off, so that a path between the sensing active level supply terminal INT and the first pull-up node PU1 is cut off.

In the sensing input phase p2, the first clock control signal input terminal CLKA provides a high level signal, so the third transistor M3 is turned on. At this time, the second transistor M2 remains an on state because the voltage at the first sensing control node H1 is in the high level state, and therefore, a high level signal provided by the sensing active level supply terminal INT is written to the first pull-up node PU1 through the second transistor M2 and the third transistor M3, i.e., the voltage at the first pull-up node PU1 is in a high level state.

Accordingly, the fifth transistor M5, the fifteenth transistor M15, and the sixteenth transistor M16 are all turned on.

When the first pull-up node PU1 is in the high level state, the thirteenth transistor M13 is turned on, the low level voltage VGL1 provided by the second power supply terminal is written to the first pull-down node PD1 through the thirteenth transistor M13, the first pull-down node PD1 is in a low level state, and the seventeenth transistor M17, the eighteenth transistor M18, and the nineteenth transistor M19 are all in an off state.

At this time, the first driving clock signal input terminal CLKE writes a low level signal to the first driving signal output terminal OUT2 through the fifth transistor M5; the second driving clock signal input terminal CLKD writes a low level signal to the second driving signal output terminal OUT1 through the fifteenth transistor M15; and the first cascade clock signal input terminal CLKC writes a low level signal to the first cascade signal output terminal CR through the sixteenth transistor M16. That is, the first driving signal output terminal OUT2, the second driving signal output terminal OUT1, and the first cascade signal output terminal CR all output low level signals.

In the sensing output phase p3, the first clock control signal input terminal CLKA provides a low level signal, so the third transistor M3 is turned off, and the path between the sensing active level supply terminal INT and the first pull-up node PU1 is cut off again. The first pull-up node PU1 is in a floating state and maintains the high level state as in the previous phase; and the fifth transistor M5, the fifteenth transistor M15, and the sixteenth transistor M16 all remain an on state.

At the beginning of the sensing output phase p3, the signal provided by the first driving clock signal input terminal CLKE changes from the low level signal to a high level signal, the voltage at the first pull-up node PU1 is pulled up to a higher level under the bootstrap action of the second capacitor C2, and the first driving signal output terminal OUT2 outputs a high level signal. After the sensing output phase p3 begins and continues for a period of time, the signal provided by the first driving clock signal input terminal CLKE changes from the high level signal to a low level signal, and the voltage at the first pull-up node PU1 is pulled down to the initial high level state under the bootstrap action of the second capacitor, the fifth transistor M5 remains an on state, and the first driving signal output terminal OUT2 outputs a low level signal.

Similarly, since the first driving clock signal input terminal CLKE also first provides the high level signal and then provides the low level signal in the whole sensing output phase p3, the second driving signal output terminal OUT1 first outputs the high level signal and then outputs the low level signal in the whole sensing output phase p3. The first cascade clock signal input terminal CLKC provides the low level signal during the whole sensing output phase p3, so the first cascade signal output terminal CR always outputs the low level signal in the whole sensing output phase p3.

In the sensing control reset phase p4, the control reset signal input terminal H-RST provides a high level signal, the sixth transistor M6 is turned on, and the low level voltage VGL1 provided by the second power supply terminal is written to the first sensing control node H1 through the sixth transistor M6 to reset the first sensing control node H1.

In the global reset process s1, the global reset signal input terminal T-RST provides a high level signal, the seventh transistor M7 is turned on, and the low level voltage VGL1 provided by the second power supply terminal is written to the first pull-up node PU1 through the seventh transistor M7 to reset the first pull-up node PU1.

When the first pull-up node PU1 is in the high level state, the high level voltage VDDA provided by the fifth power supply terminal is written to the first pull-down node PD1 through the twelfth transistor M12, the first pull-down node PD1 is in a high level state, and the seventeenth transistor M17, the eighteenth transistor M18, and the nineteenth transistor M19 are all in an on state.

It should be noted that the above case where the sensing signal input terminal INPUT2 and the first cascade signal output terminal CR are the same signal terminal and the control reset signal input terminal H-RST and the global reset signal input terminal T-RST are the same signal terminal is only an exemplary implementation of the embodiments of the present disclosure, and does not limit the technical solutions of the present disclosure.

In the embodiments of the present disclosure, a period during which the sensing signal input terminal INPUT2 and the random signal input terminal OE simultaneously provide the active level signals is the sensing preparation phase p1: a period during which the control reset signal input terminal H-RST provides the active level signal is the sensing control reset phase p4 (in a case where the sensing control circuit 1 adopts the structure shown in FIG. 5C, a period during which the control reset signal input terminal H-RST and the random signal input terminal OE simultaneously provide the active level signals is the sensing control reset phase p4).

In a case where the control reset signal input terminal H-RST and the global reset signal input terminal T-RST are different signal terminals, an order of the sensing preparation phase p1 may be adjusted as required. For example, the sensing preparation phase p1 may be before the display output phase t2, or within the display output phase t2, or after the display output phase t2, as long as it is ensured that the sensing preparation phase p1 is before the sensing input phase p2.

In the case where the control reset signal input terminal H-RST and the global reset signal input terminal T-RST are different signal terminals, an order of the sensing control reset phase p4 may be adjusted as required. For example, the sensing control reset phase p4 may be within the sensing input phase p2, or within the sensing output phase p3, or after the sensing output phase p3. A chronological order of the sensing control reset phase p4 and the global reset process s1 is not limited in the present disclosure. For example, the sensing control reset phase p4 may be before the global reset process s1, or may be performed simultaneously with the global reset process s1, or may be after the global reset process s1. In the embodiments of the present disclosure, it only needs to be ensured that the sensing control reset phase p4 is after the sensing input phase p2 and the global reset process s1 is after the sensing output phase p3.

Figure 13:
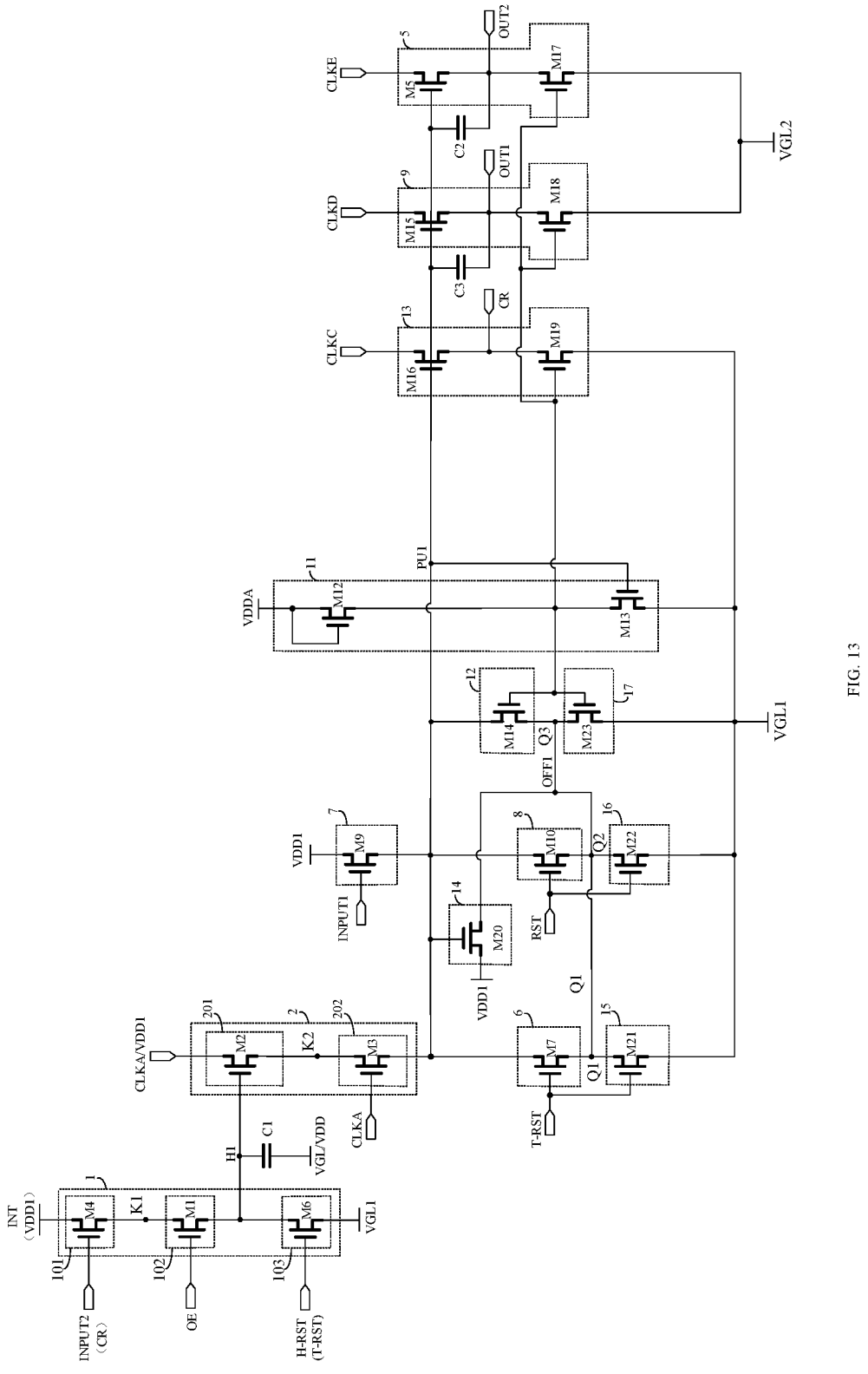
FIG. 13 is a schematic diagram showing yet another circuit structure of the shift register unit according to the embodiments of the present disclosure.

FIG. 13 is a schematic diagram showing yet another circuit structure of the shift register unit according to the embodiments of the present disclosure. As shown in FIG. 13, unlike the shift register unit provided in the above embodiments, the shift register unit provided by the present embodiment further includes: a first voltage control circuit 14; and the first voltage control circuit 14 is connected to the first power supply terminal, the first pull-up node PU1, and the first voltage control node OFF1, and is configured to write an active level signal provided by the first power supply terminal to the first voltage control node OFF1 in response to control of an active level signal at the first pull-up node PU1.

The shift register unit further includes at least one of a first anti-leakage circuit 15, a second anti-leakage circuit 16, and a third anti-leakage circuit 17.

The first global reset circuit 6 is connected to the second power supply terminal through the first anti-leakage circuit 15, and is connected to the first anti-leakage circuit 15 at a first anti-leakage node Q1, and the first anti-leakage node Q1 is connected to the first voltage control node OFF1. The first anti-leakage circuit 15 is connected to the global reset signal input terminal T-RST, and is configured to form a path between the first anti-leakage node Q1 and the second power supply terminal in response to control of an active level signal provided by the global reset signal input terminal T-RST, and cut off the path between the first anti-leakage node Q1 and the second power supply terminal in response to control of an inactive level signal provided by the global reset signal input terminal T-RST.

In an embodiment, in a same gate driving circuit, the global reset signal input terminals T-RST configured for the shift register units in different stages are connected to a same global reset signal input line TRST'. Reference may be made to the description below for details.

The first display reset circuit 8 is connected to the second power supply terminal through the second anti-leakage circuit 16, and is connected to the second anti-leakage circuit 16 at a second anti-leakage node Q2, and the second anti-leakage node Q2 is connected to the first voltage control node OFF1. The second anti-leakage circuit 16 is connected to the display reset signal input terminal RST, and is configured to form a path between the second anti-leakage node Q2 and the second power supply terminal in response to control of an active level signal provided by the display reset signal input terminal RST, and cut off the path between the second anti-leakage node Q2 and the second power supply terminal in response to control of an inactive level signal provided by the display reset signal input terminal RST.

In an embodiment, in a same gate driving circuit, the display reset signal input terminal RST configured for the shift register unit in any stage other than the last two stages is connected to the cascade signal output terminal of the shift register unit in one stage after the next stage. Reference may be made to the description below for details.

The first pull-up noise reduction circuit 12 is connected to the second power supply terminal through the third anti-leakage circuit 17, and is connected to the third anti-leakage circuit 17 at a third anti-leakage node Q3, and the third anti-leakage node Q3 is connected to the first voltage control node OFF1. The third anti-leakage circuit 17 is connected to the first pull-down node PD1, and is configured to form a path between the third anti-leakage node Q3 and the second power supply terminal in response to control of an active level signal at the first pull-down node PD1, and cut off the path between the third anti-leakage node Q3 and the second power supply terminal in response to control of an inactive level signal at the first pull-down node PD1.

In some embodiments, the first voltage control circuit 14 includes a twentieth transistor M20, a control electrode of the twentieth transistor M20 is connected to the first pull-up node PU1, a first electrode of the twentieth transistor M20 is connected to the first power supply terminal, and a second electrode of the twentieth transistor M20 is connected to the first voltage control node OFF1.

In some embodiments, the first anti-leakage circuit 15 includes a twenty-first transistor M21, a control electrode of the twenty-first transistor M21 is connected to the global reset signal input terminal T-RST, a first electrode of the twenty-first transistor M21 is connected to the global reset circuit and the first voltage control node OFF1, and a second electrode of the twenty-second transistor M22 is connected to the second power supply terminal.

In some embodiments, the second anti-leakage circuit 16 includes a twenty-second transistor M22, a control electrode of the twenty-second transistor M22 is connected to the display reset signal input terminal RST, a first electrode of the twenty-second transistor M22 is connected to the display reset circuit and the first voltage control node OFF1, and a second electrode of the twenty-second transistor M22 is connected to the second power supply terminal.

In some embodiments, the third anti-leakage circuit 17 includes: a twenty-third transistor M23, a control electrode of the twenty-third transistor M23 is connected to the first pull-down node PD1, a first electrode of the twenty-third transistor M23 is connected to the first pull-down control circuit and the first voltage control node OFF1, and a second electrode of the twenty-third transistor M23 is connected to the second power supply terminal.

It should be noted that FIG. 13 illustrates an exemplary case where the shift register unit includes all the first anti-leakage circuit 15, the second anti-leakage circuit 16, and the third anti-leakage circuit 17. In practical applications, at least one of the first anti-leakage circuit 15, the second anti-leakage circuit 16, and the third anti-leakage circuit 17 may be configured according to actual needs.

It should be noted that the shift register unit shown in FIG. 11 or FIG. 13 may optionally include the third voltage control circuit described in the above embodiments, or may include both the third voltage control circuit and the control reset anti-leakage circuit described in the above embodiments, or may optionally include the first sensing input anti-leakage circuit. Technical solutions obtained by combining different embodiments also belong to the protection scope of the present disclosure.

Figure 14:
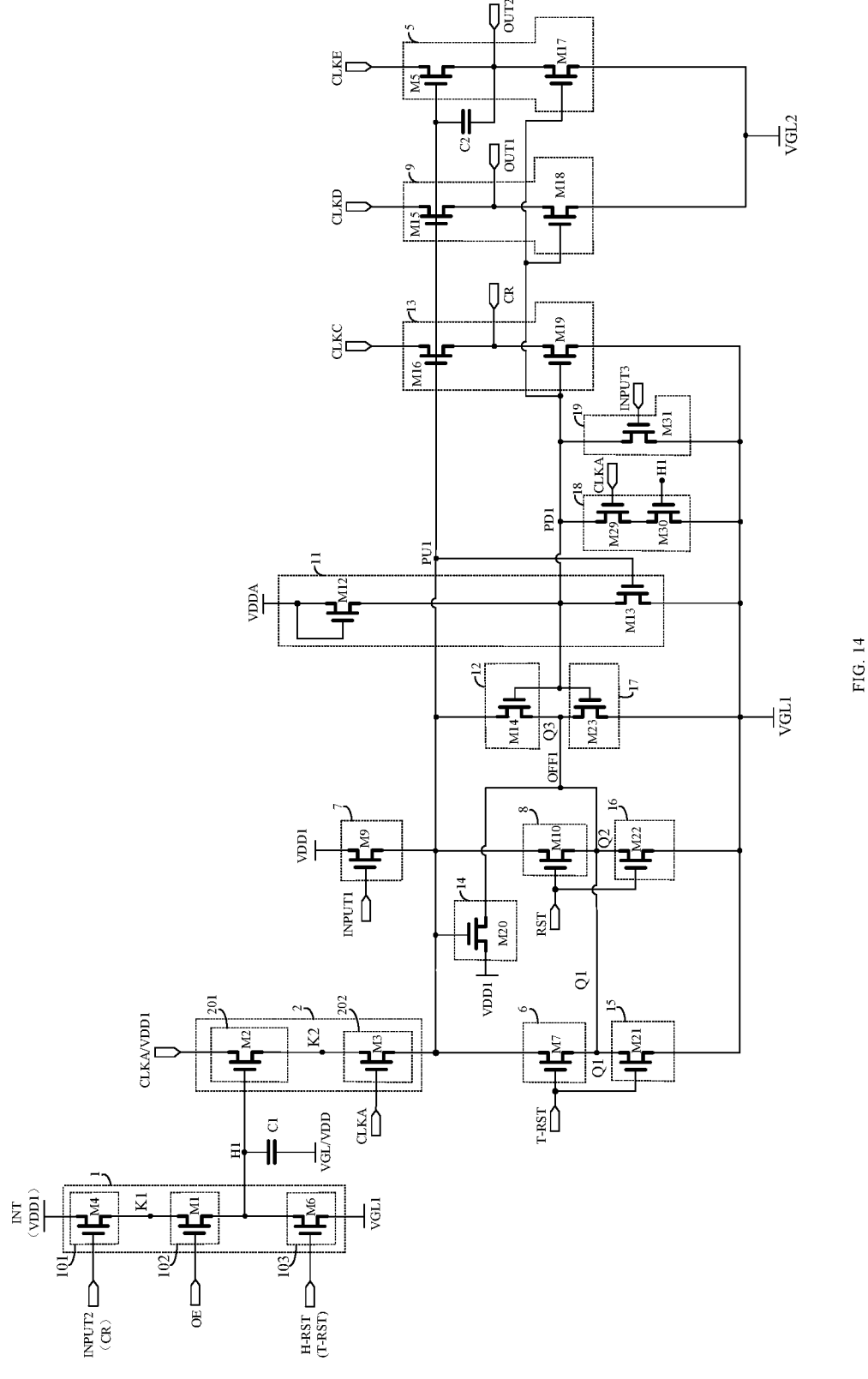
FIG. 14 is a schematic diagram showing yet another circuit structure of the shift register unit according to the embodiments of the present disclosure.

FIG. 14 is a schematic diagram showing yet another circuit structure of the shift register unit according to the embodiments of the present disclosure. As shown in FIG. 14, in some embodiments, the shift register unit further includes: a first pull-down noise reduction circuit 18 and/or a second pull-down noise reduction circuit 19.

The first pull-down noise reduction circuit 18 is connected to the first pull-down node PD1, the second power supply terminal, the first sensing control node H1, and the clock control signal input terminal CLKA, and is configured to write an inactive level signal provided by the second power supply terminal to the first pull-down node PD1 in response to control of an active level signal at the first sensing control node H1 and an active level signal provided by the clock control signal input terminal CLKA to perform noise reduction on a voltage at the first pull-down node PD1.

The second pull-down noise reduction circuit 19 is connected to the first pull-down node PD1, the second power supply terminal, and a pull-down noise reduction signal input terminal INPUT3, and is configured to write an inactive level signal provided by the second power supply terminal to the first pull-down node PD1 in response to control of an active level signal provided by the pull-down noise reduction signal input terminal INPUT3 to perform noise reduction on the voltage at the first pull-down node PD1.

In some embodiments, the pull-down noise reduction signal input terminal INPUT3 may be the first cascade signal output terminal of the shift register unit in the previous stage.

In some embodiments, the first pull-down noise reduction circuit 18 includes a twenty-ninth transistor M29 and a thirtieth transistor M30, and the second pull-down noise reduction circuit 19 includes a thirty-first transistor M31.

A control electrode of the twenty-ninth transistor M29 is connected to the clock control signal input terminal CLKA, a first electrode of the twenty-ninth transistor M29 is connected to the first pull-down node PD1, and a second electrode of the twenty-ninth transistor M29 is connected to a first electrode of the thirtieth transistor M30.

A control electrode of the thirtieth transistor M30 is connected to the first sensing control node H1, and a second electrode of the thirtieth transistor M30 is connected to the second power supply terminal.

A control electrode of the thirty-first transistor M31 is connected to the pull-down noise reduction signal input terminal INPUT3, a first electrode of the thirty-first transistor M31 is connected to the first pull-down node PD1, and a second electrode of the thirty-first transistor M31 is connected to the second power supply terminal.

Figure 15:
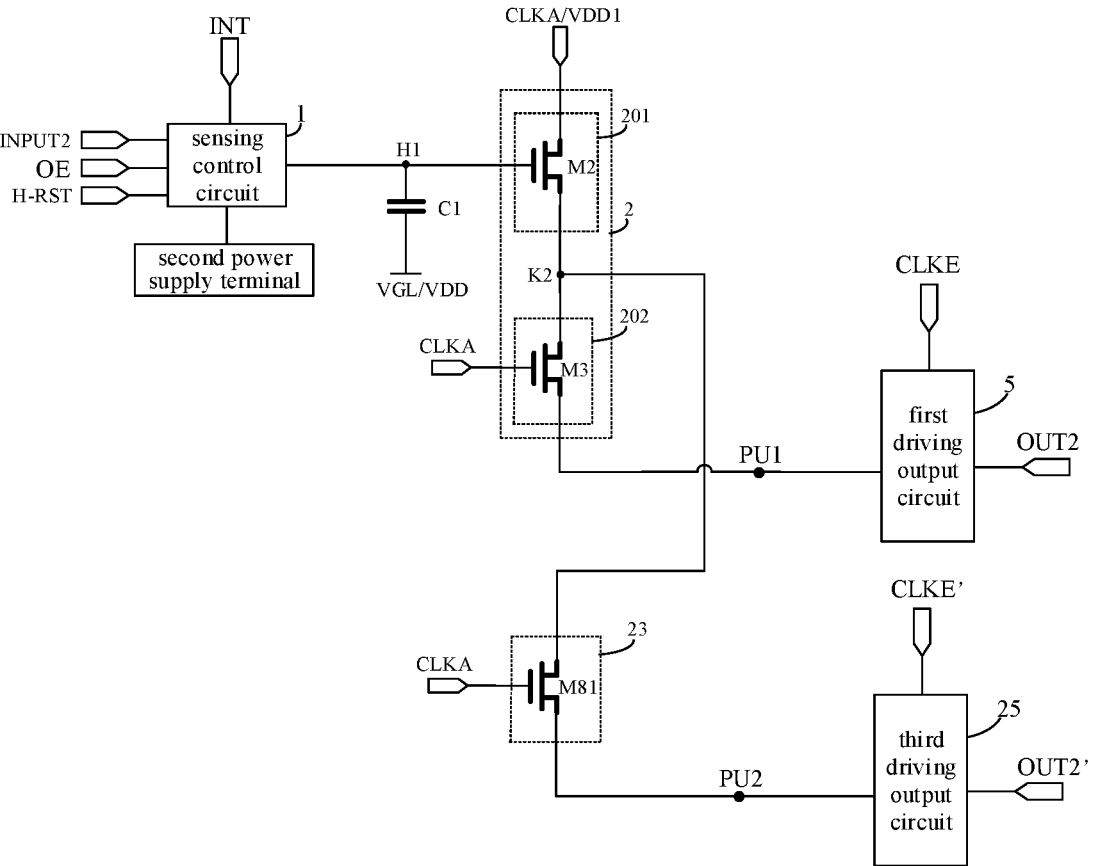
FIG. 15 is a schematic diagram showing yet another circuit structure of the shift register unit according to the embodiments of the present disclosure.

FIG. 15 is a schematic diagram showing yet another circuit structure of the shift register unit according to the embodiments of the present disclosure. As shown in FIG. 15, in some embodiments, the first sensing input circuit 2 includes: a first input response circuit 201 and a second input response circuit 202.

The first input response circuit 201 is connected to an input active level supply terminal, the first sensing control node H1, and a sensing input intermediate node K2, and is configured to write a signal provided by the input active level supply terminal to the sensing input intermediate node K2 in response to control of an active level signal at the first sensing control node H1.

The second input response circuit 202 is connected to the sensing input intermediate node K2, the clock control signal input terminal CLKA, and the first pull-up node PU1, and is configured to write a voltage at the sensing input intermediate node K2 to the first pull-up node PU1 in response to control of an active level signal provided by the clock control signal input terminal CLKA.

The shift register unit further includes: a second sensing input circuit 23 and a third driving output circuit 25.

The second sensing input circuit 23 is connected to the sensing input intermediate node K2, the clock control signal input terminal CLKA, and a second pull-up node PU2, and is configured to write a voltage at the sensing input intermediate node K2 to the second pull-up node PU2 in response to control of an active level signal provided by the clock control signal input terminal CLKA.

The third driving output circuit 25 is connected to the second pull-up node PU2, a third driving clock signal input terminal CLKE', and a third driving signal output terminal OUT2', and is configured to write a signal provided by the third driving clock signal input terminal CLKE' to the third driving signal output terminal OUT2' in response to control of an active level signal at the second pull-up node PU2.

In some embodiments, the second sensing input circuit 23 includes: an eighty-first transistor M81.

A control electrode of the eighty-first transistor M81 is connected to the clock control signal input terminal CLKA, a first electrode of the eighty-first transistor M81 is connected to the sensing input intermediate node K2, and a second electrode of the eighty-first transistor M81 is connected to the second pull-up node PU2.

In the embodiments of the present disclosure, by providing the second sensing input circuit 23 and the third driving output circuit 25, the third driving output circuit 25 can be used to provide a driving signal for a second gate line other than the second gate line connected to the first driving output circuit 5 in the display panel. That is, the shift register unit provided by the embodiments of the present disclosure can be used to respectively provide the driving signals for two different second gate lines in the display panel, that is, can drive two rows of pixel units. With such design, the number of stages of shift register units in a gate driving circuit can be effectively reduced, a region occupied by the gate driving circuit can be reduced, and the narrow frame design of the product can be facilitated.

Figure 16:
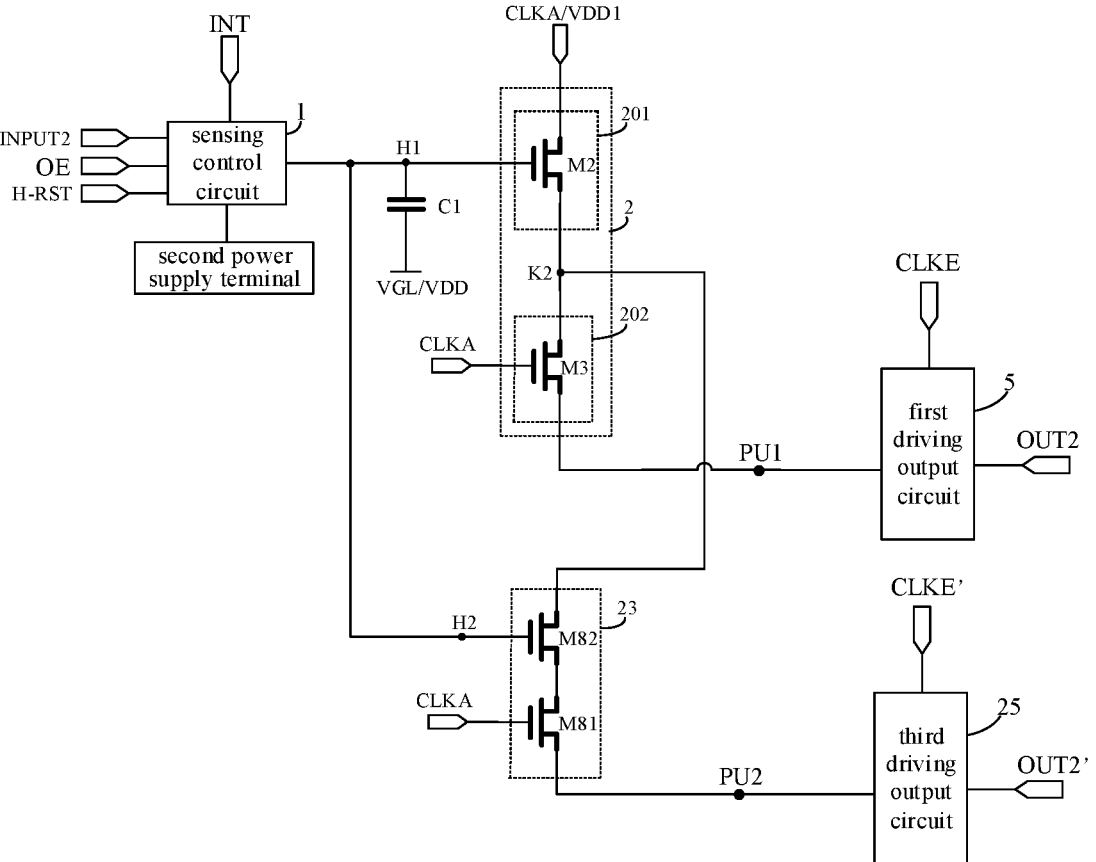
FIG. 16 is a schematic diagram showing yet another circuit structure of the shift register unit according to the embodiments of the present disclosure.

FIG. 16 is a schematic diagram showing yet another circuit structure of the shift register unit according to the embodiments of the present disclosure. As shown in FIG. 16, unlike the case illustrated in FIG. 15 where the second sensing input circuit 23 is connected to the sensing input intermediate node K2, the shift register unit according to the embodiment illustrated in FIG. 16 is provided therein with a second sensing control node H2.

The second sensing input circuit 23 is connected to the second sensing control node H2, the clock control signal input terminal CLKA, and the second pull-up node PU2, and is configured to write an active level signal to the second pull-up node PU2 in response to control of an active level signal at the second sensing control node H2 and an active level signal provided by the clock control signal input terminal; and the second sensing control node H2 is connected to the first sensing control node H1.

The third driving output circuit 25 is connected to the second pull-up node PU2, the third driving clock signal input terminal CLKE', and the third driving signal output terminal OUT2', and is configured to write a signal provided by the third driving clock signal input terminal CLKE' to the third driving signal output terminal OUT2' in response to control of an active level signal at the second pull-up node PU2.

It should be noted that, in the present embodiment, when the control reset circuit 103 is used to reset the first sensing control node H1, the second sensing control node H2 can be reset synchronously because the first sensing control node H1 is connected to the second sensing control node H2.

In some embodiments, the second sensing input circuit 23 includes: an eighty-first transistor M81 and an eighty-second transistor M82.

A control electrode of the eighty-first transistor M81 is connected to the clock control signal input terminal CLKA, a first electrode of the eighty-first transistor M81 is connected to a second electrode of the eighty-second transistor M82, and a second electrode of the eighty-first transistor M81 is connected to the second pull-up node PU2.

A control electrode of the eighty-second transistor M82 is connected to the second sensing control node H2, and a first electrode of the eighty-second transistor M82 is connected to the input active level supply terminal.

Figure 17A:
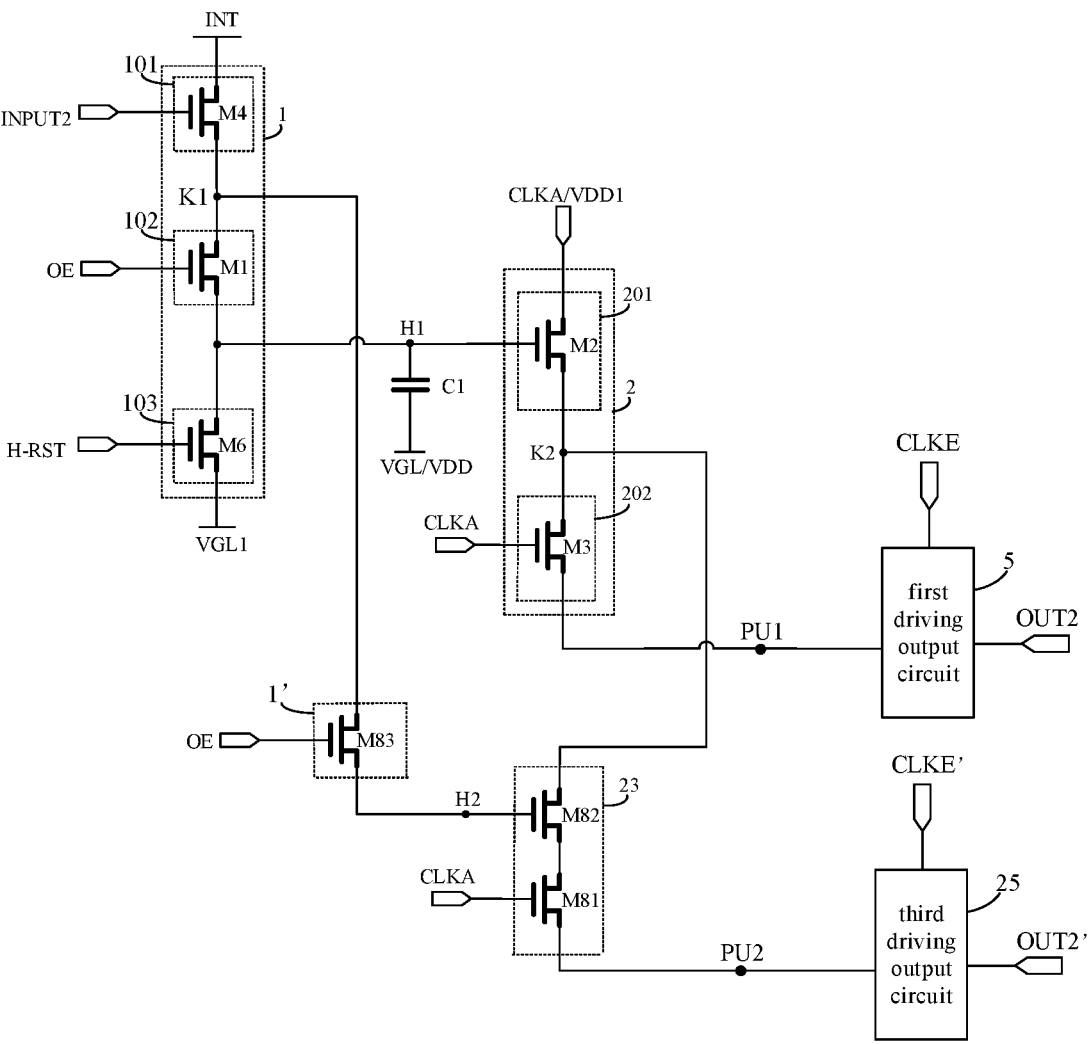
FIG. 17A and FIG. 17B are schematic diagrams showing yet another two circuit structures of the shift register unit according to the embodiments of the present disclosure.
Figure 17B:
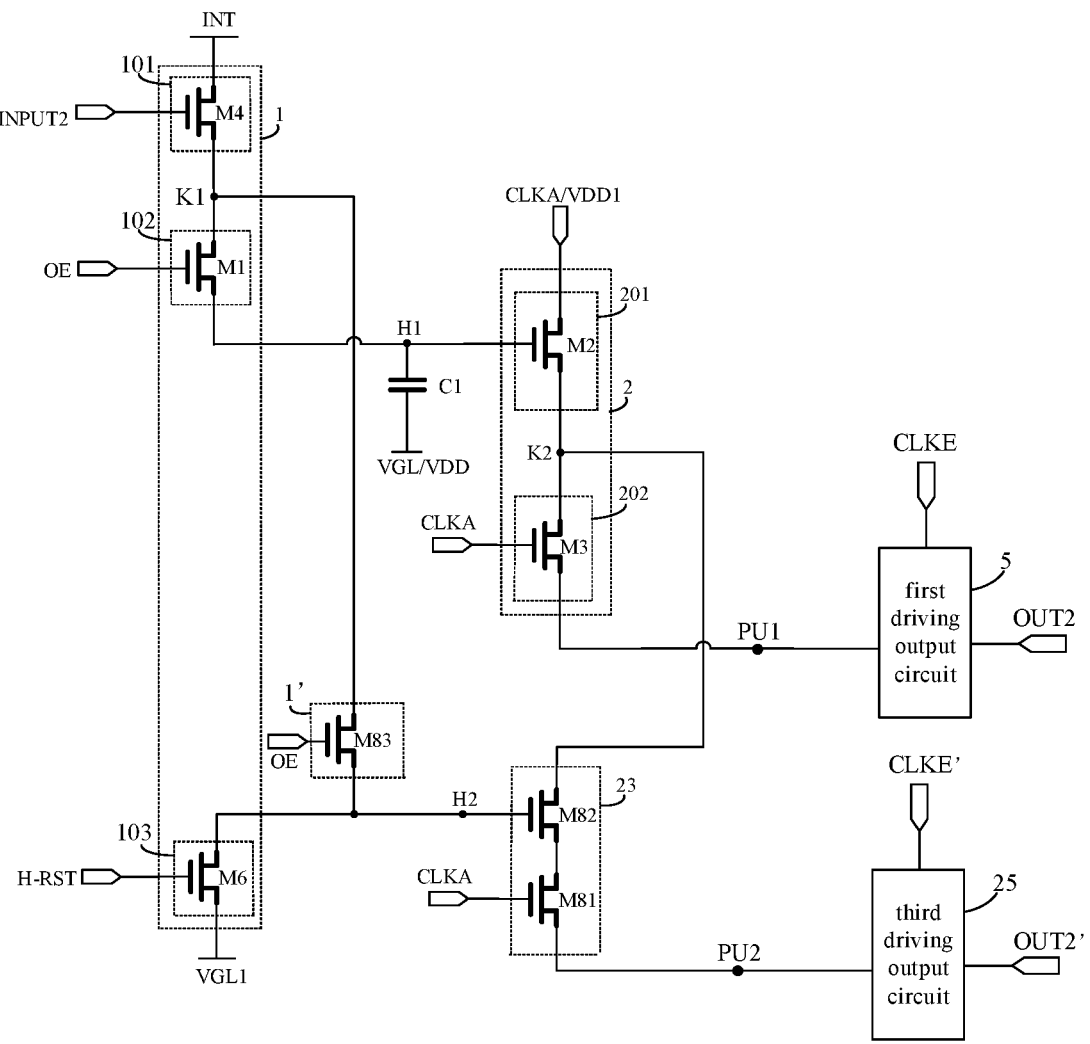
Figure 18A:
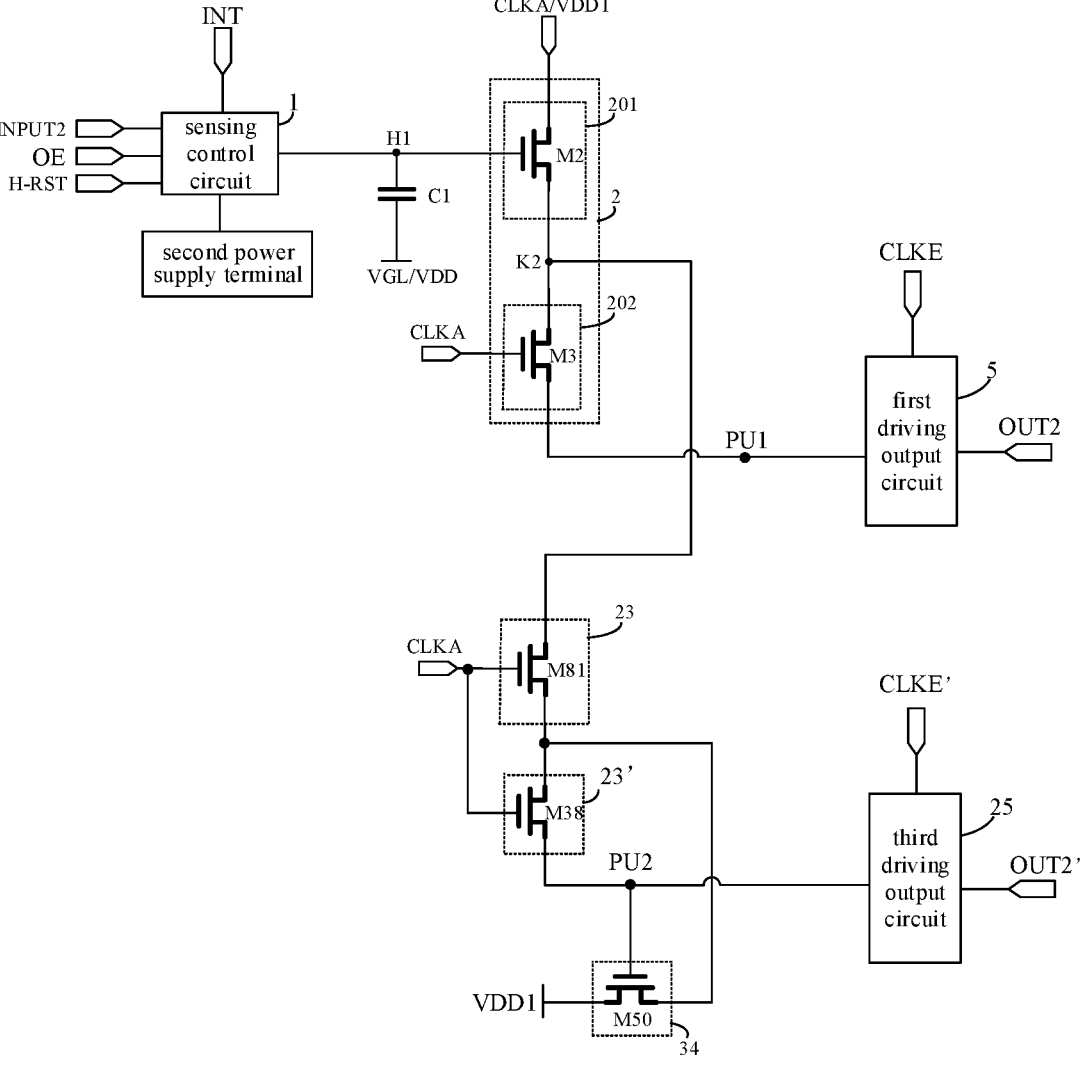
FIGS. 18A to 18D are schematic diagrams showing yet another four circuit structures of the shift register unit according to the embodiments of the present disclosure.
Figure 18B:
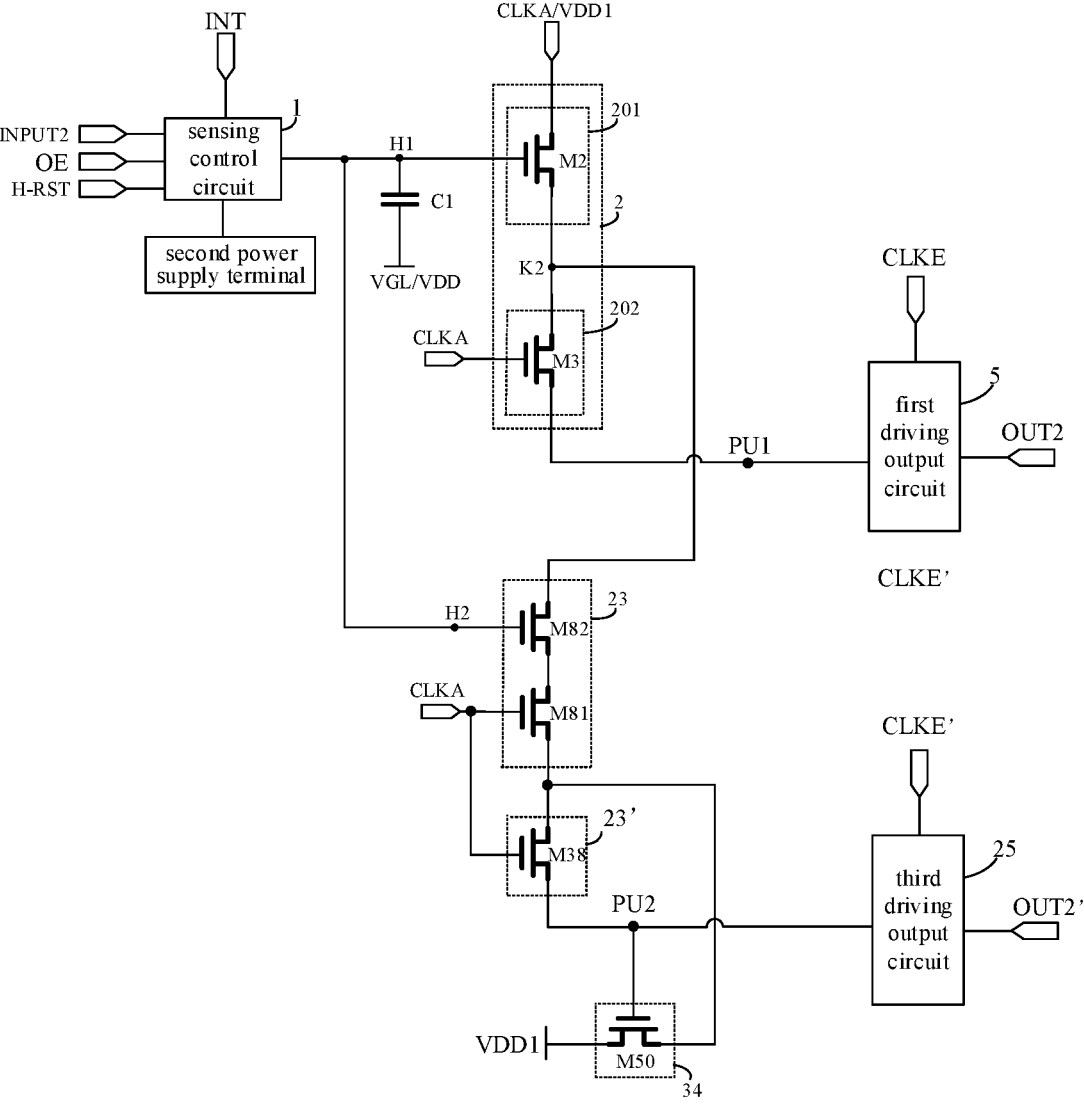
Figure 18C:
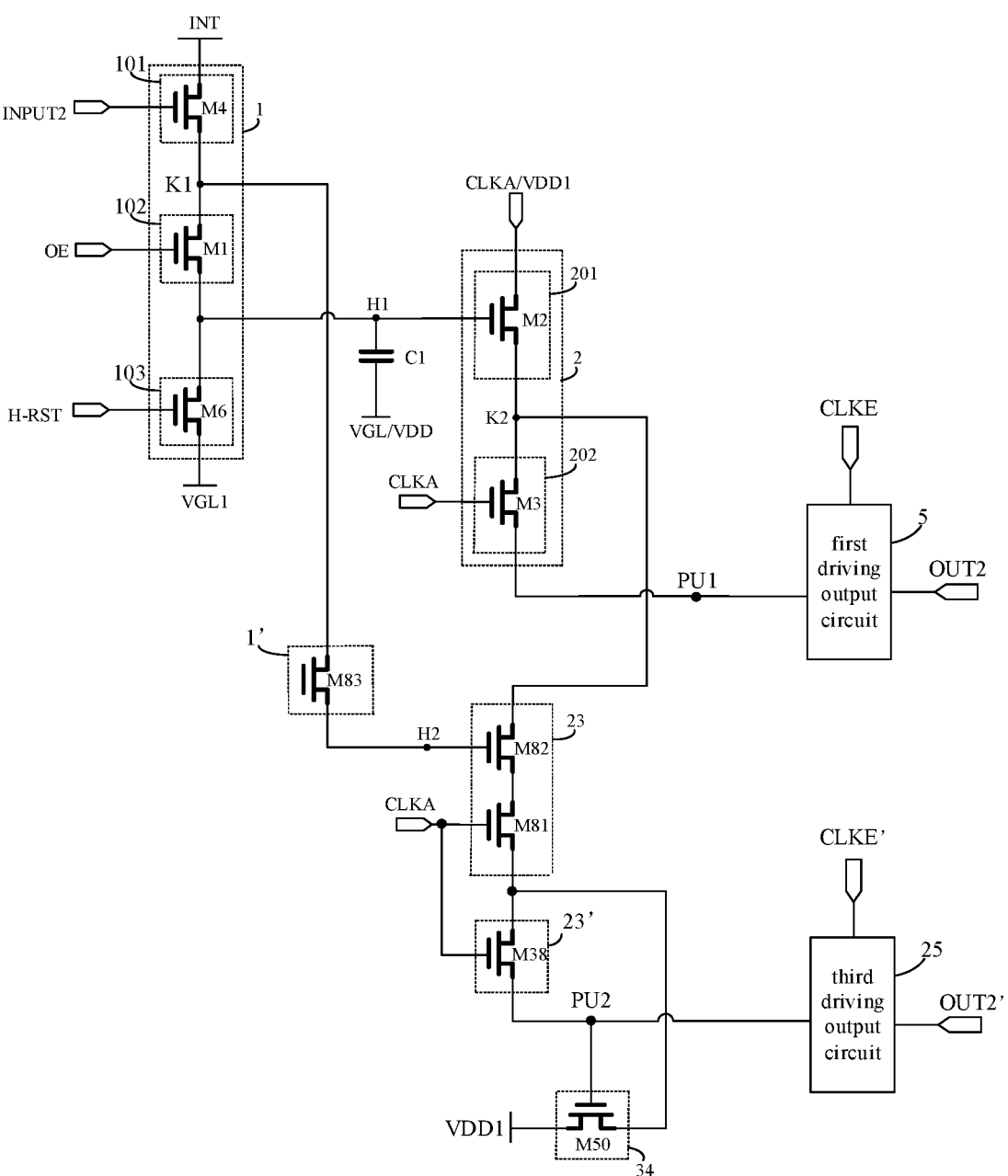
Figure 18D:
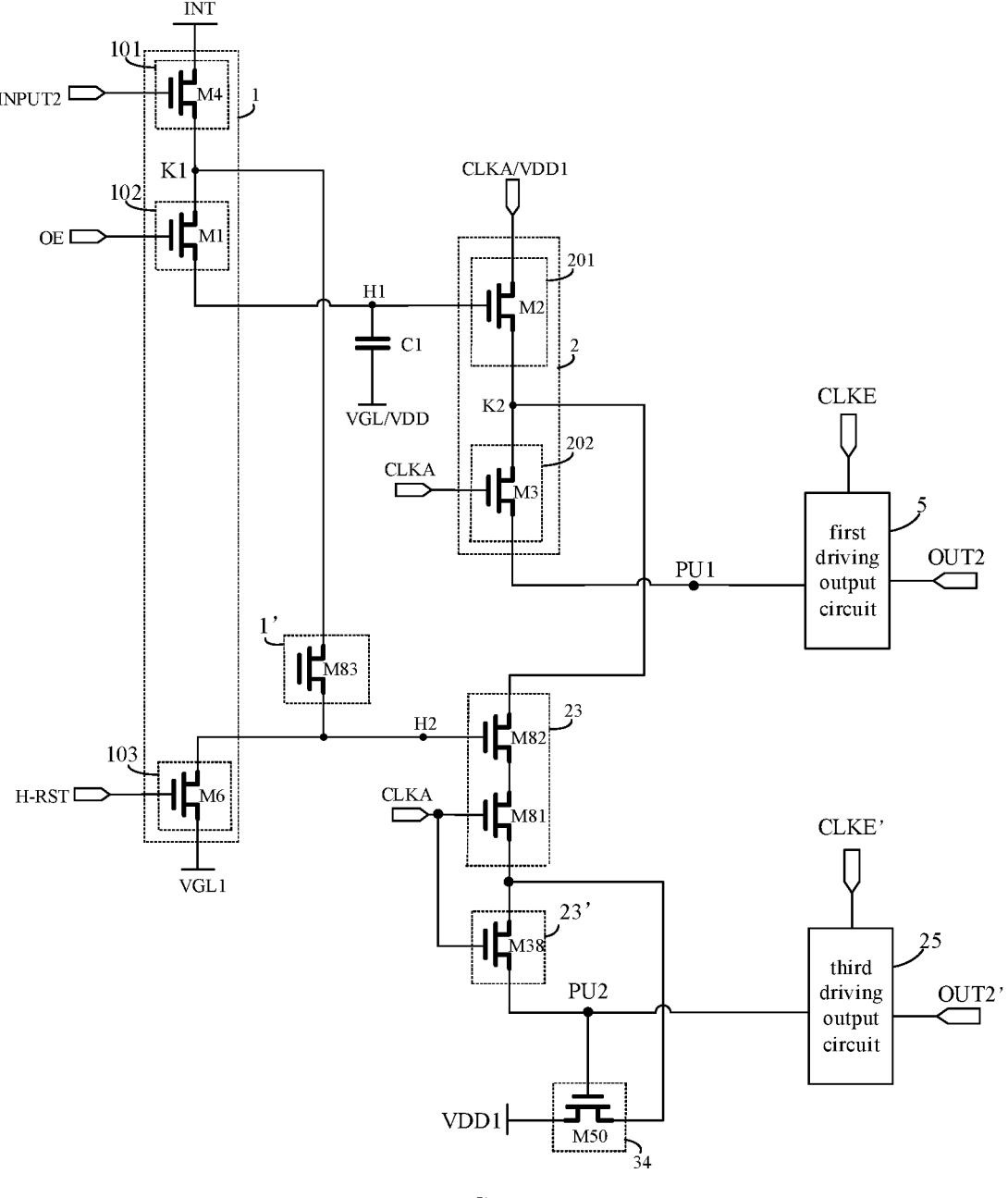

FIG. 17A and FIG. 17B are schematic diagrams showing yet another two circuit structures of the shift register unit according to the embodiments of the present disclosure. As shown in FIG. 17A and FIG. 17B, unlike the case illustrated in FIG. 16 where the second sensing input circuit 23 is connected to the sensing input intermediate node K2 and the second sensing control node H2 is directly connected to the first sensing control node H1, the shift register units shown in FIG. 17A and FIG. 17B are also provided therein with the second sensing control node H2, but instead of being directly connected to the first sensing control node H1, the second sensing control node H2 is connected to a sensing control intermediate node K1 in the sensing control circuit 1 through a third control input circuit 1'.

In an embodiment, the sensing control circuit 1 includes: a first control input circuit 101 and a second control input circuit 102.

The first control input circuit 101 is connected to the sensing active level supply terminal INT, the sensing control intermediate node K1, and a first control signal input terminal, and is configured to write a signal provided by the sensing active level supply terminal INT to the sensing control intermediate node K1 in response to control of an active level signal provided by the first control signal input terminal. The first control signal input terminal is the sensing signal input INPUT2.

The second control input circuit 102 is connected to the sensing control intermediate node K1, the first sensing control node H1, and a second control signal input terminal, and is configured to write a signal at the sensing control intermediate node K1 to the first sensing control node H1 in response to control of an active level signal provided by the second control signal input terminal. The second control signal input terminal is the random signal input terminal OE.

The shift register unit further includes: the third control input circuit 1', the second sensing input circuit 23, and the third driving output circuit 25.

The third control input circuit 1' is connected to the sensing control intermediate node K1, the second sensing control node H2, and the random signal input terminal OE, and is configured to write a signal at the sensing control intermediate node K1 to the second sensing control node H2 in response to control of an active level signal provided by the random signal input terminal OE.

The second sensing input circuit 23 is connected to the second sensing control node H2, the clock control signal input terminal CLKA, and the second pull-up node PU2, and is configured to write an active level signal to the second pull-up node PU2 in response to control of an active level signal at the second sensing control node H2 and an active level signal provided by the clock control signal input terminal; and the second sensing control node H2 is connected to the first sensing control node H1.

The third driving output circuit 25 is connected to the second pull-up node PU2, the third driving clock signal input terminal CLKE', and the third driving signal output terminal OUT2', and is configured to write a signal provided by the third driving clock signal input terminal CLKE' to the third driving signal output terminal OUT2' in response to control of an active level signal at the second pull-up node PU2.

The sensing control circuit 1 further includes: a control reset circuit 103; and the control reset circuit 103 is connected to the second power supply terminal, a preset node, and the control reset signal input terminal H-RST, and is configured to write an inactive level signal provided by the second power supply terminal to the preset node in response to control of an active level signal provided by the control reset signal input terminal H-RST. The preset node is one of the sensing control intermediate node K1, the first sensing control node H1, and the second sensing control node H2. It should be noted that FIG. 17A illustrates a case where the preset node is the first sensing control node H1 (i.e., the control reset circuit 103 is connected to the first sensing control node H1), and FIG. 17B illustrates a case where the preset node is the second sensing control node H2 (i.e., the control reset circuit 103 is connected to the second sensing control node H2).

It should be noted that, in the case where the control reset circuit 103 is connected to the first sensing control node H1 (illustrated in FIG. 17A), in a process of resetting the first sensing control node H1 by the control reset circuit 103, the random signal input terminal OE may be used to synchronously turn on the second control input circuit 102 and the third control input circuit 1', so as to form a path between the first sensing control node H1 and the second sensing control node H2, thereby synchronously resetting the second sensing control node H2.

In the case where the control reset circuit 103 is connected to the second sensing control node H2, the random signal input terminal OE needs to be used to control the second control input circuit 102 and the third control input circuit 1' to be turned on, so as to form a path between the first sensing control node H1 and the second sensing control node H2. At this time, an inactive level signal output by the control reset circuit 103 can be written to the first sensing control node H1 through the second sensing control node H2, the third control input circuit 1', and the second control input circuit 102, so that the first sensing control node H1 and the second sensing control node H2 can be synchronously reset.

In some embodiments, the second sensing input circuit 23 includes: an eighty-first transistor M81 and an eighty-second transistor M82. A control electrode of the eighty-first transistor M81 is connected to the clock control signal input terminal CLKA, a first electrode of the eighty-first transistor M81 is connected to a second electrode of the eighty-second transistor M82, and a second electrode of the eighty-first transistor M81 is connected to the second pull-up node PU2. A control electrode of the eighty-second transistor M82 is connected to the second sensing control node H2, and a first electrode of the eighty-second transistor M82 is connected to the input active level supply terminal.

The third control input circuit 1' includes: an eighty-third transistor M83. A control electrode of the eighty-third transistor M83 is connected to the random signal input terminal OE, a first electrode of the eighty-third transistor M83 is connected to the sensing control intermediate node K1, and a second electrode of the eighty-third transistor M83 is connected to the second sensing control node H2.

It should be noted that FIG. 17A and FIG. 17B illustrate exemplary cases where the control reset circuit 103 includes a sixth transistor M6; and a control electrode of the sixth transistor M6 is connected to the control reset signal input terminal H-RST, a first electrode of the sixth transistor M6 is connected to the first sensing control node H1 (shown in FIG. 17A) or the second sensing control node H2 (shown in FIG. 17B), and a second electrode of the sixth transistor M6 is connected to the second power supply terminal.

FIGS. 18A to 18D are schematic diagrams showing yet another four circuit structures of the shift register unit according to the embodiments of the present disclosure. As shown in FIGS. 18A to 18D, FIGS. 18A, 18B, 18C, and 18D respectively illustrate the cases where the shift register units illustrated in FIGS. 15, 16, 17A, and 17B are provided with a second voltage control circuit and a second sensing input anti-leakage circuit.

In some embodiments, the shift register unit includes: a second voltage control circuit 34 and a second sensing input anti-leakage circuit 23".

The second voltage control circuit 34 is connected to the first power supply terminal, the second pull-up node PU2, and a second voltage control node OFF2, and is configured to write an active level signal provided by the first power supply terminal to the second voltage control node OFF2 in response to control of an active level signal at the second pull-up node PU2.

The shift register unit further includes: the second sensing input anti-leakage circuit 23'.

The second sensing input circuit 23 is connected to the second pull-up node PU2 through the second sensing input anti-leakage circuit 23', and is connected to the second sensing input anti-leakage circuit 23' at a second sensing input anti-leakage node, and the second sensing input anti-leakage node is connected to the second voltage control node OFF2. The second sensing input anti-leakage circuit 23' is connected to the clock control signal input terminal CLKA, and is configured to form a path between the second sensing input anti-leakage node and the second pull-up node PU2 in response to control of an active level signal at the clock control signal input terminal CLKA, and cut off the path between the second sensing input anti-leakage node and the second pull-up node PU2 in response to control of an inactive level signal at the clock control signal input terminal CLKA.

Like the functions of the second voltage control circuit 34 and the first sensing input anti-leakage circuit provided in the above embodiments, the second voltage control circuit 34 and the second sensing input anti-leakage circuit 23' provided in the embodiment of the present disclosure can effectively prevent the first pull-up node PU1 from generating an electric leakage through the second sensing input circuit 23.

In some embodiments, the second voltage control circuit 34 includes: a fiftieth transistor M50; and a control electrode of the fiftieth transistor M50 is connected to the second pull-up node PU2, a first electrode of the fiftieth transistor M50 is connected to the first power supply terminal, and a second electrode of the fiftieth transistor M50 is connected to the second voltage control node OFF2.

The second sensing input anti-leakage circuit 23' includes: a thirty-eighth transistor M38; and a control electrode of the thirty-eighth transistor M38 is connected to the clock control signal input terminal CLKA, a first electrode of the thirty-eighth transistor M38 is connected to the second sensing input circuit 23, and a second electrode of the thirty-eighth transistor M38 is connected to the second pull-up node PU2.

Figure 19:
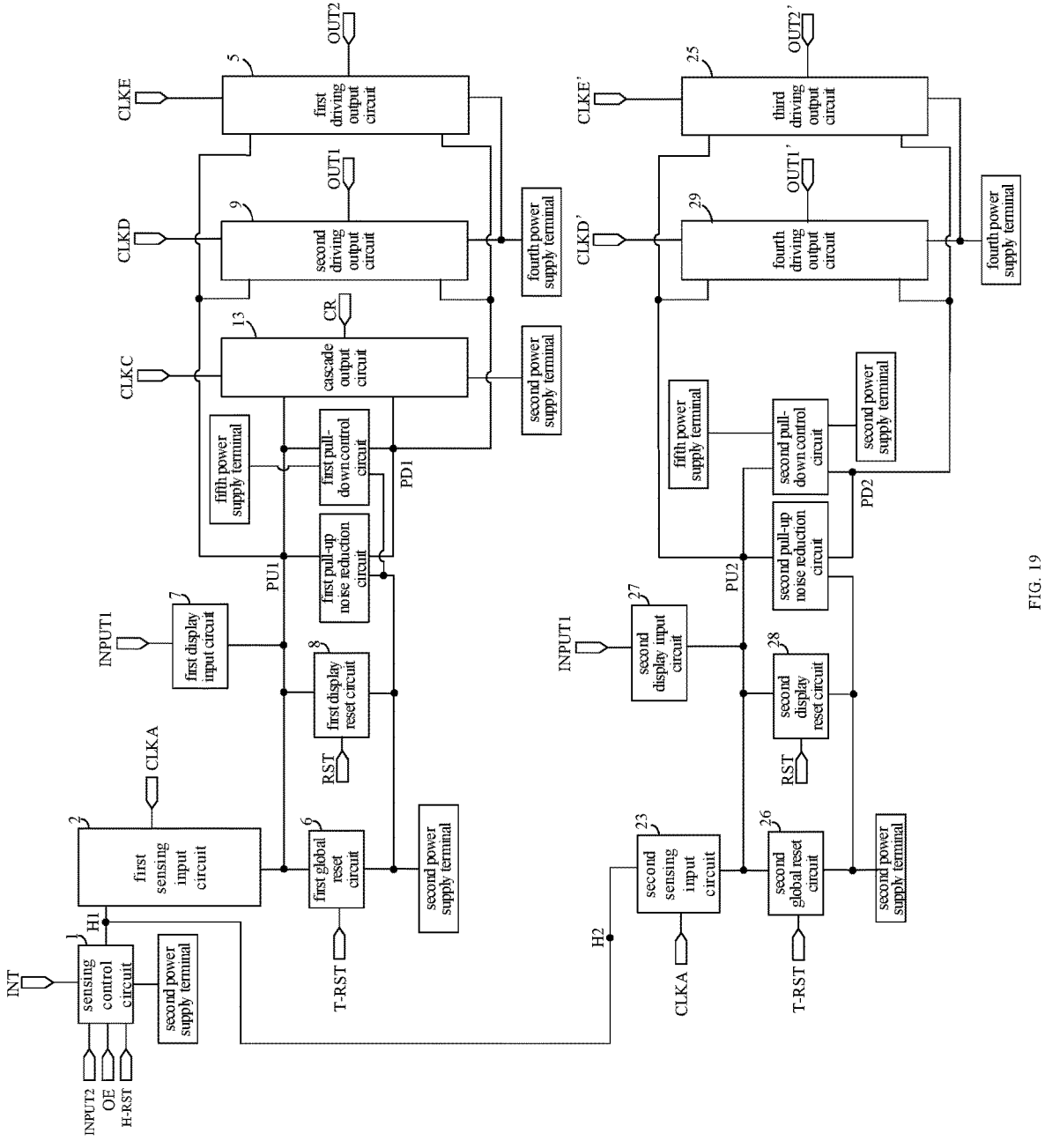
FIG. 19 is a schematic diagram showing yet another circuit structure of the shift register unit according to the embodiments of the present disclosure.

FIG. 19 is a schematic diagram showing yet another circuit structure of the shift register unit according to the embodiments of the present disclosure. As shown in FIG. 19, in some embodiments, the shift register unit further includes: a second display input circuit 27, a second display reset circuit 28, and a fourth driving output circuit 29.

The second display input circuit 27 is connected to the display signal input terminal INPUT1 and the second pull-up node PU2, and is configured to write an active level signal to the second pull-up node PU2 in response to control of an active level signal provided by the display signal input terminal INPUT1.

The second display reset circuit 28 is connected to the display reset signal input terminal RST, the second power supply terminal, and the second pull-up node PU2, and is configured to write an inactive level signal provided by the second power supply terminal to the second pull-up node PU2 in response to control of an active level signal provided by the display reset signal input terminal RST.

A fourth driving output circuit 29 is connected to the second pull-up node PU2, a fourth driving clock signal input terminal CLKD', and a fourth driving signal output terminal OUT1', and is configured to write a signal provided by the fourth driving clock signal input terminal CLKD' to the fourth driving signal output terminal OUT1' in response to control of an active level signal at the second pull-up node PU2.

The fourth driving output circuit 29 can provide a driving signal for a first gate line G1 other than the first gate line G1 connected to the second driving output circuit 9 on the display panel.

In the embodiments of the present disclosure, in a case where the shift register unit includes all the first driving output circuit 5, the second driving output circuit 9, the third driving output circuit 25, and the fourth driving output circuit 29, the first driving output circuit 5 and the second driving output circuit 9 may be configured to respectively provide corresponding driving signals for one first gate line and one second gate line configured for a certain row of pixel units in the display panel. Meanwhile, the third driving output circuit 25 and the fourth driving output circuit 29 may be configured to respectively provide corresponding driving signals for one first gate line and one second gate line configured for another row of pixel units in the display panel. That is, the shift register unit provided in the embodiments of the present disclosure can be configured to drive four gate lines configured for two rows of pixel units (e.g., two adjacent rows of pixel units). With such design, the number of the stages of the shift register units in the gate driving circuit can be effectively reduced, the region occupied by the gate driving circuit can be reduced, and the narrow frame design of the product can be facilitated.

Figure 20:
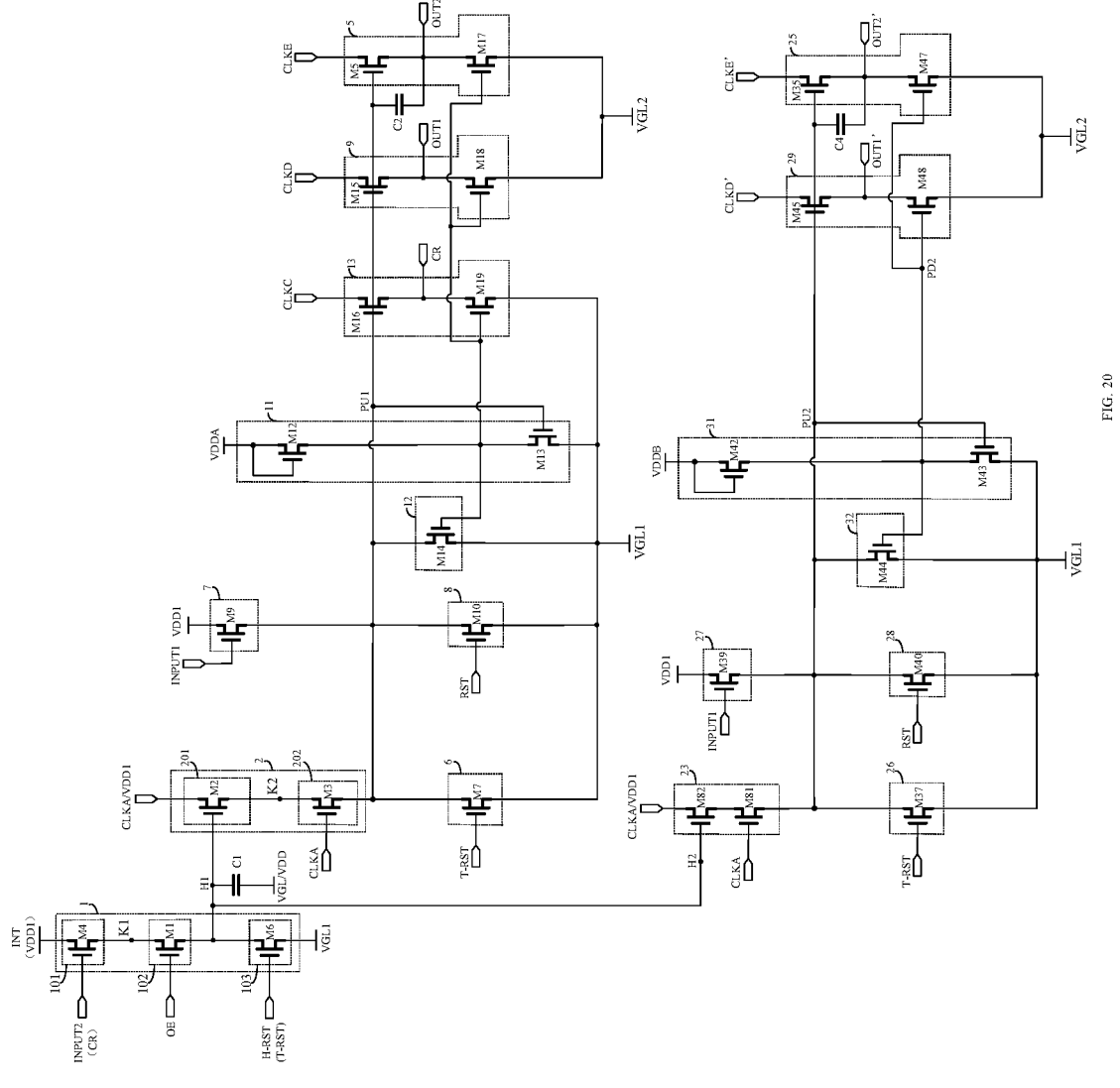
FIG. 20 is a schematic diagram showing yet another circuit structure of the shift register unit according to the embodiments of the present disclosure.

FIG. 20 is a schematic diagram showing yet another circuit structure of the shift register unit according to the embodiments of the present disclosure. As shown in FIG. 20, in some embodiments, the shift register unit further includes: a second global reset circuit 26, a second pull-down control circuit 31, and a second pull-up noise reduction circuit 32.

The second global reset circuit 26 is connected to the global reset signal input terminal T-RST, the second power supply terminal, and the second pull-up node PU2, and is configured to write an inactive level signal provided by the second power supply terminal to the second pull-up node PU2 in response to control of an active level signal provided by the global reset signal input terminal T-RST.

The second pull-down control circuit 31 is connected to the second power supply terminal, a sixth power supply terminal, the second pull-up node PU2, and the second pull-down node PD2, and is configured to write a voltage having a phase opposite to that of a voltage at the second pull-up node PU2 to the second pull-down node PD2.

The second pull-up noise reduction circuit 32 is connected to the second power supply terminal, the second pull-up node PU2, and the second pull-down node PD2, and is configured to write an inactive level signal provided by the second power supply terminal to the second pull-up node PU2 in response to control of an active level signal at the second pull-down node PD2.

The third driving output circuit 25 is further connected to the second pull-down node PD2 and the fourth power supply terminal, and is further configured to write an inactive level signal provided by the fourth power supply terminal to the third driving signal output terminal OUT2' in response to control of an active level signal at the second pull-down node PD2.

The fourth driving output circuit 29 is further connected to the second pull-down node PD2 and the fourth power supply terminal, and is further configured to write an inactive level signal provided by the fourth power supply terminal to the fourth driving signal output terminal OUT1' in response to control of an active level signal at the second pull-down node PD2.

In some embodiments, the second display input circuit 27 includes a thirty-ninth transistor M39.

A control electrode of the thirty-ninth transistor M39 is connected to the display signal input terminal INPUT1, a first electrode of the thirty-ninth transistor M39 is connected to the first power supply terminal, and a second electrode of the thirty-ninth transistor M39 is connected to the second pull-up node PU2.

The third driving output circuit 25 includes a thirty-fifth transistor M35 and a forty-seventh transistor M47, and the fourth driving output circuit 29 includes a forty-fifth transistor M45 and a forty-eighth transistor M48.

A control electrode of the thirty-fifth transistor M35 is connected to the second pull-up node PU2, a first electrode of the thirty-fifth transistor M35 is connected to the third driving clock signal input terminal CLKE', and a second electrode of the thirty-fifth transistor M35 is connected to the third driving signal output terminal OUT2'.

A control electrode of the forty-seventh transistor M47 is connected to the second pull-down node PD2, a first electrode of the forty-seventh transistor M47 is connected to the third driving signal output terminal OUT2', and a second electrode of the forty-seventh transistor M47 is connected to the fourth power supply terminal.

A control electrode of the forty-fifth transistor M45 is connected to the second pull-up node PU2, a first electrode of the forty-fifth transistor M45 is connected to the fourth driving clock signal input terminal CLKD', and a second electrode of the forty-fifth transistor M45 is connected to the fourth driving signal output terminal OUT1.

A control electrode of the forty-eighth transistor M48 is connected to the second pull-down node PD2, a first electrode of the forty-eighth transistor M48 is connected to the fourth driving signal output terminal OUT1', and a second electrode of the forty-eighth transistor M48 is connected to the fourth power supply terminal.

In some embodiments, a fourth capacitor C4 is configured for the third driving signal output terminal OUT2'.

In some embodiments, the second global reset circuit 26 includes a thirty-seventh transistor M37, the second display reset circuit 28 includes a fortieth transistor M40, the second pull-down control circuit 31 includes a forty-second transistor M42 and a forty-third transistor M43, and the second pull-up noise reduction circuit 32 includes a forty-fourth transistor M44.

A control electrode of the thirty-seventh transistor M37 is connected to the global reset signal input terminal T-RST, a first electrode of the thirty-seventh transistor M37 is connected to the second pull-up node PU2, and a second electrode of the thirty-seventh transistor M37 is connected to an inactive level supply terminal.

A control electrode of the fortieth transistor M40 is connected to the display reset signal input terminal RST, a first electrode of the fortieth transistor M40 is connected to the second pull-up node PU2, and a second electrode of the fortieth transistor M40 is connected to the inactive level supply terminal.

A control electrode of the forty-second transistor M42 is connected to the sixth power supply terminal, a first electrode of the forty-second transistor M42 is connected to the sixth power supply terminal (the sixth power supply terminal provides a voltage VDDB), and a second electrode of the forty-second transistor M42 is connected to the second pull-down node PD2.

A control electrode of the forty-third transistor M43 is connected to the second pull-up node PU2, a first electrode of the forty-third transistor M43 is connected to the second pull-down node PD2, and a second electrode of the forty-third transistor M43 is connected to the inactive level supply terminal.

A control electrode of the forty-fourth transistor M44 is connected to the second pull-down node PD2, a first electrode of the forty-fourth transistor M44 is connected to the second pull-up node PU2, and a second electrode of the forty-fourth transistor M44 is connected to the inactive level supply terminal.

In some embodiments, the fifth power supply terminal provides a voltage VDDA and the sixth power supply terminal provides a voltage VDDB, and VDDA and VDDB each can be switched between a high level voltage and a low level voltage (such as switched once every one frame or every several frames). At any moment, one of VDDA and VDDB is a high level voltage, and the other is a low level voltage.

In some embodiments, the shift register unit may further include a second cascade output circuit (not shown). The second cascade output circuit is connected to the second pull-up node PU2, a second cascade clock signal input terminal, and a second cascade signal output terminal, and is configured to write a signal provided by the second cascade clock signal input terminal to the second cascade signal output terminal in response to control of an active level signal at the second pull-up node PU2.

In some embodiments, the second cascade output circuit may be further connected to the second power supply terminal and the second pull-down node PD2, and is configured to write an inactive level signal provided by the second power supply terminal to the second cascade signal output terminal in response to control of an active level signal at the second pull-down node PD2.

Figure 21:
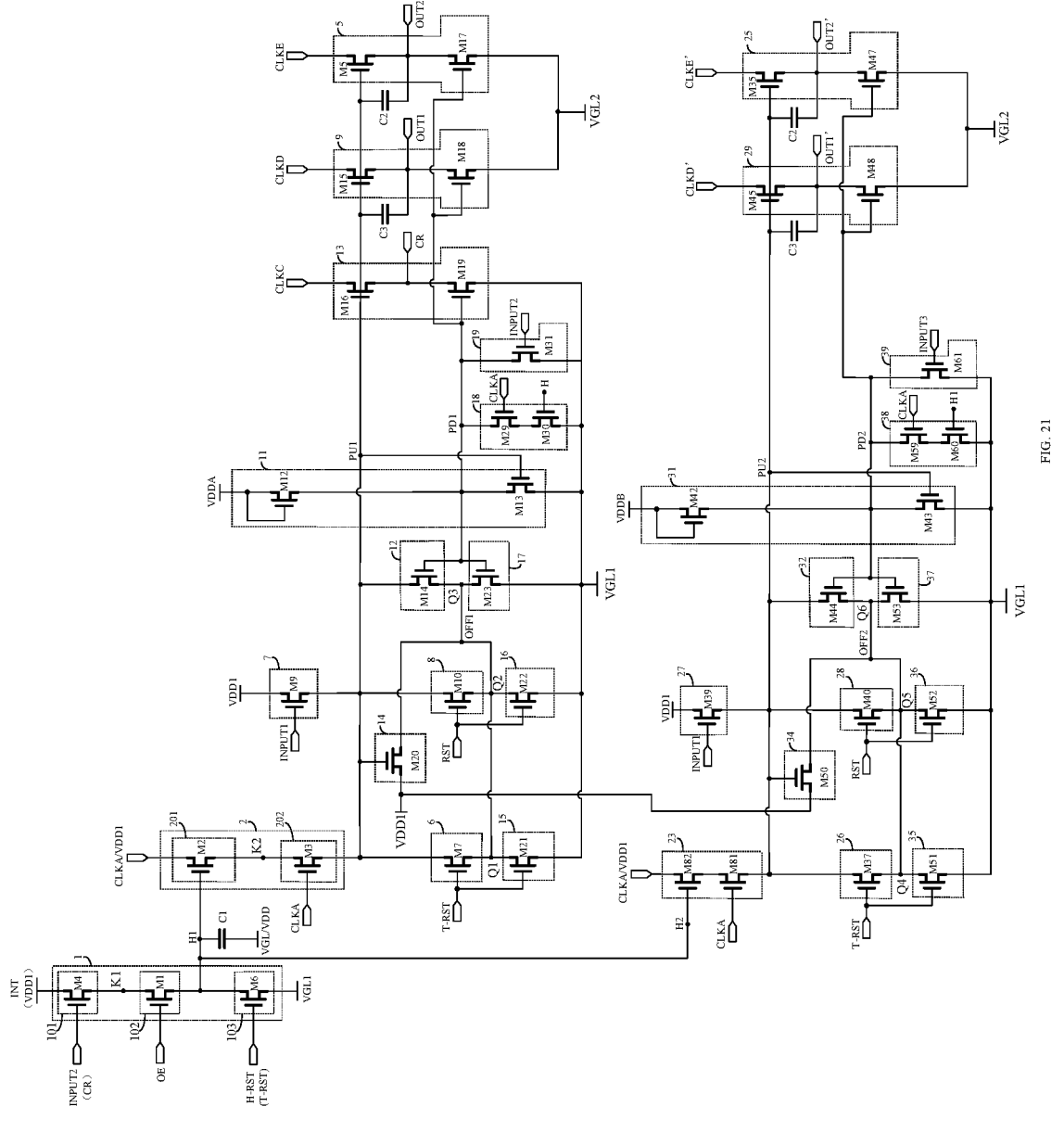
FIG. 21 is a schematic diagram showing yet another circuit structure of the shift register unit according to the embodiments of the present disclosure.

FIG. 21 is a schematic diagram showing yet another circuit structure of the shift register unit according to the embodiments of the present disclosure. As shown in FIG. 21, in some embodiments, in a case where the shift register unit includes the second global reset circuit 26, the second display reset circuit 28, and the second pull-up noise reduction circuit 32, an anti-leakage design may be provided for at least one of the second global reset circuit 26, the second display reset circuit 28, and the second pull-up noise reduction circuit 32.

In some embodiments, the shift register unit further includes: a second voltage control circuit 34; and the second voltage control circuit 34 is connected to the first power supply terminal, the second pull-up node PU2, and a second voltage control node OFF2, and is configured to write an active level signal provided by the first power supply terminal to the second voltage control node OFF2 in response to control of an active level signal at the second pull-up node PU2.

The shift register unit further includes: at least one of a fourth anti-leakage circuit 35, a fifth anti-leakage circuit 36, and a sixth anti-leakage circuit 37.

The second global reset circuit 26 is connected to the second power supply terminal through the fourth anti-leakage circuit 35, and is connected to the fourth anti-leakage circuit 35 at a fourth anti-leakage node Q4, and the fourth anti-leakage node Q4 is connected to the second voltage control node OFF2. The fourth anti-leakage circuit 35 is connected to the sensing reset signal input terminal T-RST, and is configured to form a path between the fourth anti-leakage node Q4 and the second power supply terminal in response to control of an active level signal provided by the sensing reset signal input terminal T-RST, and cut off the path between the fourth anti-leakage node Q4 and the second power supply terminal in response to control of an inactive level signal provided by the sensing reset signal input terminal T-RST.

The second display reset circuit 28 is connected to the second power supply terminal through the fifth anti-leakage circuit 36, and is connected to the fifth anti-leakage circuit 36 at a fifth anti-leakage node Q5, and the fifth anti-leakage node Q5 is connected to the second voltage control node OFF2. The fifth anti-leakage circuit 36 is connected to the display reset signal input terminal RST, and is configured to form a path between the fifth anti-leakage node Q5 and the second power supply terminal in response to control of an active level signal provided by the display reset signal input terminal RST, and cut off the path between the fifth anti-leakage node Q5 and the second power supply terminal in response to control of an inactive level signal provided by the display reset signal input terminal RST.

The second pull-up noise reduction circuit 32 is connected to the second power supply terminal through the sixth anti-leakage circuit 37, and is connected to the sixth anti-leakage circuit 37 at a sixth anti-leakage node Q6, and the sixth anti-leakage node Q6 is connected to the second voltage control node OFF2. The sixth anti-leakage circuit 37 is connected to the second pull-down node PD2, and is configured to form a path between the sixth anti-leakage node Q6 and the second power supply terminal in response to control of an active level signal at the second pull-down node PD2, and cut off the path between the sixth anti-leakage node Q6 and the second power supply terminal in response to control of an inactive level signal at the second pull-down node PD2.

In some embodiments, the second voltage control circuit 34 includes a fiftieth transistor M50, a control electrode of the fiftieth transistor M50 is connected to the first pull-up node PU1, a first electrode of the fiftieth transistor M50 is connected to the first power supply terminal, and a second electrode of the fiftieth transistor M50 is connected to the second voltage control node OFF2.

In some embodiments, the fourth anti-leakage circuit 35 includes a fifty-first transistor M51, a control electrode of the fifty-first transistor M51 is connected to the sensing reset signal input terminal T-RST, a first electrode of the fifty-first transistor M51 is connected to the sensing reset circuit and the second voltage control node OFF2, and a second electrode of the fifty-first transistor M51 is connected to the second power supply terminal.

In some embodiments, the fifth anti-leakage circuit 36 includes a fifty-second transistor M52, a control electrode of the fifty-second transistor M52 is connected to the display reset signal input terminal RST, a first electrode of the fifty-second transistor M52 is connected to the display reset circuit and the second voltage control node OFF2, and a second electrode of the fifty-second transistor M52 is connected to the second power supply terminal.

In some embodiments, the sixth anti-leakage circuit 37 includes: a fifty-third transistor M53, a control electrode of the fifty-third transistor M53 is connected to the second pull-down node PD2, a first electrode of the fifty-third transistor M53 is connected to the second pull-down control circuit and the second voltage control node OFF2, and a second electrode of the fifty-third transistor M53 is connected to the second power supply terminal.

FIG. 21 illustrates an exemplary case where the shift register unit includes all the fourth anti-leakage circuit 35, the fifth anti-leakage circuit 36, and the sixth anti-leakage circuit 37. In practical applications, at least one of the fourth anti-leakage circuit 35, the fifth anti-leakage circuit 36, and the sixth anti-leakage circuit 37 may be configured according to actual needs.

Still with reference to FIG. 21, in some embodiments, the shift register unit further includes a third pull-down noise reduction circuit 38 and/or a fourth pull-down noise reduction circuit 39.

The third pull-down noise reduction circuit 38 is connected to the second pull-down node PD2, the second power supply terminal, the first sensing control node, and the clock control signal input terminal CLKA, and the third pull-down noise reduction circuit 38 is configured to write an inactive level signal provided by the second power supply terminal to the second pull-down node PD2 in response to control of an active level signal at the first sensing control node and an active level signal provided by the clock control signal input terminal CLKA to perform noise reduction on a voltage at the second pull-down node PD2.

The fourth pull-down noise reduction circuit 39 is connected to the second pull-down node PD2, the second power supply terminal, and the pull-down noise reduction signal input terminal INPUT3, and the fourth pull-down noise reduction circuit 39 is configured to write an inactive level signal provided by the second power supply terminal to the second pull-down node PD2 in response to control of an active level signal provided by the pull-down noise reduction signal input terminal INPUT3 to perform noise reduction on a voltage at the second pull-down node PD2.

In some embodiments, the third pull-down noise reduction circuit 38 includes a fifty-ninth transistor M59 and a sixtieth transistor M60, and the fourth pull-down noise reduction circuit 39 includes a sixty-first transistor M61.

A control electrode of the fifty-ninth transistor M59 is connected to the first clock control signal input terminal CLKA, a first electrode of the fifty-ninth transistor M59 is connected to the second pull-down node PD2, and a second electrode of the fifty-ninth transistor M59 is connected to a first electrode of the sixtieth transistor M60.

A control electrode of the sixtieth transistor M60 is connected to the first sensing control node, and a second electrode of the sixtieth transistor M60 is connected to the second power supply terminal.

A control electrode of the sixty-first transistor M61 is connected to the pull-down noise reduction signal input terminal INPUT3, a first electrode of the sixty-first transistor M61 is connected to the second pull-down node PD2, and a second electrode of the sixty-first transistor M61 is connected to the second power supply terminal.

Figure 22:
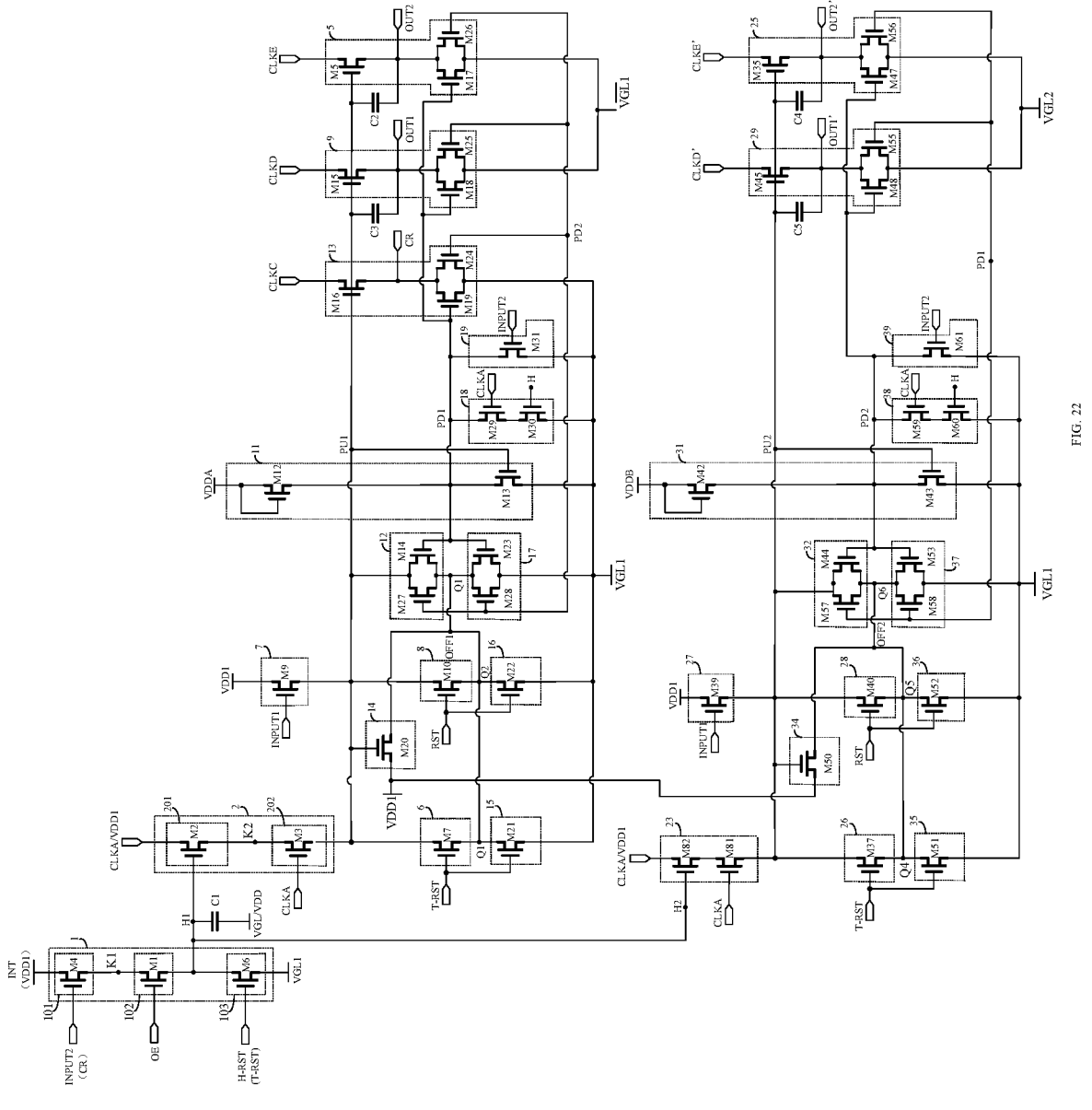
FIG. 22 is a schematic diagram showing yet another circuit structure of the shift register unit according to the embodiments of the present disclosure.

FIG. 22 is a schematic diagram showing yet another circuit structure of the shift register unit according to the embodiments of the present disclosure. As shown in FIG. 22, in a case where the shift register unit is provided therein with both the first pull-down node PD1 and the second pull-down node PD2, in some embodiments, the third anti-leakage circuit 17, the first pull-up noise reduction circuit 12, the first cascade output circuit 13, the first driving output circuit 5, and the second driving output circuit 9 are further connected to the second pull-down node PD2.

The third anti-leakage circuit 17 is further configured to write an inactive level signal to the third anti-leakage node in response to control of an active level signal at the second pull-down node PD2. In an embodiment, the third anti-leakage circuit 17 includes a twenty-third transistor M23 and a twenty-eighth transistor M28, a control electrode of the twenty-third transistor M23 is connected to the first pull-down node PD1, and a control electrode of the twenty-eighth transistor M28 is connected to the second pull-down node PD2.

The first pull-up noise reduction circuit 12 is further configured to write an inactive level signal to the first pull-up node PU1 in response to control of an active level signal at the second pull-down node PD2. In an embodiment, the first pull-up noise reduction circuit 12 includes a fourteenth transistor M14 and a twenty-seventh transistor M27, a control electrode of the fourteenth transistor M14 is connected to the first pull-down node PD1, and a control electrode of the twenty-seventh transistor M27 is connected to the second pull-down node PD2.

The first cascade output circuit 13 is further configured to write an inactive level signal to the first cascade signal output terminal CR in response to control of an active level signal at the second pull-down node PD2. In an embodiment, the cascade output circuit 13 includes a nineteenth transistor M19 and a twenty-fourth transistor M24, a control electrode of the nineteenth transistor M19 is connected to the first pull-down node PD1, and a control electrode of the twenty-fourth transistor M24 is connected to the second pull-down node PD2.

The first driving output circuit 5 is further configured to write an inactive level signal to the first driving signal output terminal OUT2 in response to control of an active level signal at the second pull-down node PD2. In an embodiment, the first driving output circuit 5 further includes a seventeenth transistor M17 and a twenty-sixth transistor M26, a control electrode of the seventeenth transistor M17 is connected to the first pull-down node PD1, and a control electrode of the twenty-sixth transistor M26 is connected to the second pull-down node PD2.

The second driving output circuit 9 is further configured to write an inactive level signal to the second driving signal output terminal OUT1 in response to control of an active level signal at the second pull-down node PD2. In an embodiment, the second driving output circuit 9 further includes an eighteenth transistor M18 and a twenty-fifth transistor M25, a control electrode of the eighteenth transistor M18 is connected to the first pull-down node PD1, and a control electrode of the twenty-fifth transistor M25 is connected to the second pull-down node PD2.

In some embodiments, the sixth anti-leakage circuit 37, the second pull-up noise reduction circuit 32, the third driving output circuit 25, and the fourth driving output circuit 29 are connected to the first pull-down node PD1.

The sixth anti-leakage circuit 37 is further configured to write an inactive level signal to the sixth anti-leakage node in response to control of an active level signal at the first pull-down node PD1. In an embodiment, the sixth anti-leakage circuit 37 includes a fifty-third transistor M53 and a fifty-eighth transistor M58, a control electrode of the fifty-third transistor M53 is connected to the second pull-down node PD2, and a control electrode of the fifty-eighth transistor M58 is connected to the first pull-down node PD1.

The second pull-up noise reduction circuit 32 is further configured to write an inactive level signal to the second pull-up node PU2 in response to control of an active level signal at the first pull-down node PD1. In an embodiment, the second pull-up noise reduction circuit 32 includes a forty-fourth transistor M44 and a fifty-seventh transistor M57, a control electrode of the forty-fourth transistor M44 is connected to the second pull-down node PD2, and a control electrode of the fifty-seventh transistor M57 is connected to the first pull-down node PD1.

The third driving output circuit 25 is further configured to write an inactive level signal to the third driving signal output terminal in response to control of an active level signal at the first pull-down node PD1. In an embodiment, the third driving output circuit 25 further includes a forty-seventh transistor M47 and a fifty-sixth transistor M56, a control electrode of the forty-seventh transistor M47 is connected to the second pull-down node PD2, and a control electrode of the fifty-sixth transistor M56 is connected to the first pull-down node PD1.

The fourth driving output circuit 29 is further configured to write an inactive level signal to the fourth driving signal output terminal in response to control of an active level signal at the first pull-down node PD1. In an embodiment, the fourth driving output circuit 29 further includes a forty-eighth transistor M48 and a fifty-fifth transistor M55, a control electrode of the forty-eighth transistor M48 is connected to the second pull-down node PD2, and a control electrode of the fifty-fifth transistor M55 is connected to the first pull-down node PD1.

It should be noted that the above embodiment only illustrates an exemplary case where the second sensing input circuit 23 is provided with the second sensing control node H2 and the second sensing control node H2 is connected to the first sensing control node H1 (shown in FIG. 16). Apparently, the sensing control circuit 1, the first sensing input circuit 2, and the second sensing input circuit 23 in the embodiment may also adopt the structures shown in FIGS. 15, 17A, and 17B, which also belong to the protection scope of the present disclosure.

Reference may be made to the above embodiments for the operating timing of each of the shift register units shown in FIGS. 15 to 22, and the specific process will not be repeated here.

Figure 23:
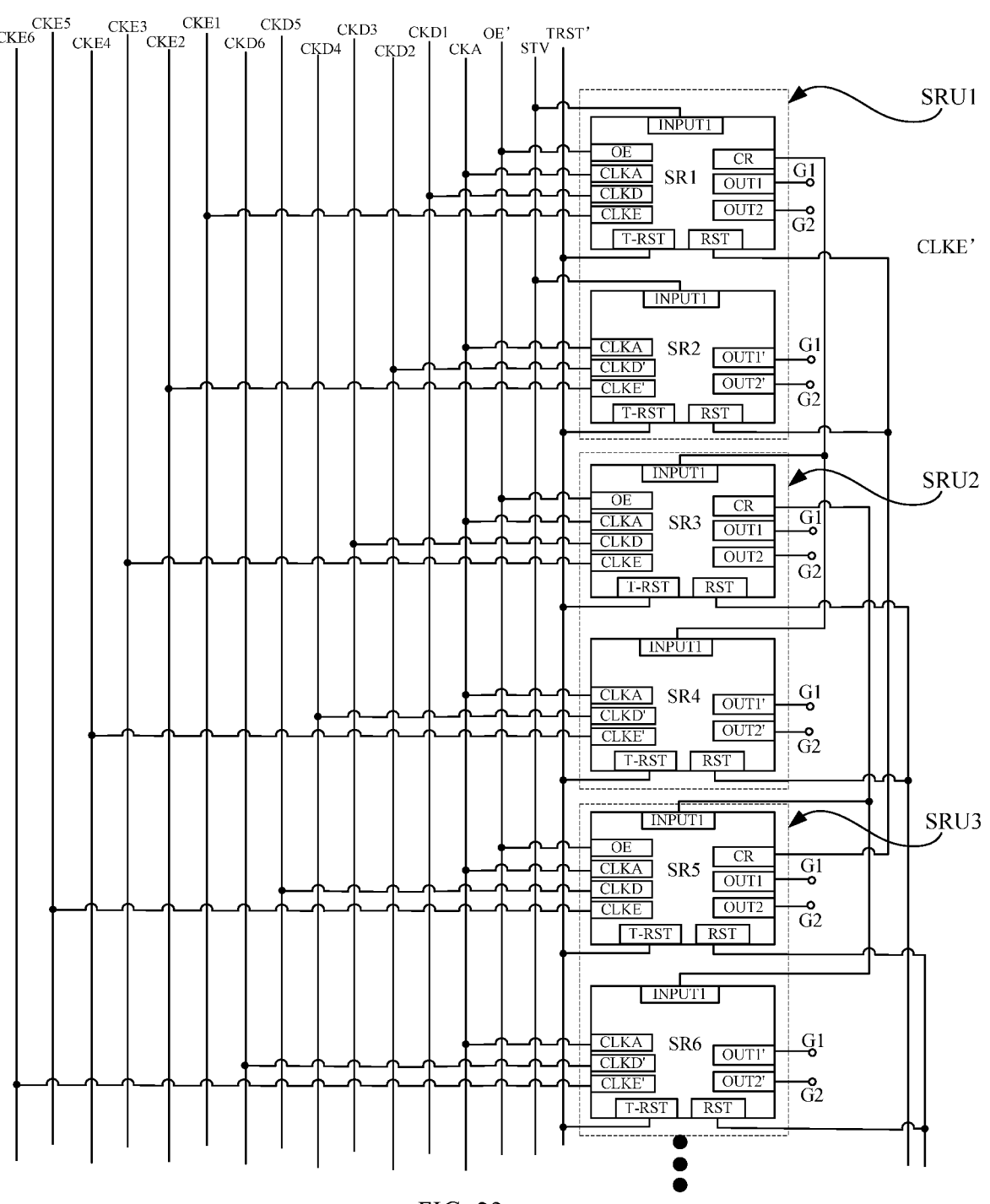
FIG. 23 is a schematic diagram showing a circuit structure of a gate driving circuit according to the embodiments of the present disclosure.
Figure 24:
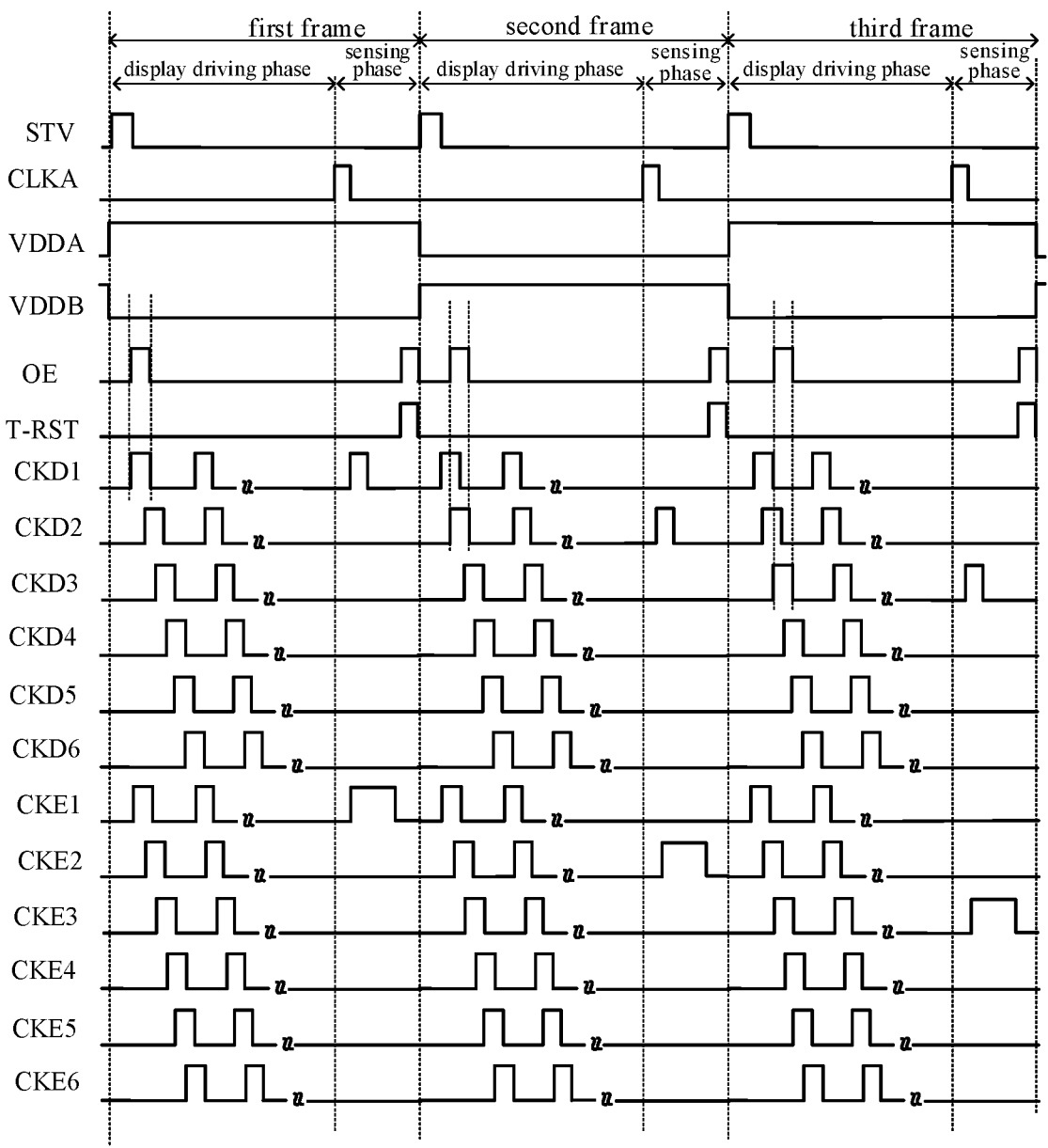
FIG. 24 is an operating timing diagram of the gate driving circuit shown in FIG. 23.

FIG. 23 is a schematic diagram showing a circuit structure of a gate driving circuit according to the embodiments of the present disclosure, and FIG. 24 is an operating timing diagram of the gate driving circuit shown in FIG. 23. As shown in FIG. 23 and FIG. 24, the gate driving circuit includes a plurality of shift register units SRU1 to SRU3 that are cascaded, each of the plurality of shift register units SRU1 to SRU3 may adopt the shift register unit provided by any one of the above embodiments, and a detailed description of the shift register unit may refer to that in the content of the above embodiments, and thus will not be repeated here.

In some embodiments, each of the shift register units SRU1 to SRU3 is configured to drive gate lines corresponding to two rows of pixel units, that is, each of the shift register units SRU1 to SRU3 includes the first driving output circuit 5, the second driving output circuit 9, the third driving output circuit 25, the fourth driving output circuit 29, and the first cascade output circuit 13. In such case, the shift register unit SRU1/SRU2/SRU3 in each stage may be regarded as two shift register circuits, for example, the shift register unit SRU1 includes shift register circuits SR1 and SR2, the shift register unit SRU2 includes shift register circuits SR3 and SR4, and the shift register unit SRU3 includes shift register circuits SR5 and SR6.

In an exemplary embodiment, 2N rows of pixel units are disposed in a display panel, and accordingly N shift register units may be disposed in the gate driving circuit. The N shift register units are cascaded, which may be regarded as 2N shift register circuits being cascaded, each odd-numbered shift register circuit SR $(2n\text{-}1)$ is provided with the sensing signal input terminal INPUT2, the random signal input terminal OE, and the cascade signal output terminal CR, while each even-numbered shift register circuit SR$2n$ is not provided with the sensing signal input terminal INPUT2 or the random signal input terminal OE, where $1 \leq n \leq N$ and N is an integer.

FIG. 23 only illustrates an exemplary case of three stages of shift register units SRU1 to SRU3 (six stages of shift register circuits SR1 to SR6), but such case is only for the purpose of illustration.

In some embodiments, in shift register unit SRU1/SRU2/SRU3 in each stage, the sensing signal input terminal INPUT2 is connected to the first cascade signal output terminal CR. The clock control signal input terminals CLKA of the shift register units SRU1 to SRU3 in all stages are connected to a clock control signal line CKA, the global reset signal input terminals T-RST of the shift register units SRU1 to SRU3 in all stages are connected to a global reset signal supply line TRST', and the random signal input terminals OE of the shift register units in all stages are connected to a random signal input line OE'.

In some embodiments, for any one shift register unit other than shift register units in first a stage(s), the sensing active level supply terminal of the shift register unit is connected to the first pull-up node in one shift register unit located a stage(s) before the shift register unit: or, for any one shift register unit other than shift register units in last a stage(s), the sensing active level supply terminal of the shift register unit is connected to the first pull-up node in one shift register unit located a stage(s) after the shift register unit: where a is a positive integer (for example, a is 1). That is, the shift register unit in the current stage can use a voltage at the first pull-up node in the shift register unit located a stage(s) before or after the shift register unit to charge the first sensing control node of the shift register unit in the current stage.

Apparently, in the embodiments of the present disclosure, the sensing signal input terminal of the shift register unit may also be connected to other terminal. For example, the sensing signal input terminal of the shift register unit in the current stage is connected to the cascade signal output terminal of one shift register unit located b stage(s) (b is a positive integer) before or after the shift register unit.

The terminal to which the sensing signal input terminal of the shift register unit is connected is not limited by the technical solutions of the present disclosure. Apparently, in order to ensure that the sensing signal input terminal has a relatively good charging capability, in an embodiment, the sensing signal input terminal is connected to the third power supply terminal.

The display signal input terminal INPUT1 of the shift register unit SRU1 in the first stage is connected to a frame start signal input terminal STV, and the display signal input terminal INPUT1 of each of the shift register units in other stages than the first stage is connected to the first cascade signal output terminal CR of the shift register unit in the previous stage: the global reset signal input terminals T-RST of the shift register units in all stages are connected to a global reset signal line; and the display reset signal input terminal RST of the shift register unit in the $N^{th}$ stage and the display reset signal input terminal RST of the shift register unit in the $(N\text{-}1)^{th}$ stage are connected to a frame end reset signal line, and the display reset signal input terminal RST of each of the shift register units in other stages than the $N^{th}$ and $(N\text{-}1)^{th}$ stages is connected to the first cascade signal output terminals CR of the shift register unit in one stage after the next stage.

Apparently, a specific cascading mode may be adjusted according to actual needs in practical applications.

In some embodiments, six first driving clock signal lines CKE1 to CKE6 and six second driving clock signal lines CKD1 to CKD6 are provided for the gate driving circuit.

The first driving clock signal input terminal CLKE of the shift register unit SRU $(3i\text{+}1)$ in the $(3i\text{+}1)^{th}$ stage is connected to the first driving clock signal line CKE1, the second driving clock signal input terminal CLKD of the shift register unit SRU $(3i\text{+}1)$ in the $(3i\text{+}1)^{th}$ stage is connected to the second driving clock signal line CKD1, the third driving clock signal input terminal CLKE' of the shift register unit SRU $(3i\text{+}1)$ in the $(3i\text{+}1)^{th}$ stage is connected to the first driving clock signal line CKE2, the fourth driving clock signal input terminal CLKD' of the shift register unit SRU $(3i\text{+}1)$ in the $(3i\text{+}1)^{th}$ stage is connected to the second driving clock signal line CKD2, and the cascade clock signal input terminal (not shown in FIG. 23) of the shift register unit SRU (3i+1) in the (3i+1)$^{th}$ stage is connected to the second driving clock signal line CKD2.

The first driving clock signal input terminal CLKE of the shift register unit SRU (3i+2) in the (3i+2)$^{th}$ stage is connected to the first driving clock signal line CKE3, the second driving clock signal input terminal CLKD of the shift register unit SRU (3i+2) in the (3i+2)$^{th}$ stage is connected to the second driving clock signal line CKD3, the third driving clock signal input terminal CLKE' of the shift register unit SRU (3i+2) in the (3i+2)$^{th}$ stage is connected to the first driving clock signal line CKE4, the fourth driving clock signal input terminal CLKD' of the shift register unit SRU (3i+2) in the (3i+2)$^{th}$ stage is connected to the second driving clock signal line CKD4, and the cascade clock signal input terminal (not shown in FIG. 23) of the shift register unit SRU (3i+2) in the (3i+2)$^{th}$ stage is connected to the second driving clock signal line CKD4.

The first driving clock signal input terminal CLKE of the shift register unit SRU (3i+3) in the (3i+3)$^{th}$ stage is connected to the first driving clock signal line CKE5, the second driving clock signal input terminal CLKD of the shift register unit SRU (3i+3) in the (3i+3)$^{th}$ stage is connected to the second driving clock signal line CKD5, the third driving clock signal input terminal CLKE' of the shift register unit SRU (3i+3) in the (3i+3)$^{th}$ stage is connected to the first driving clock signal line CKE6, the fourth driving clock signal input terminal CLKD' of the shift register unit SRU (3i+3) in the (3i+3)$^{th}$ stage is connected to the second driving clock signal line CKD6, and the cascade clock signal input terminal (not shown in FIG. 23) of the shift register unit SRU (3i+3) in the (3i+3)$^{th}$ stage is connected to the second driving clock signal line CKD6. Here, i is a positive integer and 3i+3≤ N.

Based on the same inventive concept, the embodiments of the present disclosure further provide a display panel, including the gate driving circuit provided by the above embodiments, and a detailed description of the gate driving circuit may refer to that in the content of the above embodiments, and thus will not be repeated here.

In some embodiments, the gate driving circuit is formed on an array substrate of the display panel by way of GOA.

Based on the same inventive concept, the embodiments of the present disclosure further provide a display device, including the display panel provided by the above embodiments, and a detailed description of the display panel may refer to that in the content of the above embodiments, and thus will not be repeated here.

The display device provided by the embodiments of the present disclosure may be any product or component with a display function, such as a liquid crystal display screen, a wearable device, a mobile phone, a tablet computer, a television, a display, a notebook computer, a digital photo frame, or a navigator. The inclusion of other essential components of the display device should be understood by those of ordinary skill in the art, those essential components will not be described here, and should not be considered as a limitation to the present disclosure.

Based on the same inventive concept, the embodiments of the present disclosure further provide a gate driving method. The gate driving method is based on the shift register unit provided by the above embodiments, and a detailed description of the shift register unit may refer to that in the content of the above embodiments, and thus will not be repeated here. FIG. 25 is a flowchart illustrating the gate driving method according to the embodiments of the present disclosure. As shown in FIG. 25, the gate driving method includes steps as follows.

In step S101, the sensing control circuit writes an active level signal provided by the sensing active level supply terminal to the first sensing control node in response to control of an active level signal provided by the first sensing control node and an active level signal provided by the sensing signal input terminal.

In step S102, the first sensing input circuit writes an active level signal to the first pull-up node in response to control of an active level signal at the first sensing control node and an active level signal provided by the clock control signal input terminal.

In step S103, the first driving output circuit writes a signal provided by the first driving clock signal input terminal to the first driving signal output terminal in response to control of an active level signal at the first pull-up node.

In step S104, the sensing control circuit writes an inactive level signal provided by the second power supply terminal to the first sensing control node at least in response to control of an active level signal provided by the control reset signal input terminal.

A detailed description of the above steps S101 to S104 may refer to the content of the above embodiments, and thus will not be repeated here.

The sensing control circuit in the shift register unit provided by the embodiments of the present disclosure can respectively use the sensing active level supply terminal and the second power supply terminal to quickly charge and reset the first sensing control node. That is, the sensing control circuit in the shift register unit provided by the embodiments of the present disclosure has a relatively strong capability of inputting a signal to the first sensing control node, which is beneficial to improving the operation stability of the shift register unit.

It should be understood that the above embodiments are merely exemplary embodiments adopted to illustrate the principle of the present disclosure, and the present disclosure is not limited thereto. Various modifications and improvements can be made by those of ordinary skill in the art without departing from the spirit and essence of the present disclosure, and those modifications and improvements are also considered to fall within the protection scope of the present disclosure.

What is claimed is:

1. A shift register unit, comprising:
   a sensing control circuit connected to a first sensing control node, a sensing signal input terminal, a random signal input terminal, and a sensing active level supply terminal, and configured to write an active level signal provided by the sensing active level supply terminal to the first sensing control node in response to control of an active level signal provided by the random signal input terminal and an active level signal provided by the sensing signal input terminal;
   a first sensing input circuit connected to the first sensing control node, a clock control signal input terminal, and a first pull-up node, and configured to write an active level signal to the first pull-up node in response to control of an active level signal at the first sensing control node and an active level signal provided by the clock control signal input terminal; and
   a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node, wherein the shift register unit further comprises:

a first voltage control circuit connected to a first power supply terminal, the first pull-up node, and a first voltage control node, and configured to write an active level signal provided by the first power supply terminal to the first voltage control node in response to control of an active level signal at the first pull-up node;

the shift register unit further comprises: a first sensing input anti-leakage circuit; and the first sensing input circuit is connected to the first pull-up node through the first sensing input anti-leakage circuit, and is connected to the first sensing input anti-leakage circuit at a first sensing input anti-leakage node, the first sensing input anti-leakage node is connected to the first voltage control node, the first sensing input anti-leakage circuit is connected to the clock control signal input terminal, and the first sensing input anti-leakage circuit is configured to form a path between the first sensing input anti-leakage node and the first pull-up node in response to control of an active level signal at the clock control signal input terminal, and cut off the path between the first sensing input anti-leakage node and the first pull-up node in response to control of an inactive level signal at the clock control signal input terminal, wherein the shift register unit further comprises:

a second sensing input circuit connected to a second sensing control node, the clock control signal input terminal, and a second pull-up node, and configured to write an active level signal to the second pull-up node in response to control of an active level signal at the second sensing control node and an active level signal provided by the clock control signal input terminal, the second sensing control node being connected to the first sensing control node; and a third driving output circuit connected to the second pull-up node, a third driving clock signal input terminal, and a third driving signal output terminal, and configured to write a signal provided by the third driving clock signal input terminal to the third driving signal output terminal in response to control of an active level signal at the second pull-up node, wherein the second sensing input circuit comprises: an eighty-first transistor and an eighty-second transistor;

a control electrode of the eighty-first transistor is connected to the clock control signal input terminal, a first electrode of the eighty-first transistor is connected to a second electrode of the eighty-second transistor, and a second electrode of the eighty-first transistor is connected to the second pull-up node; and a control electrode of the eighty-second transistor is connected to the second sensing control node, and a first electrode of the eighty-second transistor is connected to an input active level supply terminal.

2. The shift register unit of claim 1, wherein the sensing control circuit comprises:

a first control input circuit connected to the sensing active level supply terminal, a sensing control intermediate node, and a first control signal input terminal, and configured to write a signal provided by the sensing active level supply terminal to the sensing control intermediate node in response to control of an active level signal provided by the first control signal input terminal; and a second control input circuit connected to the sensing control intermediate node, the first sensing control node, and a second control signal input terminal, and configured to write a signal at the sensing control intermediate node to the first sensing control node in response to control of an active level signal provided by the second control signal input terminal; and one of the first control signal input terminal and the second control signal input terminal is the sensing signal input terminal, and the other is the random signal input terminal.

3. The shift register unit of claim 2, wherein the sensing control circuit is further connected to a control reset signal input terminal and a second power supply terminal, and is further configured to write an inactive level signal provided by the second power supply terminal to the first sensing control node at least in response to control of an active level signal provided by the control reset signal input terminal.

4. The shift register unit of claim 3, wherein the sensing control circuit further comprises:

a control reset circuit connected to the second power supply terminal, the first sensing control node, and the control reset signal input terminal, and configured to write an inactive level signal provided by the second power supply terminal to the first sensing control node in response to control of an active level signal provided by the control reset signal input terminal, wherein the control reset circuit comprises: a sixth transistor; and a control electrode of the sixth transistor is connected to the control reset signal input terminal, a first electrode of the sixth transistor is connected to the first sensing control node, and a second electrode of the sixth transistor is connected to the second power supply terminal.

5. The shift register unit of claim 3, wherein the first control signal input terminal is the sensing signal input terminal, and the second control signal input terminal is the random signal input terminal;

the sensing control circuit is configured to write an inactive level signal provided by the second power supply terminal to the first sensing control node in response to control of an active level signal provided by the control reset signal input terminal and an active level signal provided by the random signal input terminal; and the sensing control circuit further comprises:

a control reset circuit connected to the second power supply terminal, the sensing control intermediate node, and the control reset signal input terminal, and configured to write an inactive level signal provided by the second power supply terminal to the sensing control intermediate node in response to control of an active level signal provided by the control reset signal input terminal, the control reset circuit comprises: a sixth transistor; and a control electrode of the sixth transistor is connected to the control reset signal input terminal, a first electrode of the sixth transistor is connected to the sensing control intermediate node, and a second electrode of the sixth transistor is connected to the second power supply terminal.

6. The shift register unit of claim 2, wherein the first control input circuit comprises: a fourth transistor, and the second control input circuit comprises: a first transistor;

a control electrode of the fourth transistor is connected to the first control signal input terminal, a first electrode of the fourth transistor is connected to the sensing active level supply terminal, and a second electrode of the fourth transistor is connected to the sensing control intermediate node; and a control electrode of the first transistor is connected to the second control signal input terminal, a first electrode of the first transistor is connected to the sensing control intermediate node, and a second electrode of the first transistor is connected to the first sensing control node.

7. The shift register unit of claim 2, further comprising:

a third voltage control circuit connected to the first sensing control node, the sensing control intermediate node, and a first power supply terminal, and configured to write an active level signal provided by the first power supply terminal to the sensing control intermediate node in response to control of an active level signal at the first sensing control node, wherein the third voltage control circuit comprises: a seventy-first transistor; and a control electrode of the seventy-first transistor is connected to the first sensing control node, a first electrode of the seventy-first transistor is connected to the first power supply terminal, and a second electrode of the seventy-first transistor is connected to the sensing control intermediate node.

8. The shift register unit of claim 7, wherein the sensing control circuit further comprises: a control reset circuit connected to a second power supply terminal, the first sensing control node, and a control reset signal input terminal, and configured to write an inactive level signal provided by the second power supply terminal to the first sensing control node in response to control of an active level signal provided by the control reset signal input terminal;

the shift register unit further comprises: a control reset anti-leakage circuit;

the control reset circuit is connected to the second power supply terminal through the control reset anti-leakage circuit, and is connected to the control reset anti-leakage circuit at a control reset anti-leakage node, and the control reset anti-leakage node is connected to the sensing control intermediate node; and the control reset anti-leakage circuit is further connected to the control reset signal input terminal, and is configured to form a path between the reset anti-leakage node and the second power supply terminal in response to control of an active level signal provided by the control reset signal input terminal, and cut off the path between the reset anti-leakage node and the second power supply terminal in response to control of an inactive level signal provided by the control reset signal input terminal, wherein the control reset anti-leakage circuit comprises: a seventy-second transistor; and a control electrode of the seventy-second transistor is connected to the control reset signal input terminal, a first electrode of the seventy-second transistor is connected to the reset anti-leakage node, and a second electrode of the seventy-second transistor is connected to the second power supply terminal.

9. The shift register unit of claim 1, further comprising:

a first global reset circuit connected to a global reset signal input terminal, a second power supply terminal, and the first pull-up node, and configured to write an inactive level signal provided by the second power supply terminal to the first pull-up node in response to control of an active level signal provided by the global reset signal input terminal; and in a case where the sensing control circuit is further connected to a control reset signal input terminal, the control reset signal input terminal and the global reset signal input terminal are a same signal terminal.

10. The shift register unit of claim 9, further comprising:

a first display input circuit connected to a display signal input terminal, a first power supply terminal, and the first pull-up node, and configured to write an active level signal provided by the first power supply terminal to the first pull-up node in response to control of an active level signal provided by the display signal input terminal;

a first display reset circuit connected to a display reset signal input terminal, the second power supply terminal, and the first pull-up node, and configured to write an inactive level signal provided by the second power supply terminal to the first pull-up node in response to control of an active level signal provided by the display reset signal input terminal; and a first cascade output circuit connected to the first pull-up node, a first cascade clock signal input terminal, and a first cascade signal output terminal, and configured to write a signal provided by the first cascade clock signal input terminal to the first cascade signal output terminal in response to control of an active level signal at the first pull-up node, wherein the sensing signal input terminal and the first cascade signal output terminal are a same signal terminal.

11. The shift register unit of claim 10, further comprising:

a second driving output circuit connected to the first pull-up node, a second driving clock signal input terminal, and a second driving signal output terminal, and configured to write a signal provided by the second driving clock signal input terminal to the second driving signal output terminal in response to control of an active level signal at the first pull-up node;

a first pull-down control circuit connected to the second power supply terminal, a fifth power supply terminal, the first pull-up node, and a first pull-down node, and configured to write a voltage having a phase opposite to that of a voltage at the first pull-up node to the first pull-down node; and a first pull-up noise reduction circuit connected to the second power supply terminal, the first pull-up node, and the first pull-down node, and configured to write an inactive level signal provided by the second power supply terminal to the first pull-up node in response to control of an active level signal at the first pull-down node;

wherein the first cascade output circuit is further connected to the first pull-down node and the second power supply terminal, and is further configured to write an inactive level signal provided by the second power supply terminal to the first cascade signal output terminal in response to control of an active level signal at the first pull-down node;

the first driving output circuit is further connected to the first pull-down node and a fourth power supply terminal, and is further configured to write an inactive level signal provided by the fourth power supply terminal to the first driving signal output terminal in response to control of an active level signal at the first pull-down node; and the second driving output circuit is further connected to the first pull-down node and the fourth power supply terminal, and is further configured to write an inactive level signal provided by the fourth power supply terminal to the second driving signal output terminal in response to control of an active level signal at the first pull-down node.

12. The shift register unit of claim 11, further comprising:
a first voltage control circuit connected to a first power supply terminal, the first pull-up node, and a first voltage control node, and configured to write an active level signal provided by the first power supply terminal to the first voltage control node in response to control of an active level signal at the first pull-up node;
wherein the shift register unit further comprises: at least one of a first anti-leakage circuit, a second anti-leakage circuit, and a third anti-leakage circuit;
the first global reset circuit is connected to the second power supply terminal through the first anti-leakage circuit, and is connected to the first anti-leakage circuit at a first anti-leakage node, the first anti-leakage node is connected to the first voltage control node, the first anti-leakage circuit is connected to the global reset signal input terminal, and the first anti-leakage circuit is configured to form a path between the first anti-leakage node and the second power supply terminal in response to control of an active level signal provided by the global reset signal input terminal, and cut off the path between the first anti-leakage node and the second power supply terminal in response to control of an inactive level signal provided by the global reset signal input terminal;
the first display reset circuit is connected to the second power supply terminal through the second anti-leakage circuit, and is connected to the second anti-leakage circuit at a second anti-leakage node, the second anti-leakage node is connected to the first voltage control node, the second anti-leakage circuit is connected to the display reset signal input terminal, and the second anti-leakage circuit is configured to form a path between the second anti-leakage node and the second power supply terminal in response to control of an active level signal provided by the display reset signal input terminal, and cut off the path between the second anti-leakage node and the second power supply terminal in response to control of an inactive level signal provided by the display reset signal input terminal;
the first pull-up noise reduction circuit is connected to the second power supply terminal through the third anti-leakage circuit, and is connected to the third anti-leakage circuit at a third anti-leakage node, the third anti-leakage node is connected to the first voltage control node, the third anti-leakage circuit is connected to the first pull-down node, and the third anti-leakage circuit is configured to form a path between the third anti-leakage node and the second power supply terminal in response to control of an active level signal at the first pull-down node, and cut off the path between the third anti-leakage node and the second power supply terminal in response to control of an inactive level signal at the first pull-down node; and the shift register unit further comprises: a first capacitor; a first terminal of the first capacitor is connected to the first sensing control node, and a second terminal of the first capacitor is connected to a third power supply terminal.

13. The shift register unit of claim 1, wherein the first sensing input circuit comprises:
a first input response circuit connected to an input active level supply terminal, the first sensing control node, and a sensing input intermediate node, and configured to write a signal provided by the input active level supply terminal to the sensing input intermediate node in response to control of an active level signal at the first sensing control node; and

a second input response circuit connected to the sensing input intermediate node, the clock control signal input terminal, and the first pull-up node, and configured to write a voltage at the sensing input intermediate node to the first pull-up node in response to control of an active level signal provided by the clock control signal input terminal.

14. The shift register unit of claim 13, further comprising:
a second voltage control circuit connected to a first power supply terminal, the second pull-up node, and a second voltage control node, and configured to write an active level signal provided by the first power supply terminal to the second voltage control node in response to control of an active level signal at the second pull-up node;
the shift register unit further comprises: a second sensing input anti-leakage circuit; and
the second sensing input circuit is connected to the second pull-up node through the second sensing input anti-leakage circuit, and is connected to the second sensing input anti-leakage circuit at a second sensing input anti-leakage node, the second sensing input anti-leakage node is connected to the second voltage control node, the second sensing input anti-leakage circuit is connected to the clock control signal input terminal, and the second sensing input anti-leakage circuit is configured to form a path between the second sensing input anti-leakage node and the second pull-up node in response to control of an active level signal at the clock control signal input terminal, and cut off the path between the second sensing input anti-leakage node and the second pull-up node in response to control of an inactive level signal at the clock control signal input terminal.

15. The shift register unit of claim 13, further comprising:
a second display input circuit connected to a display signal input terminal and the second pull-up node, and configured to write an active level signal to the second pull-up node in response to control of an active level signal provided by the display signal input terminal;
a second display reset circuit connected to a display reset signal input terminal, a second power supply terminal, and the second pull-up node, and configured to write an inactive level signal provided by the second power supply terminal to the second pull-up node in response to control of an active level signal provided by the display reset signal input terminal;
a fourth driving output circuit connected to the second pull-up node, a fourth driving clock signal input terminal, and a fourth driving signal output terminal, and configured to write a signal provided by the fourth driving clock signal input terminal to the fourth driving signal output terminal in response to control of an active level signal at the second pull-up node;
a second global reset circuit connected to a global reset signal input terminal, the second power supply terminal, and the second pull-up node, and configured to write an inactive level signal provided by the second power supply terminal to the second pull-up node in response to control of an active level signal provided by the global reset signal input terminal;
a second pull-down control circuit connected to the second power supply terminal, a sixth power supply terminal, the second pull-up node, and a second pull-down node, and configured to write a voltage having a phase opposite to that of a voltage at the second pull-up node to the second pull-down node;

a second pull-up noise reduction circuit connected to the second power supply terminal, the second pull-up node, and the second pull-down node, and configured to write an inactive level signal provided by the second power supply terminal to the second pull-up node in response to control of an active level signal at the second pull-down node; and a second voltage control circuit connected to a third power supply terminal, the second pull-up node, and a second voltage control node, and configured to write an active level signal provided by the active level supply terminal to the second voltage control node in response to control of an active level signal at the second pull-up node, wherein the shift register unit further comprises: at least one of a fourth anti-leakage circuit, a fifth anti-leakage circuit, and a sixth anti-leakage circuit;

the second global reset circuit is connected to the second power supply terminal through the fourth anti-leakage circuit, and is connected to the fourth anti-leakage circuit at a fourth anti-leakage node, the fourth anti-leakage node is connected to the second voltage control node, the fourth anti-leakage circuit is connected to the global reset signal input terminal, and the fourth anti-leakage circuit is configured to form a path between the fourth anti-leakage node and the second power supply terminal in response to control of an active level signal provided by the global reset signal input terminal, and cut off the path between the fourth anti-leakage node and the second power supply terminal in response to control of an inactive level signal provided by the global reset signal input terminal;

the second display reset circuit is connected to the second power supply terminal through the fifth anti-leakage circuit, and is connected to the fifth anti-leakage circuit at a fifth anti-leakage node, the fifth anti-leakage node is connected to the second voltage control node, the fifth anti-leakage circuit is connected to the display reset signal input terminal, and the fifth anti-leakage circuit is configured to form a path between the fifth anti-leakage node and the second power supply terminal in response to control of an active level signal provided by the display reset signal input terminal, and cut off the path between the fifth anti-leakage node and the second power supply terminal in response to control of an inactive level signal provided by the display reset signal input terminal; and the second pull-up noise reduction circuit is connected to the second power supply terminal through the sixth anti-leakage circuit, and is connected to the sixth anti-leakage circuit at a sixth anti-leakage node, the sixth anti-leakage node is connected to the second voltage control node, the sixth anti-leakage circuit is connected to the second pull-down node, and the sixth anti-leakage circuit is configured to form a path between the sixth anti-leakage node and the second power supply terminal in response to control of an active level signal at the second pull-down node, and cut off the path between the sixth anti-leakage node and the second power supply terminal in response to control of an inactive level signal at the second pull-down node.

16. The shift register unit of claim 1, wherein the sensing control circuit comprises:

a first control input circuit connected to the sensing active level supply terminal, a sensing control intermediate node, and a first control signal input terminal, and configured to write a signal provided by the sensing active level supply terminal to the sensing control intermediate node in response to control of an active level signal provided by the first control signal input terminal; and a second control input circuit connected to the sensing control intermediate node, the first sensing control node, and a second control signal input terminal, and configured to write a signal at the sensing control intermediate node to the first sensing control node in response to control of an active level signal provided by the second control signal input terminal;

the first control signal input terminal is the sensing signal input terminal, and the second control signal input terminal is the random signal input terminal;

the shift register unit further comprises:

a third control input circuit connected to the sensing control intermediate node, a second sensing control node, and the random signal input terminal, and configured to write a signal at the sensing control intermediate node to the second sensing control node in response to control of an active level signal provided by the random signal input terminal;

the sensing control circuit further comprises:

a control reset circuit connected to a second power supply terminal, a preset node, and a control reset signal input terminal, and configured to write an inactive level signal provided by the second power supply terminal to the preset node in response to the control of an active level signal provided by the control reset signal input terminal; and the preset node is one of the sensing control intermediate node, the first sensing control node, and the second sensing control node, the third control input circuit comprises: an eighty-third transistor; and a control electrode of the eighty-third transistor is connected to the random signal input terminal, a first electrode of the eighty-third transistor is connected to the sensing control intermediate node, and a second electrode of the eighty-third transistor is connected to the second sensing control node.

17. A gate driving circuit, comprising: a plurality of shift register units that are cascaded, wherein each of the plurality of shift register units comprises:

a sensing control circuit connected to a first sensing control node, a sensing signal input terminal, a random signal input terminal, and a sensing active level supply terminal, and configured to write an active level signal provided by the sensing active level supply terminal to the first sensing control node in response to control of an active level signal provided by the random signal input terminal and an active level signal provided by the sensing signal input terminal;

a first sensing input circuit connected to the first sensing control node, a clock control signal input terminal, and a first pull-up node, and configured to write an active level signal to the first pull-up node in response to control of an active level signal at the first sensing control node and an active level signal provided by the clock control signal input terminal; and a first driving output circuit connected to the first pull-up node, a first driving clock signal input terminal, and a first driving signal output terminal, and configured to write a signal provided by the first driving clock signal input terminal to the first driving signal output terminal in response to control of an active level signal at the first pull-up node; and except shift register units in first a stages, the sensing active level supply terminal of any one shift register unit is connected to the first pull-up node in one shift register unit located a stages before the any one shift register unit; or except shift register units in last a stages, the sensing active level supply terminal of any one shift register unit is connected to the first pull-up node in one shift register unit located a stages after the any one shift register unit; where a is a positive integer.

\* \* \* \* \*